(12) United States Patent  
Zewail et al.

(10) Patent No.: US 7,915,583 B2  
(45) Date of Patent: *Mar. 29, 2011

(54) METHOD AND SYSTEM FOR ULTRAFAST PHOTOELECTRON MICROSCOPE

(75) Inventors: Ahmed Zewail, San Marino, CA (US); Vladimir Lobastov, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 237 days.

This patent is subject to a terminal disclaimer.

(21) Appl. No.: 12/234,567

(22) Filed: Sep. 19, 2008

(65) Prior Publication Data

US 2009/0236521 A1 Sep. 24, 2009

Related U.S. Application Data

(63) Continuation of application No. 11/643,008, filed on Dec. 19, 2006, now Pat. No. 7,442,931, which is a continuation of application No. 11/097,837, filed on Apr. 1, 2005, now Pat. No. 7,154,091.

(60) Provisional application No. 60/577,902, filed on Jun. 7, 2004, provisional application No. 60/559,234, filed on Apr. 2, 2004.

(51) Int. Cl.  
*H01J 37/26* (2006.01)  
*H01J 37/252* (2006.01)

(52) U.S. Cl. ......... 250/310; 250/311; 250/307; 324/751

(58) Field of Classification Search .................. 250/310, 250/311, 307; 324/751  
See application file for complete search history.

(56) References Cited

U.S. PATENT DOCUMENTS 3,628,012 A 12/1971 Hosoki et al.  
(Continued)

FOREIGN PATENT DOCUMENTS

CN 2003-1015583 2/2003  
(Continued)

OTHER PUBLICATIONS

Lobastov et al., "4D Ultrafast Electron Microscopy"; 16 page manuscrupt, unpublished (dated Mar. 22, 2005).

(Continued)

*Primary Examiner* — Jack I Berman  
(74) *Attorney, Agent, or Firm* — Kilpatrick Townsend & Stockton LLP

(57) ABSTRACT

An ultrafast system (and methods) for characterizing one or more samples. The system includes a stage assembly, which has a sample to be characterized. The system has a laser source that is capable of emitting an optical pulse of less than 1 ps in duration. The system has a cathode coupled to the laser source. In a specific embodiment, the cathode is capable of emitting an electron pulse less than 1 ps in duration. The system has an electron lens assembly adapted to focus the electron pulse onto the sample disposed on the stage. The system has a detector adapted to capture one or more electrons passing through the sample. The one or more electrons passing through the sample is representative of the structure of the sample. The detector provides a signal (e.g., data signal) associated with the one or more electrons passing through the sample that represents the structure of the sample. The system has a processor coupled to the detector. The processor is adapted to process the data signal associated with the one or more electrons passing through the sample to output information associated with the structure of the sample. The system has an output device coupled to the processor. The output device is adapted to output the information associated with the structure of the sample.

54 Claims, 24 Drawing Sheets

U.S. PATENT DOCUMENTS

| | | | |
|---|---|---|---|
| 5,034,903 A | | 7/1991 | Alfano et al. |
| 5,270,643 A | * | 12/1993 | Richardson et al. .......... 324/751 |
| 5,811,804 A | * | 9/1998 | Van Blitterswijk et al. .. 250/311 |
| 6,875,983 B2 | | 4/2005 | Nakazawa et al. |
| 7,154,091 B2 | * | 12/2006 | Zewail et al. ................. 250/311 |
| 7,250,618 B2 | | 7/2007 | Sogard et al. |
| 7,442,931 B2 | * | 10/2008 | Zewail et al. ................. 250/311 |

FOREIGN PATENT DOCUMENTS

| | | | |
|---|---|---|---|
| CN | 1 448 980 | | 10/2003 |
| CN | 1448980 A | * | 10/2003 |
| DE | 196 04 272 A1 | | 8/1996 |
| JP | 08-212952 | | 8/1996 |
| JP | 2002-098655 | | 4/2002 |
| JP | 2002-352762 A | | 12/2002 |

OTHER PUBLICATIONS

May et al., Noncontact High-Speed Waveform Measurements with the Picosecond Photoelectron Scanning Electron Microscope, IEEE Journal of Quantum Electronics, 24(2): 234-239 (Feb. 1988).

Ruan et al., "Ultrafast Electron Crystallography of Interfacial Water"; Science 304:80-84 (Apr. 2, 2004).

Srinivasan et al., "Ultrafast Electron Diffraction (UED): A New Development for the 4D Determination of Transient Molecular Structures"; Helvetica Chimica Acta 86(6):1761-1838 (2003).

Vigliotti et al., "Ultrafast Electron Crystallography of Surface Structural Dynamics with Atomic-Scale Resolution"; Angewandte Chem. Int. Ed. 1-5 (2004).

Zewail, "Diffraction, Crystallography and Microscopy Beyond Three Dimensions: Structural Dynamics in Space and Time"; Philosophical Transactions of the Royal Society A 364:315-329 (2005).

Batinic et al., "Pulsed electron beam generation via laser stimulation," Nuclear Instruments and Methods in Physics Research A 1995; 363(1): 43-47.

May et al., "Noncontact high-speed waveform measurements with the picosecond photoelectron scanning electron microscope," IEEE J. Quantum Electron, Feb. 1988; 24(2):234-239.

Siegel et al., "Intermediates in membrane fusion and bilayer/nonbilayer phase transitions imaged by time-resolved cryo-transmission electron microscopy," Biophys J., Jul. 1989; 56(1): 161-169.

Supplemental European Search Report of EP Application No. 05743023, mailed Jul. 16, 2009, 4 pages total.

English Machine Translation of Japanese Patent Publication No. 2002-098655,9 pages total.

Examination Report of EP Patent Application No. 05743023.3, dated Oct. 13, 2009, 8 pages total.

Office Action of Japanese Patent Application No. 2007-506297, mailed Jul. 20, 2010, 19 pages total. [English Translation Included].

* cited by examiner

METHOD AND SYSTEM FOR ULTRAFAST PHOTOELECTRON MICROSCOPE

CROSS-REFERENCES TO RELATED APPLICATIONS

This application is a continuation of U.S. patent application Ser. No. 11/643,008, entitled "Method and System for Ultrafast Photoelectron Microscope," filed Dec. 19, 2006, which is a continuation of U.S. patent application Ser. No. 11/097,837, entitled "Method and System for Ultrafast Photoelectron Microscope," filed Apr. 1, 2005, now U.S. Pat. No. 7,154,091, which claims the benefit of U.S. Provisional Patent Application No. 60/559,234, filed Apr. 2, 2004, entitled "Ultrafast Photoelectron Microscope," and U.S. Provisional Patent Application No. 60/577,902, filed Jun. 7, 2004, entitled "Diffraction, Crystallography, and Microscopy beyond 3D—Structural Dynamics in Space and Time," commonly assigned, all of which are hereby incorporated by reference in their entirety.

STATEMENT AS TO RIGHTS TO INVENTIONS MADE UNDER FEDERALLY SPONSORED RESEARCH OR DEVELOPMENT

Work described herein has been supported, in part, by NSF grant CHE-0117850. The United States Government may therefore have certain rights in the invention.

BACKGROUND OF THE INVENTION

The present invention relates generally to imaging of objects. In particular, the present invention provides methods and systems for imaging one or more objects using one or more pulses of particles containing from about one electron to about 10,000 electrons or more preferably about 10 electrons to about 100 electrons in a transmission electron microscope system. More particularly, the present invention provides methods and systems for identifying information about one or more temporal components associated with one or more spatial features of certain objects being imaged. Merely by way of example, the invention has been applied to imaging certain chemical, physical, and biological objects. The invention, however, can also be applied to other applications such as other areas of biology, chemistry (e.g., organic, physical, biochemistry), medicine (e.g., medical devices, diagnostics, analysis, treatments), physical sciences, electronics, semiconductor devices and materials (e.g., silicon, germanium, Group III/V, Group II/VI), chemicals (e.g., industrial), petrochemical (e.g., gas, oil), any combination of these, and the like. The invention may be applied to applications involving processing and/or screening of certain compounds and/or molecules such as an oligomer, a peptide, a nucleic acid, an oligosaccharide, a phospholipid, a polymer, a protein, or a drug congener preparation, or any other like species and/or entities. Additionally, the invention may be applied to diffraction, crystallography, spectroscopy, and other areas, and the like. Still further, the invention may be applied to monitoring formation/decomposition of materials, film(s), compounds, and/or other species, depending upon the embodiment.

The twentieth century has been witness to certain major advances in our ability to peer into the microscopic world of molecules, thereby giving us unparalleled insights into their static behavior. For example, electron microscopes, particularly the transmission electron microscope (TEM), provide for direct imaging of macromolecular static structures with spatial resolution of a few angstroms. These conventional electron microscope systems have been employed to image, for example, biological macromolecular crystals. Despite these advances in imaging, the dynamic aspects of structural evolution, insight into which is desirable in understanding function, cannot be obtained from currently available static images because of the lack of temporal resolution in conventional electron microscopy.

When chemical, and especially biological changes, involve complex transient structures with many possible conformations, one must often address the nature of the three-dimensional (3D) molecular structures, but at different times during the change. In most biologically important processes, the structural change is reversible, which means that upon initiation of an event and the associated response, a nondestructive reaction occurs that is repeatable. Unfortunately, limitations exist with conventional microscopic techniques. As an example, conventional electron microscopes cannot generally produce images with spatial resolution on the biological length scale (ranging from nanometers to micrometers) with desirable temporal resolutions. These and other limitations of conventional techniques are described throughout the present specification and more particularly below.

Thus, there is a need in the art for improved methods imaging at atomic scale resolutions for physical, chemical, biological, and other samples.

SUMMARY OF THE INVENTION

According to the present invention, techniques related to the imaging of objects are provided. In particular, the present invention provides methods and systems for imaging one or more objects using one or more pulses of particles containing from about one electron to about 10,000 electrons or more preferably about 10 electrons to about 100 electrons in a transmission electron microscope system. More particularly, the present invention provides methods and systems for identifying information about one or more temporal components associated with one or more spatial features of certain objects being imaged. Merely by way of example, the invention has been applied to imaging certain chemical, physical, and biological objects. The invention, however, can also be applied to other applications such as other areas of biology, chemistry (e.g., organic, physical, biochemistry), medicine (e.g., medical devices, diagnostics, analysis, treatments), physical sciences, electronics, semiconductor devices and materials (e.g., silicon, germanium, Group III/V, Group II/VI), chemicals (e.g., industrial), petrochemical (e.g., gas, oil), any combination of these, and the like. The invention may be applied to applications involving processing and/or screening of certain compounds and/or molecules such as an oligomer, a peptide, a nucleic acid, an oligosaccharide, a phospholipid, a polymer, a protein, or a drug congener preparation, or any other like species and/or entities. Additionally, the invention may be applied to diffraction, crystallography, spectroscopy, and other areas, and the like. Still further, the invention may be applied to monitoring formation/decomposition of materials, film(s), compounds, and/or other species, depending upon the embodiment.

At the subcellular level according to certain embodiments, the invention may be applied to the interaction of peptides or chemical compounds (drugs) with the active site of enzymes, or any reversible interaction of a peptide or small molecule with a protein surface. The invention may be applied to the interaction of nucleic acid binding proteins or enzymes with target nucleic acids, for example, the binding of transcription factors to specific DNA sequences, or the interaction of enzymes with DNA, either binding and scanning along the surface of DNA or intercalating into the DNA. The invention may be applied to nucleic acid-nucleic acid interactions, for example, the interaction of ribozymes with RNA according to a specific embodiment.

At the cellular level according to other embodiments, the invention may also be applied to the interaction of a compound, protein, virus or cell with a membrane, whereby the compound, protein, virus or cell "attaches" to the membrane and then passes through it. These and other applications are described more specifically below.

In a specific embodiment, the present invention provides a system for imaging one or more samples, e.g., biological, chemical, physical. The system has a stage assembly, which includes a sample to be imaged. Preferably, the system has a laser source, which is capable of emitting an optical pulse of less than 1 picosecond ("ps") in duration. The system has a cathode coupled to the laser source. In a preferred embodiment, the cathode is capable of emitting an electron pulse less than 1 ps in duration. although other pulse durations are possible. An electron lens assembly is adapted to focus the electron pulse onto the sample disposed on the stage. A detector is adapted to capture one or more electrons passing through the sample. The one or more electrons passing through the sample is representative of an image of the sample. The detector provides a signal (e.g., data signal) associated with the one or more electrons passing through the sample that represents the image of the sample. The system has a processor coupled to the detector. In a preferred embodiment, the processor is adapted to process the data signal associated with the one or more electrons passing through the sample to output information associated with the image represented by the sample. An output device is coupled to the processor. The output device is adapted to output the information associated with the image represented by the sample.

In an alternative specific embodiment, the present invention provides a method of operating a transmission electron microscope comprising a laser source, a cathode, and an electron lens assembly. The method includes forming a train of optical pulses. Each of the optical pulses is characterized by a Full Width Half Maximum ("FWHM") pulse length of less than 1 ps in duration. The method includes providing a sample for imaging disposed on a stage assembly and generating a train of electron pulses by impinging the train of optical pulses on the cathode. The train of electron pulses is associated with the train of optical pulses. Each of the electron pulses is characterized by a FWHM pulse length less than 1 ps in duration. The method includes directing the train of electron pulses toward the sample using at least the electron lens assembly. The method captures a portion of the train of electron pulses using a sensing device to derive information associated with an image of the sample. The method processes the information associated with the image of the sample.

In yet another alternative specific embodiment, the present invention provides a transmission electron microscope (TEM) system capable of acquiring time resolved images. The system has a laser producing a photon pulse and a beam splitter adapted to divide the photon pulse into an electron generation photon pulse and an initiation photon pulse. A cathode is adapted to produce an electron pulse in response to activation by the electron generation photon pulse. An optical delay stage is adapted to introduce a time delay between the initiation photon pulse and the electron pulse. The system has a sample irradiated by the initiation photon pulse and the electron pulse. The system has an electron detector producing an image of the sample in response to the irradiation of the sample by the electron pulse. Alternatively, the electron detector produces other information of the sample in response to the irradiation of the sample by the electron pulse in other embodiments.

Still further, the present invention provides a method for forming images from one or more samples using electron beam pulses. The method includes providing a feature of a sample to be imaged. The feature has a size of about 100 nanometers and less according to a specific embodiment. The method includes placing the sample onto a stage assembly and maintaining the sample on the stage assembly in a vacuum environment. The method includes directing one or more pulses of electrons toward the feature of the sample. Preferably, the one or more pulses of electrons each has about 10 to about 1000 electrons according to certain embodiments, although other particle counts of electrons may be possible. The method captures a portion of the one or more pulses of electrons using a sensing device. The portion of the one or more pulses of the electrons is associated with an image of the feature of the sample. The method includes transferring information associated with the portion of the one or more pulses of electrons associated with the image of the feature of the sample from the sensing device to a processing device. The method outputs a visual image associated with the feature of the sample using at least the information associated with the portion of the one or more pulses of electrons associated with the image of the feature of the sample.

In still a further embodiment, the present invention provides a method of acquiring time-resolved images using an electron microscope. The method includes providing a feature of a sample to be imaged. The method includes placing the sample onto a stage assembly and maintaining the sample on the stage assembly in a vacuum environment. The method includes directing one or more pulses of electrons toward the feature of the sample. In a preferred embodiment, the one or more pulses of electrons each having about one to about 1000 electrons. The method includes capturing a first portion of the one or more pulses of electrons using a sensing device during a first portion of time. The portion of the one or more pulses of the electrons is associated with a first image of the feature of the sample during the first portion of time. The method transfers first information associated with the first portion of the one or more pulses of electrons associated with the first image of the feature of the sample during the first portion of time from the sensing device to a processing device. The method captures a second portion of the one or more pulses of electrons using the sensing device during a second portion of time. The portion of the one or more pulses of electrons is associated with a second image of the feature of the sample during the second portion of time. The method includes transferring second information associated with the second portion of the one or more pulses of electrons associated with the second image of the feature of the sample during the second portion of time from the sensing device to the processing device. In a preferred embodiment, the first image may have characteristics that are different from the second image.

In another particular embodiment, the present invention provides a system for characterizing one or more samples. The system includes a stage assembly, which has a sample to be characterized. The system has a laser source that is capable of emitting an optical pulse of less than 1 ps in duration. The system has a cathode coupled to the laser source. In a specific embodiment, the cathode is capable of emitting an electron pulse less than 1 ps in duration. The system has an electron lens assembly adapted to focus the electron pulse onto the sample disposed on the stage. The system has a detector adapted to capture one or more electrons passing through the sample. The one or more electrons passing through the sample is representative of the structure of the sample. The detector provides a signal (e.g., data signal) associated with the one or more electrons passing through the sample that represents the structure of the sample. The system has a processor coupled to the detector. The processor is adapted to process the data signal associated with the one or more electrons passing through the sample to output information associated with the structure of the sample. The system has an output device coupled to the processor. The output device is adapted to output the information associated with the structure of the sample.

Still further, the present invention provides a method for capturing information from one or more samples using electron beam pulses, which is derived from respective pulses of electromagnetic radiation, e.g. laser pulse. The method includes providing a feature of a sample to be imaged. The method includes placing the sample onto a stage assembly, which has been maintained a vacuum environment. The method includes directing one or more pulses of electrons toward the feature of the sample. In a specific embodiment, the one or more pulses of electrons each has about one to about 1000 electrons or 10 to 100 electrons depending upon the application. The method includes capturing a portion of the one or more pulses of electrons using a sensing device. The portion of the one or more pulses of the electrons is associated with a characterization (e.g., image, diffraction characteristic) of the feature of the sample. The method includes transferring information associated with the portion of the one or more pulses of electrons associated with the characterization of the feature of the sample from the sensing device to a processing device. Optionally, the method includes processing the information using the processing device. The method outputs at least one or more indications associated with the feature of the sample using at least the information associated with the portion of the one or more pulses of electrons associated with the image of the feature of the sample.

In an alternative particular embodiment of the present invention, a method of acquiring time-resolved images using an electron microscope is provided. The method includes providing a feature of a sample to be imaged, the feature having a size and placing the sample onto a stage assembly. The method also includes maintaining the sample on the stage assembly in a vacuum environment and directing a first train of electron pulses toward the feature of the sample, the first train of electron pulses having an average temporal pulse width of less than 1 ps. Additionally, the method includes capturing a first portion of the first train of electron pulses using a sensing device during a first portion of time, the portion of the first train of electron pulses being associated with a first image of the feature of the sample during the first portion of time and transferring first information associated with the first portion of the first train of electron pulses associated with the first image of the feature of the sample during the first portion of time from the sensing device to a processing device. The method further includes directing a second train of electron pulses toward the feature of the sample, the second train of electron pulses having an average temporal pulse width of less than 1 ps and capturing a second portion of the second train of electron pulses using the sensing device during a second portion of time, the portion of the second train of electron pulses being associated with a second image of the feature of the sample during the second portion of time. Furthermore, the method includes transferring second information associated with the second portion of the second train of electron pulses associated with the second image of the feature of the sample during the second portion of time from the sensing device to the processing device.

In yet another alternative particular embodiment of the present invention, a method of performing time resolved characterization of a sample is provided. The method includes providing a photon pulse and providing a beam splitter to adapted to divide the photon pulse into an electron generation photon pulse and an initiation photon pulse. In a particular embodiment of this aspect of the present invention, the photon pulse is on of a train of ultrafast photon pulses. The method also includes providing a cathode adapted to produce an electron pulse in response to activation by the electron generation photon pulse and providing an optical delay stage adapted to introduce a time delay between the initiation photon pulse and the electron pulse. The method further includes providing a sample irradiated by the initiation photon pulse and the electron pulse and providing an electron detector producing an image of the sample in response to the irradiation of the sample by the electron pulse.

In yet another alternative embodiment according to the present invention, a spectroscopy system is provided. The system includes a laser producing a photon pulse train, a beam splitter adapted to divide the photon pulse train into an electron generation photon pulse train and an spectroscopy photon pulse train, and a non-linear optical element adapted to tune the wavelength of the spectroscopy photon pulse train to an initiation wavelength. The system also includes a cathode adapted to produce an electron pulse train in response to activation by the electron generation photon pulse train and an optical delay stage adapted to introduce a time delay between the spectroscopy photon pulse train and the electron pulse train. Furthermore, the system includes a sample irradiated by the spectroscopy photon pulse train and the electron pulse train and an electron detector producing an image of the sample in response to the irradiation of the sample by the electron pulse train.

In addition, embodiments of the present invention provide a method for determining temporal characteristics of one or more feature of objects using an electron microscope assembly. The method includes providing a sample including one or more features, the sample being disposed on a stage assembly and generating one or more electron pulses, the one or more electron pulses having a FWHM pulse length of less than 1 ps in duration. The method also includes directing the one or more electron pulses toward the one or more features of the sample during a time period associated with a period of detection and capturing a portion of the one or more electron pulses using a sensing device to derive information associated with a characteristic of the one or more features of the sample. The method further includes processing at least the information to identify a temporal characteristic (e.g., a feature that may or may not change with respect to time) of the one or more features of the sample.

Many benefits are achieved by way of the present invention over conventional techniques. For example, the present technique provides techniques and systems to image materials and biological structures with the structural dynamics of the sample resolved in both space and time according to a specific embodiment. Additionally, the present invention provides for methods and systems that may use conventional electronic technologies, including computer codes, which are easy to implement, in certain embodiments. The invention also provides a method and system operable for capturing images of samples at temperatures compatible for biological materials in other embodiments. Depending upon the embodiment, certain methods and systems may be applied to diffraction, imaging, crystallography, spectroscopy, and other techniques. In certain embodiments, the present invention provides methods and systems for imaging small features of biological and/or chemical objects in a non-evasive manner, which is often low energy and does not cause thermal damage to the object, which are often sensitive to excessive thermal energy. In certain embodiments, the present method and systems include processes that are "adiabatic" in characteristic. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 4A-4D are images obtained using a diffraction mode of operation according to an embodiment of the present invention;

DETAILED DESCRIPTION OF SPECIFIC EMBODIMENTS

Figure 1A:
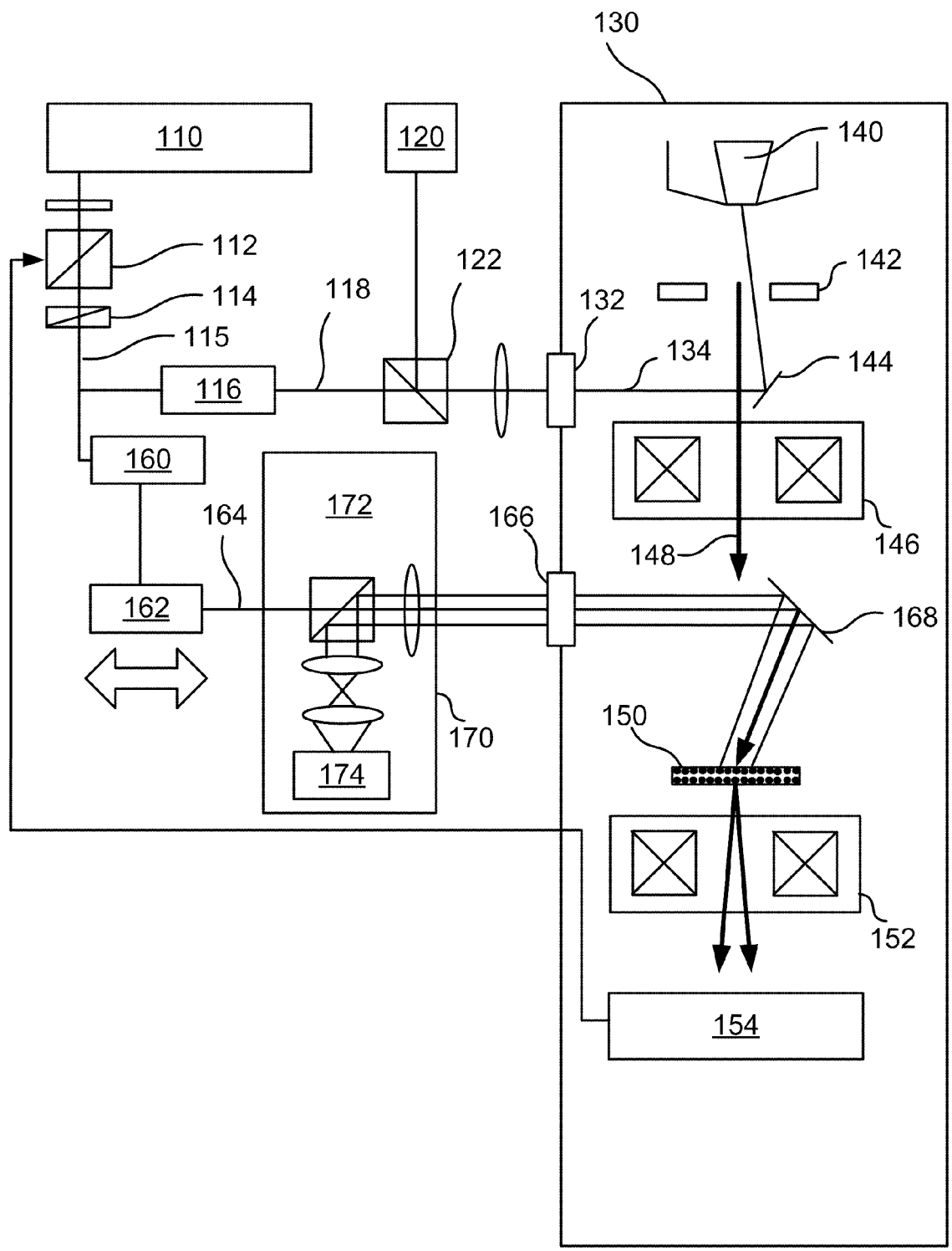
FIG. 1A is a simplified diagram of an ultrafast photoelectron microscope system according to an embodiment of the present invention.

According to the present invention, techniques related to the imaging of objects are provided. In particular, the present invention provides methods and systems for imaging one or more objects using one or more pulses of particles containing from about one electron to about 10,000 electrons or more preferably about 10 electrons to about 100 electrons in a transmission electron microscope system. More particularly, the present invention provides methods and systems for identifying information about one or more temporal components associated with one or more spatial features of certain objects being imaged. Merely by way of example, the invention has been applied to imaging certain chemical, physical, and biological objects. The invention, however, can also be applied to other applications such as other areas of biology, chemistry (e.g., organic, physical, biochemistry), medicine (e.g., medical devices, diagnostics, analysis, treatments), physical sciences, electronics, semiconductor devices and materials (e.g., silicon, germanium, Group III/V, Group II/VI), chemicals (e.g., industrial), petrochemical (e.g., gas, oil), any combination of these, and the like. The invention may be applied to applications involving processing and/or screening of certain compounds and/or molecules such as an oligomer, a peptide, a nucleic acid, an oligosaccharide, a phospholipid, a polymer, a protein, or a drug congener preparation, or any other like species and/or entities. Additionally, the invention may be applied to diffraction, crystallography, spectroscopy, and other areas, and the like. Still further, the invention may be applied to monitoring formation/decomposition of materials, film(s), compounds, and/or other species, depending upon the embodiment. Details of embodiments of the present invention can be found throughout the specification and more particularly below. Before discussing details of the various embodiments, we have provided certain information, which we have learned and/or discovered, as may be applied to a description of such embodiments below.

Beginning with X-rays at the turn of the 20th century, diffraction techniques have allowed determination of equilibrium three-dimensional structures with atomic resolution, in systems ranging from diatoms (NaCl) to DNA, proteins, and complex assemblies such as viruses. For dynamics, the time resolution has similarly reached the fundamental atomic-scale of motion. With the advent of femtosecond time resolution nearly two decades ago, it has become possible to study the dynamics of non-equilibrium molecular systems in real time: from the very small (NaI) to the very large (DNA, proteins and their complexes) as will be explained below.

Armed with this ability to capture both the static architecture as well as the temporal behavior of the chemical bond, a desire that now stimulates researchers the world over is the potential to map out, in real time, the coordinates of all individual atoms in a reaction, as, for example, when a molecule unfolds to form selective conformations, or when a protein docks onto the cell surface. These transient structures provide important insights into the function of chemical and biological molecules. As function is intimately associated with intrinsic conformational dynamics, knowing a molecule's static structure is often only the first step toward unraveling how the molecule functions, especially in the world of biology. Thus, elucidating the real-time "structural dynamics" of far-from-equilibrium conformations at atomic scale resolution is vital to understanding the fundamental mechanisms of complex chemical and biological systems.

Time-resolved experiments with femtosecond time resolution have been performed in the past with probe wavelengths ranging from the ultraviolet to the infrared and far infrared. On this time scale, one is able to freeze localized structures in space (wave packets) and observe their evolution in time—thus elucidating the elementary processes of bond transformation via transition states, in chemistry and biology.

Certain advances have been made in multidimensional spectroscopy to correlate frequencies of optical transitions with temporal evolution, thereby probing structural changes in different relaxation processes. For complex molecular structures, however, the positions of all atoms at a given time can only be obtained if the probe is able to "see" interferences of all atoms. Diffraction methods using X-rays or electrons have the unique ability of revealing all internuclear coordinates with very high spatial resolution, thus providing a global picture of structural change on the ultrafast time scale with atomic level detail.

Diffraction techniques using electron or X-ray pulses can, in principle, be used to obtain certain time-varying molecular structures. These pulses often must be short enough to freeze the atomic motions, yet bright enough to provide a discernible diffraction pattern. In the case of X-rays, photons are scattered by electrons in the molecular sample, so the diffracted intensity depends directly on the electronic density. Because most electrons are centered on atoms, these electron densities reflect the positions of nuclei, especially for heavy atoms. Ultrafast pulsed X-ray sources include third-generation synchrotron radiation, laser produced plasma sources, high-order harmonics production in gases and on solid surfaces, and free-electron lasers. While high-flux X-ray pulses from synchrotron sources are relatively long (tens of picoseconds; dictated by the duration of electron bunches in a storage ring), the sub-picosecond X-ray pulses from other generation schemes suffer from rather low fluxes. As a result, ultrafast X-ray diffraction studies have primarily focused on solid samples where the intrinsic long-range order enhances the signal-to-noise ratio of the interference patterns. X-Ray absorption spectroscopy (XAS) techniques such as extended X-ray absorption fine structure (EXAFS) and X-ray absorption near-edge structure (XANES) spectroscopy have been used to obtain local structural information in solutions on the nanosecond timescale, and on the ultrafast timescale, in gases and liquids.

Electron diffraction provides numerous benefits. For example, the cross-section for electron scattering is about six orders of magnitude larger than that for X-ray scattering. Moreover, the experiments are of a "tabletop" scale and can be implemented with ultrafast (femtosecond and picosecond) laser sources. Electrons produce less damage to specimens per useful elastic scattering event than X-rays. Electrons, because of their short penetration depth arising from their strong interaction with matter, can reveal transient structures of gases, surfaces, and (thin) crystals. Electrons can be focused to obtain images in microscopy. As described more fully below, using properly timed sequences of electron pulses, sometimes referred to as frame referencing, one is able to "isolate" changing transient structures. Depending upon the embodiment, there can also be other benefits.

Embodiments of the present invention provide methods and systems to temporally and spatially resolved transient structures including structures in radiationless transitions, structures in non-concerted organic reactions, structures in non-concerted organometallic reactions, structures of carbene intermediates, dynamic pseudorotary structures, non-equilibrium structures and conformational structures on complex energy landscapes, and hydrogen-bonded structures of tautomeric reactions. Merely by way of example, the reaction of pyridine, which was believed to form valence structures was shown to have a reaction pathway that involves the opening of the ring with the formation of a diradical intermediate.

Optical microscopy, using fluorescent probes e.g., green fluorescent proteins, has provided the means to visualize events occurring in vitro and within cells. But although optical methods, in principle, can provide temporal resolution on the scale of femtoseconds, they are limited in the spatial resolution achievable to resolution on the order of the wavelength of the light used in the microscope, typically 200 nm. Other limitations may also exist using optical microscopy.

Direct imaging of macromolecular static structures with resolution of a few angstroms has been employed with great success in conventional electron microscopy of many systems, including biological macromolecular crystals. However, dynamics of structural change, which are critical to our understanding of the function, cannot be obtained without time resolution. The development of a stroboscopic methodology allows for the investigation of structural dynamics with a time-scale limited only by the temporal characteristics of the electron probe. This separation of time-scales limits energy dissipation, which at longer times usually leads to structural disintegration. As importantly, on the sub-picosecond time-scale, the motion of the atoms is negligible. In some embodiments of the present invention, the spatial structure in three dimensions (3D) is imaged as a function of time (4D) to provide insight, for example, into structural dynamics.

Using embodiments of the present invention, samples are prepared coherently, resolving issues related to the time-energy uncertainty principle in limiting the information to be gained from femtosecond-to-picosecond time resolution. Moreover, for any dynamic process, changes as a function of time are continuous, and although some global events may occur at longer times, sometimes referred to as "relevant time scales," these events are triggered by changes at early times. The primary events are an essential part of any complete description of the landscape and the dynamics. Thus the notion that "relevant" biological events occur only far beyond the ultrafast time domain gives an incomplete picture and may prove, as in early notions of chemical reactions to be misleading.

In certain embodiments of the present invention, the term "ultrafast" is used to characterize various components of systems described herein. One of skill in the art appreciates that the term ultrafast refers to pulses, containing either photons or electrons, shorter than 1 picosecond ("ps") in duration. The measurement of the pulse width is generally performed at the full width half maximum (FWHM) of the pulse, although this is not required by the present invention. Generally, pulses with widths on the order of 100 fs are utilized in embodiments of the present invention, well under the threshold of 1 ps defining the term ultrafast. Of course, there can also be other variations, modifications, and alternatives. Certain details of present methods and systems can be found through out the present specification and more particularly below.

FIG. 1A is a simplified diagram of an ultrafast photoelectron microscope system according to an embodiment of the present invention. This diagram is merely an example, which should not unduly limit the scope of the claims herein. One of ordinary skill in the art would recognize many variations, modifications, and alternatives. As illustrated in FIG. 1A, a femtosecond laser 110 is directed through a Pockels cell 112, which acts as a controllable shutter. A Glan polarizer 114 is used in some embodiments, to select the laser power propagating in optical path 115. A beam splitter (not shown) is used to provide several laser beams to various portions of the system. Although the system illustrated in FIG. 1A is described with respect to imaging applications, this is not generally required by the present invention. One of skill in the art will appreciate that embodiments of the present invention provide systems and methods for imaging, diffraction, crystallography, and related fields. Particularly, the experimental results discussed below yield insight into the varied applications available using embodiments of the present invention.

The femtosecond laser source 110 is generally capable of generating a train of optical pulses with predetermined pulse width. One example of such a laser system is a diode-pumped mode-locked titanium sapphire (Ti:Sapphire) laser oscillator operating at 800 nm and generating 100 fs pulses at a repetition rate of 80 MHz and an average power of 1 Watt, resulting in a period between pulses of 12.5 ns. In an embodiment, the spectral bandwidth of the laser pulses is 2.35 nm FWHM. An example of one such laser is a Mai Tai One Box Femtosecond Ti:Sapphire Laser, available from Spectra-Physics Lasers, of Mountain View, Calif. In alternative embodiments, other laser sources generating optical pulses at different wavelengths, with different pulse widths, and at different repetition rates are utilized. One of ordinary skill in the art would recognize many variations, modifications, and alternatives.

A first portion of the output of the femtosecond laser 110 is coupled to a second harmonic generation (SHG) device 116, for example a barium borate ($BaB_2O_4$) crystal, typically referred to as a BBO crystal and available from a variety of doubling crystal manufacturers. The SHG device frequency doubles the train of optical pulses to generate a train of 400 nm, 100 fs optical pulses at an 80 MHz repetition rate. SHG devices generally utilize a nonlinear crystal to frequency double the input pulse while preserving the pulse width. In some embodiments, the SHG is a frequency tripling device, thereby generating an optical pulse at UV wavelengths. Of course, the desired output wavelength for the optical pulse will depend on the particular application. The doubled optical pulse produced by the SHG device propagates along electron generating path 118.

A cw diode laser 120 is combined with the frequency doubled optical pulse using beam splitter 122. The light produce by the cw diode laser, now collinear with the optical pulse produced by the SHG device, serves as an alignment marker beam and is used to track the position of the optical pulse train in the electron generating path. The collinear laser beams enter chamber 130 through entrance window 132. In the embodiment illustrated in FIG. 1A, the entrance window is fabricated from materials with high transparency at 400 nm and sufficient thickness to provide mechanical rigidity. For example, BK-7 glass about 6 mm thick with anti-reflection coatings, e.g. $MgF_2$ or sapphire are used in various embodiments. One of ordinary skill in the art would recognize many variations, modifications, and alternatives.

An optical system, partly provided outside chamber 130 and partly provided inside chamber 130 is used to direct the frequency doubled optical pulse train along the electron-generating path 134 inside the chamber 130 so that the optical pulses impinge on cathode 140. As illustrated, the optical system includes mirror 144, which serves as a turning mirror inside chamber 130. In embodiments of the present invention, polished metal mirrors are utilized inside the chamber 130 since electron irradiation may damage mirror coatings used on some optical mirrors. In a specific embodiment, mirror 144 is fabricated from an aluminum substrate that is diamond turned to produce a mirror surface. In some embodiments, the aluminum mirror is not coated. In other embodiments, other metal mirrors, such as a mirror fabricated from platinum is used as mirror 144.

In an embodiment, the area of interaction on the cathode was selected to be a flat 300 μm in diameter. Moreover, in the embodiment illustrated, the frequency doubled optical pulse was shaped to provide a beam with a beam waist of a predetermined diameter at the surface of the cathode. In a specific embodiment, the beam waist was about 50 μm. In alternative embodiments, the beam waist ranged from about 30 μm to about 200 μm. Of course, the particular dimensions will depend on the particular applications. The frequency doubled optical pulse train was steered inside the chamber using a computer controlled mirror in a specific embodiment.

In a specific embodiment, the optical pulse train is directed toward a front-illuminated photocathode where the irradiation of the cathode by the laser results in the generation of electron pulses via the photoelectric effect. Irradiation of a cathode with light having an energy above the work function of the cathode leads to the ejection of photoelectrons. That is, a pulse of electromagnetic energy above the work function of the cathode ejects a pulse of electrons according to a preferred embodiment. Generally, the cathode is maintained at a temperature of 1000 K, well below the thermal emission threshold temperature of about 1500 K, but this is not required by the present invention. In alternative embodiments, the cathode is maintained at room temperature. In some embodiments, the cathode is adapted to provide an electron pulse of predetermined pulse width. The trajectory of the electrons after emission follows the lens design of the TEM, namely the condenser, the objective, and the projector lenses. Depending upon the embodiment, there may also be other configurations.

In the embodiment illustrated, the cathode is a Mini-Vogel mount single crystal lanthanum hexaboride ($LaB_6$) cathode shaped as a truncated cone with a flat of 300 μm at the apex and a cone angle of 90°, available from Applied Physics Technologies, Inc., of McMinnville, Oreg. As is often known, $LaB_6$ cathodes are regularly used in transmission and scanning electron microscopes. The quantum efficiency of $LaB_6$ cathodes is about $10^{-3}$ and these cathodes are capable of producing electron pulses with temporal pulse widths on the order of $10^{-13}$ seconds. In some embodiments, the brightness of electron pulses produced by the cathode is on the order of $10^9$ $A/cm^2/rad^2$ and the energy spread of the electron pulses is on the order of 0.1 eV. In other embodiments, the pulse energy of the laser pulse is reduced to about 500 pJ per pulse, resulting in approximately one electron/pulse Generally, the image quality acquired using a TEM is proportional to the number of electrons passing through the sample. That is, as the number of electrons passing through the sample is increased, the image quality increases. Some pulsed lasers, such as some Q-switched lasers, reduce the pulse count to produce a smaller number of pulses characterized by higher peak power per pulse. Thus, some laser amplifiers operate at a 1 kHz repetition rate, producing pulses with energies ranging from about 1 μJ to about 2 mJ per pulse. However, when such high peak power lasers are used to generate electron pulses using the photoelectric effect, among other issues, both spatial and temporal broadening of the electron pulses adversely impact the pulse width of the electron pulse or packet produced. In some embodiments of the present invention, the laser is operated to produce low power pulses at higher repetition rates, for example, 80 MHz. In this mode of operation, benefits available using lower power per pulse are provided, as described below. Additionally, because of the high repetition rate, sufficient numbers of electrons are available to acquire high quality images.

In some embodiments of the present invention, the laser power is maintained at a level of less than 500 pJ per pulse to prevent damage to the photocathode. As a benefit, the robustness of the photoemitter is enhanced. Additionally, laser pulses at these power levels prevent space-charge broadening of the electron pulse width during the flight time from the cathode to the sample, thus preserving the desired femtosecond temporal resolution. Additionally, the low electron count per pulse provided by some embodiments of the present invention reduces the effects of space charge repulsion in the electron pulse, thereby enhancing the focusing properties of the system. As one of skill in the art will appreciate, a low electron count per pulse, coupled with a high repetition rate of up to 80 MHz provided by the femtosecond laser, provides a total dose as high as one electron/Å$^2$ as generally utilized in imaging applications.

In alternative embodiments, other suitable cathodes capable of providing a ultrafast pulse of electrons in response to an ultrafast optical pulse of appropriate wavelength are utilized. In embodiments of the present invention, the cathode is selected to provide a work function correlated with the wavelength of the optical pulses provided by the SHG device. The wavelength of radiation is related to the energy of the photon by the familiar relation $\lambda(\mu m) \approx 1.24 \div v(eV)$, where $\lambda$ is the wavelength in microns and $v$ is the energy in eV. For example, a LaB$_6$ cathode with a work function of 2.7 eV is matched to optical pulses with a wavelength of 400 nm ($v$=3.1 eV) in an embodiment of the present invention. As illustrated, the cathode is enclosed in a vacuum chamber 130, for example, a housing for a transmission electron microscope (TEM). In general, the vacuum in the chamber 130 is maintained at a level of less than $1 \times 10^{-6}$ torr. In alternative embodiments, the vacuum level varies from about $1 \times 10^{-6}$ torr to about $1 \times 10^{-10}$ torr. The particular vacuum level will be a function of the varied applications.

In embodiments of the present invention, the short duration of the photon pulse leads to ejection of photoelectrons before an appreciable amount of the deposited energy is transferred to the lattice of the cathode. In general, the characteristic time for thermalization of the deposited energy in metals is below a few picoseconds, thus no heating of the cathode takes place using embodiments of the present invention.

Electrons produced by the cathode 140 are accelerated past the anode 142 and are collimated and focused by electron lens assembly 146 and directed along electron imaging path 148 toward the sample 150. The electron lens assembly generally contains a number of electromagnetic lenses, apertures, and other elements as will be appreciated by one of skill in the art. Electron lens assemblies suitable for embodiments of the present invention are often used in TEMs. The electron pulse propagating along electron imaging path 148 is controlled in embodiments of the present invention by a controller (not shown, but described in more detail with reference to certain Figures below) to provide an electron beam of predetermined dimensions, the electron beam comprising a train of ultrafast electron pulses.

The relationship between the electron wavelength ($\lambda_{deBroglie}$) and the accelerating voltage (U) in an electron microscope is given by the relationship $\lambda_{deBroglie} = h/(2 m_0 eU)^{1/2}$, where h, $m_0$, e are Planck's constant, the electron mass, and an elementary charge. As an example, the de Broglie wavelength of an electron pulse at 120 kV corresponds to 0.0335 Å, and can be varied depending on the particular application. The bandwidth or energy spread of an electron packet is a function of the photoelectric process and bandwidth of the optical pulse used to generate the electron packet or pulse.

Electrons passing through the sample or specimen 150 are focused by electron lens assembly 152 onto a detector 154. Although FIG. 1A illustrates two electron lens assemblies 146 and 152, the present invention is not limited to this arrangement and can have other lens assemblies or lens assembly configurations. In alternative embodiments, additional electromagnets, apertures, other elements, and the like are utilized to focus the electron beam either prior to or after interaction with the sample, or both.

Detection of electrons passing through the sample, including single-electron detection, is achieved in one particular embodiment through the use of an ultrahigh sensitivity (UHS) phosphor scintillator detector 154 especially suitable for low-dose applications in conjunction with a digital CCD camera. In a specific embodiment, the CCD camera was an UltraScan™ 1000 UHS camera, manufactured by Gatan, Inc., of Pleasanton, Calif. The UltraScan™ 1000 CCD camera is a 4 mega-pixel (2048×2048) camera with a pixel size of 14 µm×14 µm, 16-bit digitization, and a readout speed of 4 Mpixels/sec. In the embodiment illustrated, the digital CCD camera is mounted under the microscope in an on-axis, below the chamber position. In order to reduce the noise and picture artifacts, in some embodiments, the CCD camera chip is thermoelectrically cooled using a Peltier cooler to a temperature of about $-25°$ C. The images from the CCD camera were obtained with DigitalMicrograph™ software embedded in the Tecnai™ user interface, also available from Gatan, Inc. Of course, there can be other variations to the CCD camera, cooler, and computer software, depending upon the embodiment.

Figure 1B:
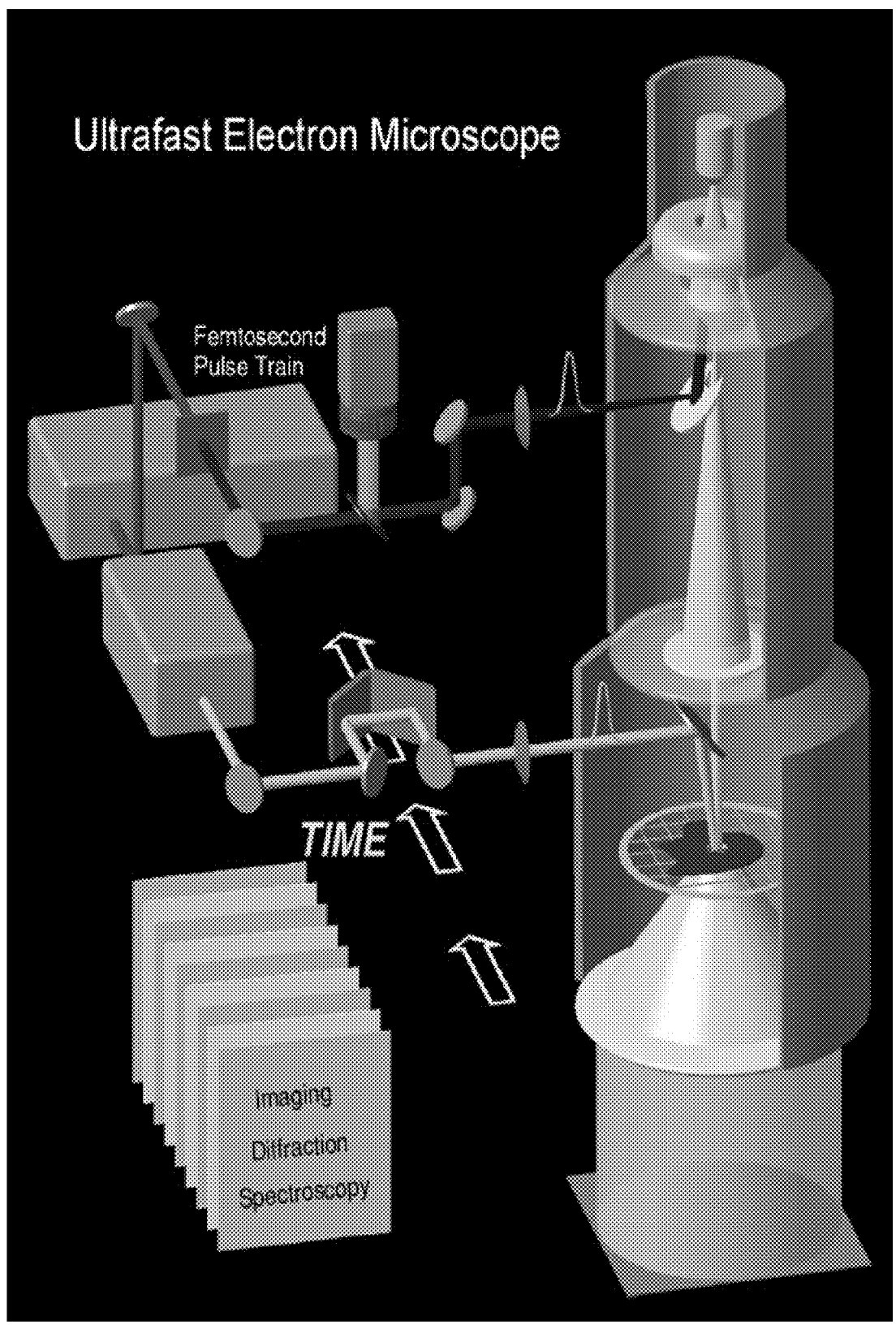
FIG. 1B is a simplified perspective diagram of an ultrafast photoelectron microscope system according to an embodiment of the present invention.

FIG. 1B illustrates an embodiment of the present invention in which a TEM is modified to provide a train of electron pulses used for imaging in addition to the thermionic emission source used for imaging of samples. Merely by way of example, an FEI Tecnai™ G$^2$ 12 TWIN, available from FEI Company in Hillsboro, Oreg., may be modified according to embodiments of the present invention. The Tecnai™ G$^2$ 12 TWIN is an all-in-one 120 kV ($\lambda_{deBroglie}$=0.0335 Å) high-resolution TEM optimized for 2D and 3D imaging at both room and liquid-nitrogen temperatures. Embodiments of the present invention leverage capabilities provided by commercial TEMs such as automation software, detectors, data transfer technology, and tomography.

In particular, in some embodiments of the present invention, a five-axis, motor-driven, precision goniometer is used with computer software to provide automated specimen tilt combined with automated acquisition of images as part of a computerized tomography (CT) imaging system. In these embodiments, a series of 2D images are captured at various specimen positions and combined using computer software to generate a reconstructed 3D image of the specimen. In some embodiments, the CT software is integrated with other TEM software and in other embodiments, the CT software is provided off-line. One of ordinary skill in the art would recognize many variations, modifications, and alternatives.

In certain embodiments in which low-electron content electron pulses are used to image the sample, the radiation damage is limited to the transit of the electrons in the electron pulses through the sample. Typically, samples are on the order of 100 nm thick, although other thicknesses would work as long as certain electrons may traverse through the sample. Thus, the impact of radiation damage on these low-electron content electron pulse images is limited to the damage occurring during this transit time. Radiation induced structural damage occurring on longer time scales than the transit time will not impact the collected image, as these damage events will occur after the structural information is collected.

Utilizing the apparatus described thus far, embodiments of the present invention provide systems and methods for imaging material and biological specimens both spatially and temporally with atomic-scale spatial resolution on the order of 1 nm and temporal resolution on the order of 100 fs. At these time scales, energy randomization is limited and the atoms are nearly frozen in place, thus methods according to the present invention open the door to time-resolved studies of structural dynamics at the atomic scale in both space and time. Details of the present computer system according to an embodiment of the present invention may be explained according to the description below.

Figure 1C:
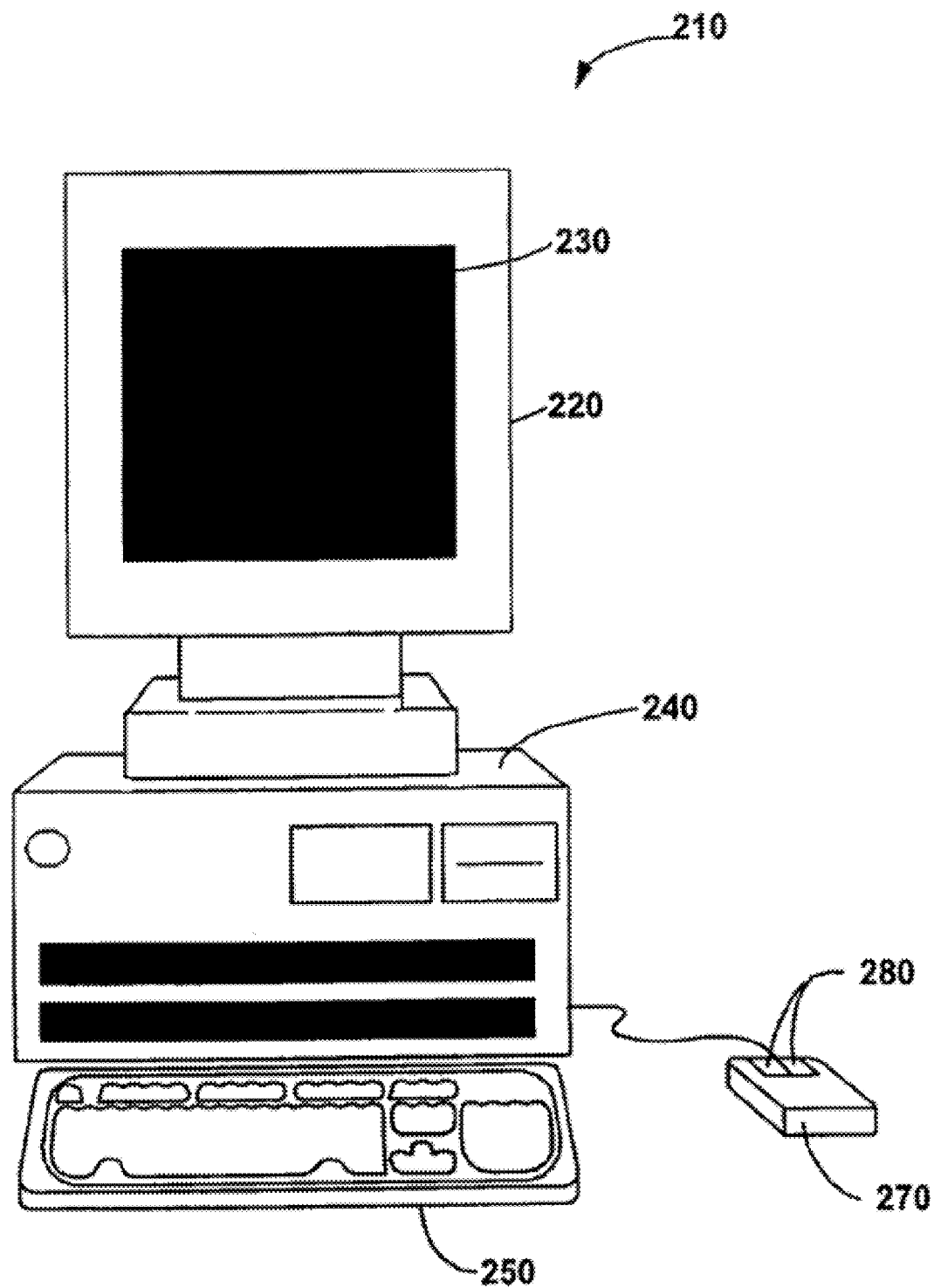
FIG. 1C is a simplified diagram of a computer system for controlling the ultrafast photoelectron microscope system according to an embodiment of the present invention.

FIG. 1C is a simplified diagram of a computer system 210 that is used to oversee the system of FIGS. 1A and 1B according to an embodiment of the present invention. This diagram is merely an example, which should not unduly limit the scope of the claims herein. One of ordinary skill in the art would recognize many other modifications, alternatives, and variations. As shown, the computer system 210 includes display device 220, display screen 230, cabinet 240, keyboard 250, and mouse 270. Mouse 270 and keyboard 250 are representative "user input devices." Mouse 270 includes buttons 280 for selection of buttons on a graphical user interface device. Other examples of user input devices are a touch screen, light pen, track ball, data glove, microphone, and so forth.

The system is merely representative of but one type of system for embodying the present invention. It will be readily apparent to one of ordinary skill in the art that many system types and configurations are suitable for use in conjunction with the present invention. In a preferred embodiment, computer system 210 includes a Pentium™ class based computer, running Windows™ NT or XP operating system by Microsoft Corporation. However, the system is easily adapted to other operating systems such as any open source system and architectures by those of ordinary skill in the art without departing from the scope of the present invention. As noted, mouse 270 can have one or more buttons such as buttons 280. Cabinet 240 houses familiar computer components such as disk drives, a processor, storage device, etc. Storage devices include, but are not limited to, disk drives, magnetic tape, solid-state memory, bubble memory, etc. Cabinet 240 can include additional hardware such as input/output (I/O) interface cards for connecting computer system 210 to external devices external storage, other computers or additional peripherals, which are further described below.

Figure 1D:
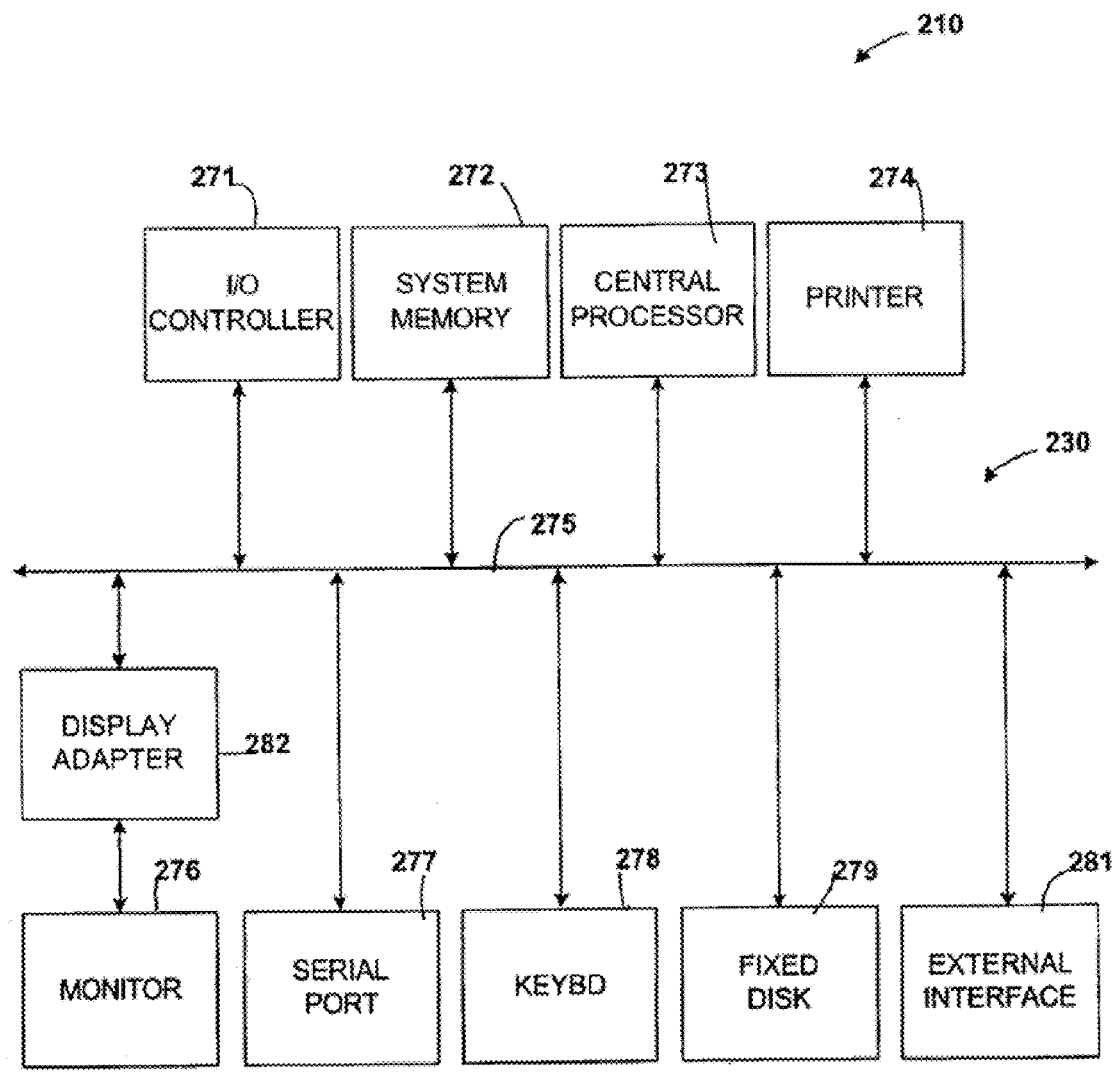
FIG. 1D is a simplified block diagram of computer hardware for controlling the ultrafast photoelectron microscope system according to an embodiment of the present invention.

FIG. 1D is a more detailed diagram of hardware elements in the computer system of FIG. 1C according to an embodiment of the present invention. This diagram is merely an example, which should not unduly limit the scope of the claims herein. One of ordinary skill in the art would recognize many other modifications, alternatives, and variations. As shown, basic subsystems are included in computer system 210. In specific embodiments, the subsystems are interconnected via a system bus 275. Additional subsystems such as a printer 274, keyboard 278, fixed disk 279, monitor 276, which is coupled to display adapter 282, and others are shown. Peripherals and input/output (I/O) devices, which couple to I/O controller 271, can be connected to the computer system by any number of means known in the art, such as serial port 277. For example, serial port 277 can be used to connect the computer system to a modem 281, which in turn connects to a wide area network such as the Internet, a mouse input device, or a scanner. The interconnection via system bus allows central processor 273 to communicate with each subsystem and to control the execution of instructions from system memory 272 or the fixed disk 279, as well as the exchange of information between subsystems. Other arrangements of subsystems and interconnections are readily achievable by those of ordinary skill in the art. System memory, and the fixed disk are examples of tangible media for storage of computer programs, other types of tangible media include floppy disks, removable hard disks, optical storage media such as CD-ROMS and bar codes, and semiconductor memories such as flash memory, read-only-memories (ROM), and battery backed memory.

Although the above has been illustrated in terms of specific hardware features, it would be recognized that many variations, alternatives, and modifications can exist. For example, any of the hardware features can be further combined, or even separated. The features can also be implemented, in part, through software or a combination of hardware and software. The hardware and software can be further integrated or less integrated depending upon the application. Further details of the functionality, which may be carried out using a combination of hardware and/or software elements, of the present invention can be outlined below according to the Figures.

FIGS. 2A-2D are a series of images acquired using an embodiment of the present invention. In order to characterize system performance, a calibration specimen was placed in the system described above and imaged using multiple methodologies. In the embodiment illustrated in FIG. 2, the specimen was a replica of a 2,160 lines/mm waffle-pattern diffraction grating. The spacing between lines for the specimen was 0.462 µm and the waffle-pattern is first visible around a magnification of ×2500.

Figure 2A:
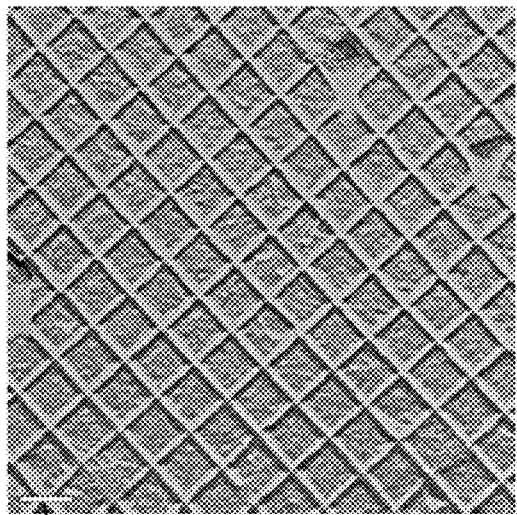
FIGS. 2A-2D are a series of images acquired using an embodiment of the present invention.

FIG. 2A is an image acquired using electrons emitted via thermionic emission from an electron gun. As is known to one of skill in the art, conventional electron guns used in TEMs utilize thermionic emission to generate a stream of electrons that are accelerated away from the cathode and focused into a beam directed toward the sample. In FIG. 2A, the voltage between the cathode and the anode was 120 kV and the magnification of the imaging system was ×4400. The scale marker 290 denotes 0.5 µm, which is approximately the spacing between adjacent lines of 0.463 µm.

Figure 2B:
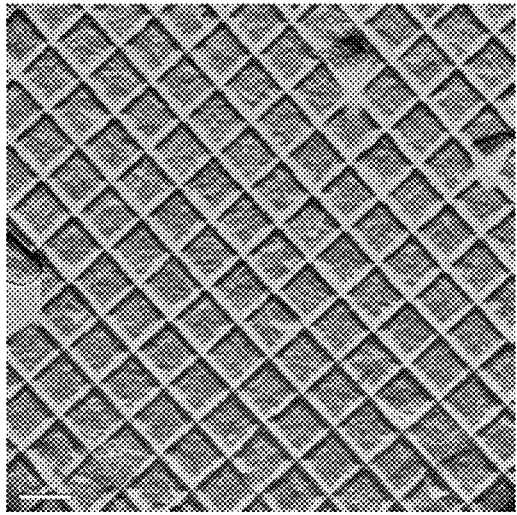

FIG. 2B is an image acquired using electrons emitted via the photoelectric effect from the same cathode used to create the image in FIG. 2A. As described above, using embodiments of the present invention, a train of photon pulses is directed onto the cathode, generating a train of electron pulses that travel along the imaging path. Operating the microscope at the same 120 kV voltage, the stream of electron pulses encounter the specimen with a portion of the electron pulses passing through the sample, resulting in the image shown in FIG. 2B. Therefore, utilizing methods and systems according to embodiments of the present invention, it is possible to acquire images of static specimens.

For calibration purposes, background "images" were obtained with the cathode turned off (i.e. no thermionic emission) and the femtosecond pulses blocked prior to entering the chamber 130. These "images" were of an opaque background scene comprising readout noise, demonstrating that the image illustrated in FIG. 2B resulted from the photoelectric effect and the production of electrons by thermal emission processes was negligible. Although it is possible to generate thermal electrons by laser heating of the cathode and/or as the result of the resistance heating of the cathode, the calibration measurements eliminated these possibilities.

Figure 2C:
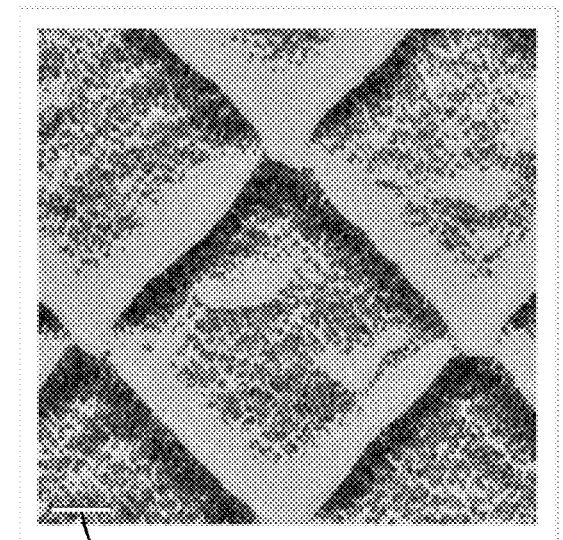
Figure 2D:
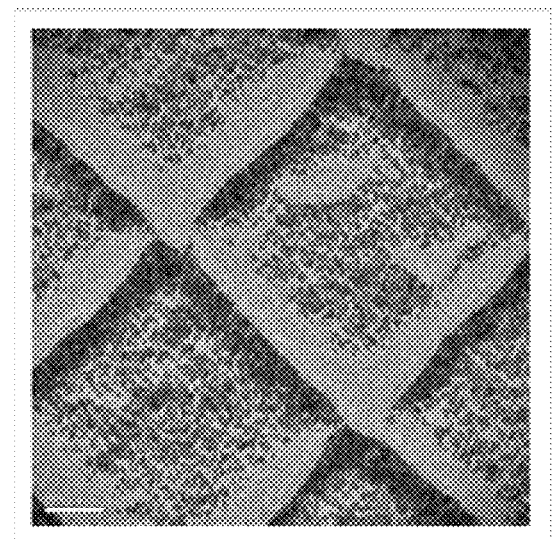

FIGS. 2C and 2D are images acquired using a thermionic emission source and electron pulses, respectively. The scale marker 292 denotes a distance of 100 nm, approximately a fifth of the spacing between adjacent lines. Shifting of the specimen between measurement is observed in the images.

Figure 3:
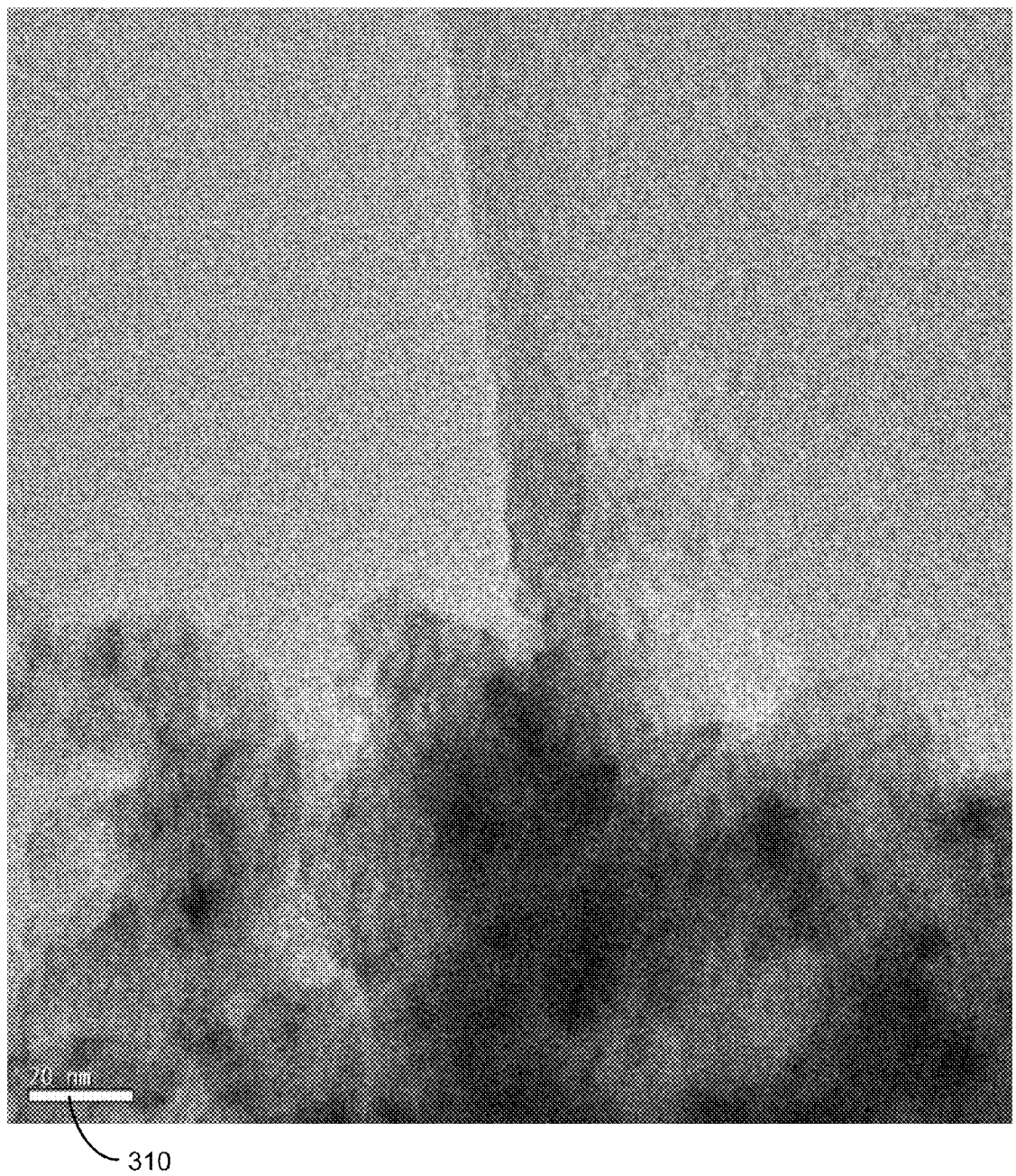
FIG. 3 is an image acquired using electron pulses according to an embodiment of the present invention.

FIG. 3 is an image acquired using electron pulses according to an embodiment of the present invention. The object shown is graphitized carbon on porous carbon grids. The magnification for the image shown is ×110000 and the scale bar 310 is 20 nm. A calibration "image" was obtained with the femtosecond pulses blocked prior to entering the chamber, resulting in an opaque background scene comprising readout noise.

Figure 4B:
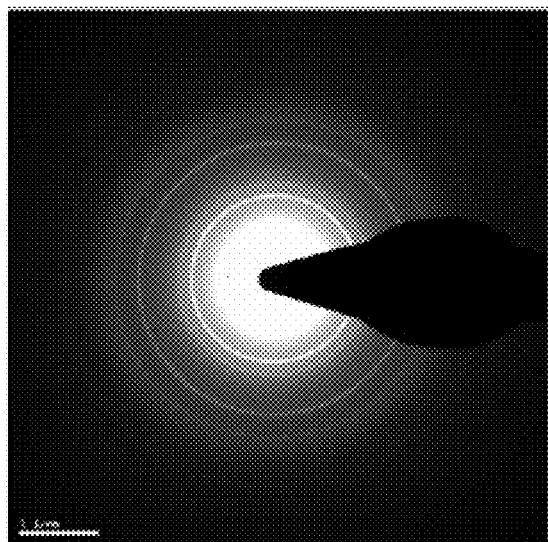
Figure 4B:
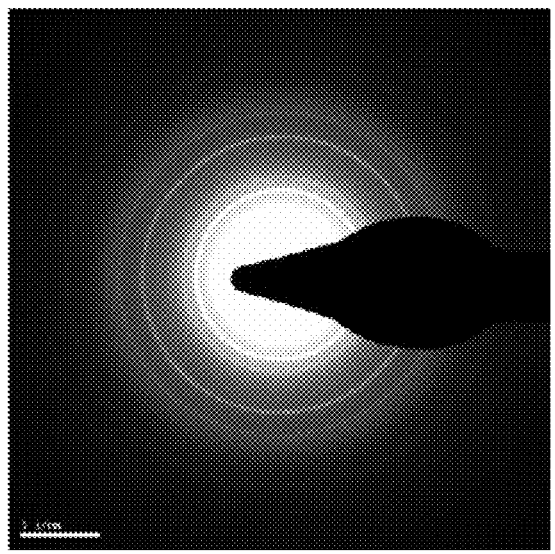
Figure 4D:
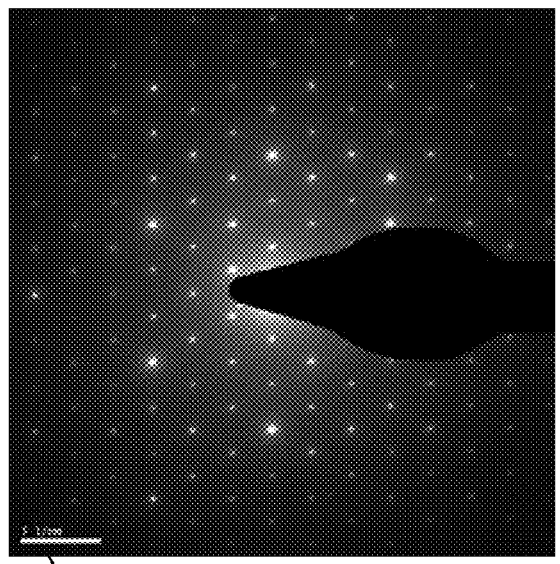
Figure 4D:
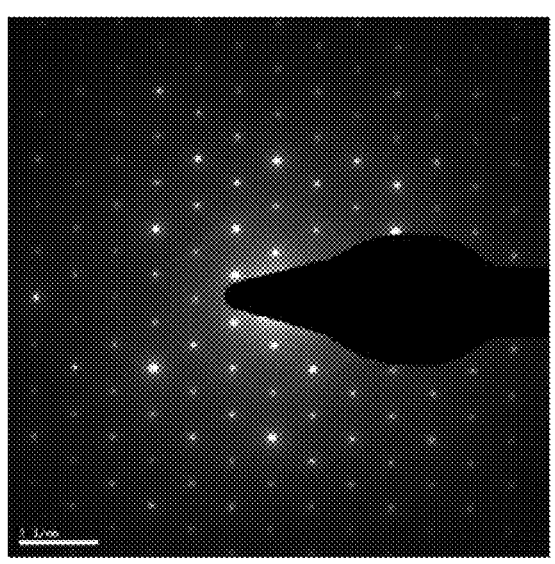

FIGS. 4A-4C are images obtained using a diffraction mode of operation according to an embodiment of the present invention. In order to acquire the image shown in the Figures, the intermediate lens (not shown in FIG. 1A) was adjusted to select the back focal plane of the objective lens as its object. The diffraction patterns were collected at 120 kV in both thermionic emission and electron pulse mode for samples of polycrystalline aluminum and single-crystal gold. FIG. 4A is a diffraction pattern with a scale 410 of 5 nm$^{-1}$ acquired using thermionic emission from a sample of polycrystalline aluminum. FIG. 4B is a diffraction pattern with the same scale acquired using a train of ultrafast electron pulses on the same polycrystalline aluminum sample. Similar diffraction patterns were collected using thermionic emission (FIG. 4C) and a train of ultrafast electron pulses (FIG. 4D) using a single crystal gold sample. The diffraction patterns illustrated may be indexed to provide the atomic plane spacings and symmetry depending upon the embodiment.

One of skill in the art will appreciate that embodiments of the present invention are not limited to imaging applications, but may also include diffraction and crystallography applications. As will be described with reference to certain Figures below, optically initiated diffraction experiments are provided by embodiments of the present invention, but are not limited to this particular application. Thus, it will be appreciated that embodiments of the present invention encompass imaging and diffraction experiments using electron pulses. Moreover, imaging and diffraction experiments in which a sample is optically initiated or spectroscopically activated are also encompassed by embodiments of the present invention. Of course, there can be other variations, modifications, and alternatives.

Figure 5A:
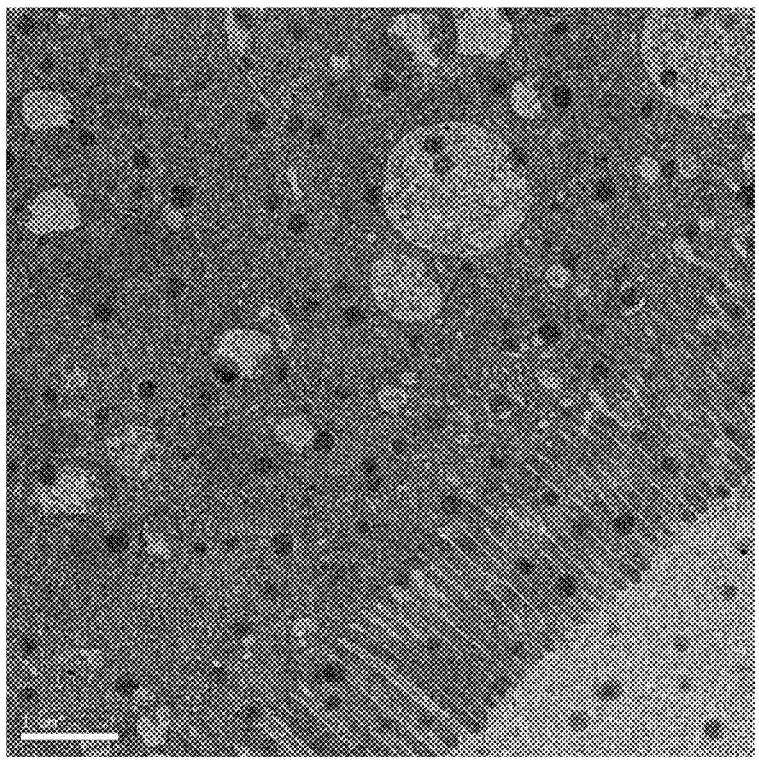
FIGS. 5A and 5B are images of a biological sample acquired using an embodiment of the present invention.
Figure 5B:
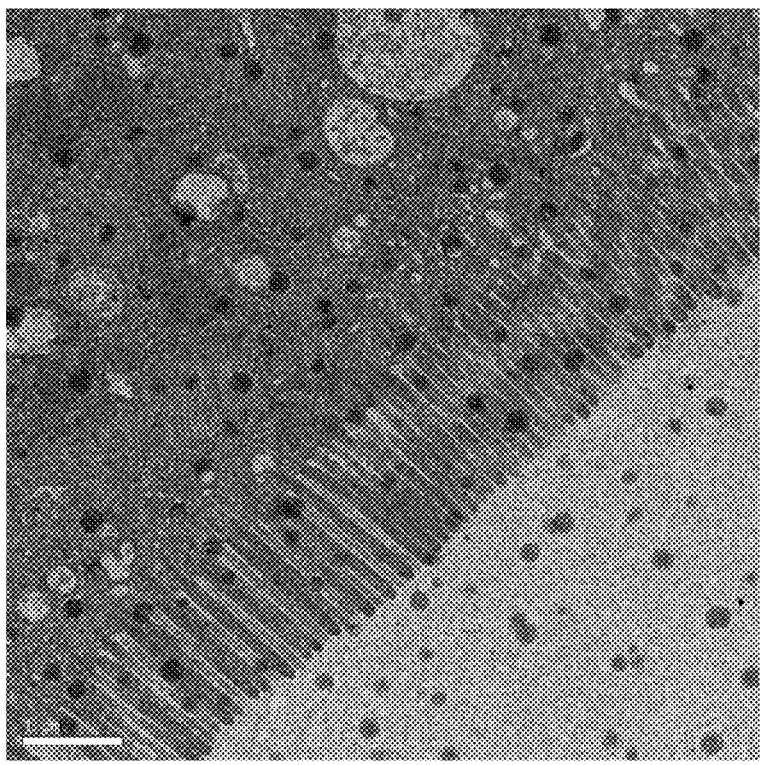

FIG. 5 is an image of a biological sample acquired using an embodiment of the present invention. In FIG. 5, a positively-stained (uranyl acetate) biological cell, embedded in a resin, in particular, a rat intestine, was imaged using the system illustrated in FIG. 1A. Although sample preparation for this embodiment was performed using a conventional positive staining protocol, this is not required by the present invention. FIG. 5A was acquired using an electron beam generated using thermionic emission. FIG. 5B was acquired using a train of ultrafast electron pulses. The image shown in FIG. 5B, acquired in a matter of several seconds, using femtosecond electron pulses with a low-electron content of approximately one electron per pulse, provides time resolved images unavailable using thermionic emission sources.

The ultrafast time resolution provided by an ultrafast electron microscope (UEM) according to embodiments of the present invention has unique consequences. For the image shown in FIG. 5B, energy randomization is limited as the atoms are nearly frozen in place by the stroboscopic method provided by embodiments of the present invention. Thus, studies of intact biological samples are enabled by embodiments of the present invention. Using the methods and systems described herein, it is possible to extend the results achieved using cryo-electron microscopes (characterized by resolution on the order of milliseconds as dictated by freezing/mixing rates) to study the structure, assembly and dynamics of macromolecules with time resolutions in the ultrafast regime. The low number of electrons in each ultrafast pulse, along with established methods of cryofixation, present a tremendous advance in limiting damage from electron irradiation as discussed previously.

It should be noted that for sample in which biological structural recovery is longer than 12.5 ns, pulse pickers, such as the Pulse-Picker 9200, available from Coherent, Inc., of Santa Clara, Calif., may be used to select pulses from the train at rates suitable for such a recovery. Moreover, as illustrated in FIGS. 2, 4A-D, and 5, embodiments of the present invention provide methods and systems for alternatively obtaining either images or diffraction patterns using certain conventional TEM modes of operation or in the UEM mode. Thus, with minimal system modifications and training, embodiments of the present invention provide numerous benefits.

Referring once again to the optical path 115 in FIG. 1A, a second portion of the optical pulse produced by laser 110 is coupled to the optical parametric oscillator (OPO) 160. The OPO 160 provides tunable femtosecond pulses in the infrared from about 1.1 μm to about 2.25 μm by parametric generation of two longer wavelength photons from a single shorter wavelength photon. In addition, doubling of the frequency of infrared pulses produced by the OPO further extends access to a visible region of a spectrum. In some embodiments, the OPO enhances the versatility of the ultrafast Ti:Sapphire laser by extending its output into the visible and infrared regions of the spectrum. In some embodiments of the present invention, the OPO 160 is utilized to tune the photon beam for spectroscopic applications. For example, in some spectroscopy applications, the frequency associated with a pump beam used to initiate, for example, a chemical reaction in a sample, is selected to maximize the interaction between the pump beam and the sample. Thus, in this particular application, the OPO is utilized to tune the frequency of the photon beam in path 164 as desired. The spectroscopic applications available through embodiments of the present invention are not limited to chemical reactions, but may include absorption spectroscopy, electron energy loss spectroscopy (EELS), and other applications.

An optical delay stage 162 is provided in change-initiating path 164 to introduce a predetermined delay in the optical path of the optical pulses propagating along path 164. One of skill in the art will appreciate techniques for introducing and controlling an optical delay stage such as that illustrated in FIG. 1A. In some embodiments, the optical delay stage 162 is used to determine a "zero time" in which an optical pulse in the change-initiating path 164 and an electron pulse in the electron imaging path 148 are temporally and spatially aligned to arrive at the sample 150 simultaneously. In other embodiments, the optical delay is selectable to introduce either positive (optical pulse delayed a selected time period with respect to the electron pulse) or negative (optical pulse advanced a selected time period with respect to the electron pulse). One of ordinary skill in the art would recognize many variations, modifications, and alternatives. The optically delayed pulse enters chamber 130 through window 166 and is reflected off mirror 168 and directed toward the sample 150. In some embodiments, an imaging system 170 is provided including coaxial illuminator 172 and CCD camera 174 to provide for monitoring of the sample using light scattered back off the surface of the sample 150. As will be appreciated by one of skill in the art, many variations, modifications, and alternatives are available for the imaging system 170. Window 166 and mirror 168 are identical to window 132 and mirror 144 in some embodiments, although this is not required by the present invention.

Although the previous discussion describes an optical delay stage in the optical path 164, this is not required by the present invention. Depending upon the embodiment, an optical delay stage could be integrated into electron generating path 118 to delay the generation of the electron beam with respect to the optical beam in change-inducing path 164. As mentioned previously, the delay in the electron generating path may be positive or negative as the stage is generally configured with a negative delay at one extreme, a positive delay at the other extreme, and a zero-time delay at an intermediate portion of the stage.

In embodiments of the present invention utilizing the optical pulse in the change-inducing path 164 to initiate a change in the sample, the time coordinate for a reaction is generally established based on a point of reference for the relative time delay between the optical initiation pulse and the electron pulse. This reference point is commonly referred to as time-zero ($t_0$), the time when both pulses simultaneously intersect in the sample. One approach to determining time-zero is based on a careful measurement of photon and electron beam paths. This technique can typically narrow the time-zero window to within 100 ps.

Another approach utilized in some embodiments of the present invention is to use the crossed-beam geometry of an actual diffraction experiment to determine time-zero via the "lensing effect." For example, during $CF_3I$ dissociation reaction studies, we observed a dramatic change in the undiffracted electron beam profile when the excitation laser was present. The beam spot intensified along one axis, with a corresponding subtle decrease in the overall width. This effect only occurred when both the excitation laser and the molecular beam were present. The intensified strip was parallel to the laser axis and could be shifted up and down within the beam spot by adjusting the vertical tilt of the excitation laser entrance lens. Defocusing the laser reduced the stripe intensity. We refer to this phenomenon photoionization-induced lensing. The effect is analogous to plasma lensing, a technique in which the high-energy charged beams in particle accelerators are focused by passing through a plasma field.

In yet another embodiment of the present invention, an in-situ synchronization method is utilized with an energy filter tuned in a region corresponding to resonant plasmon loss. Because the electron-electron scattering constant is on the order of a few femtoseconds, the position of the plasmon peak is a natural marker for experimental synchronization. In particular, the position of the peak in energy loss spectrum corresponds to the plasmon frequency and is proportional to the free carriers in the sample. The plasmon resonance is the strongest feature in the energy loss spectrum with an intensity as high as a few percent from the zero-loss peak. Using this same technique, measurements of the electron pulse width can be obtained.

An example of an application of embodiments of the present invention is the imaging of the non-concerted elimination reaction of dihaloethanes. FIG. 6 is a simplified timing diagram illustrating the use of a method according to the present invention. FIG. 6 illustrates a method of the present invention using different electron pulse sequences to isolate the reactant, intermediates in transition, and product structures. As illustrated, the specific reaction studied involves the elimination of two iodine atoms from the reactant to give the product.

Figure 6A:
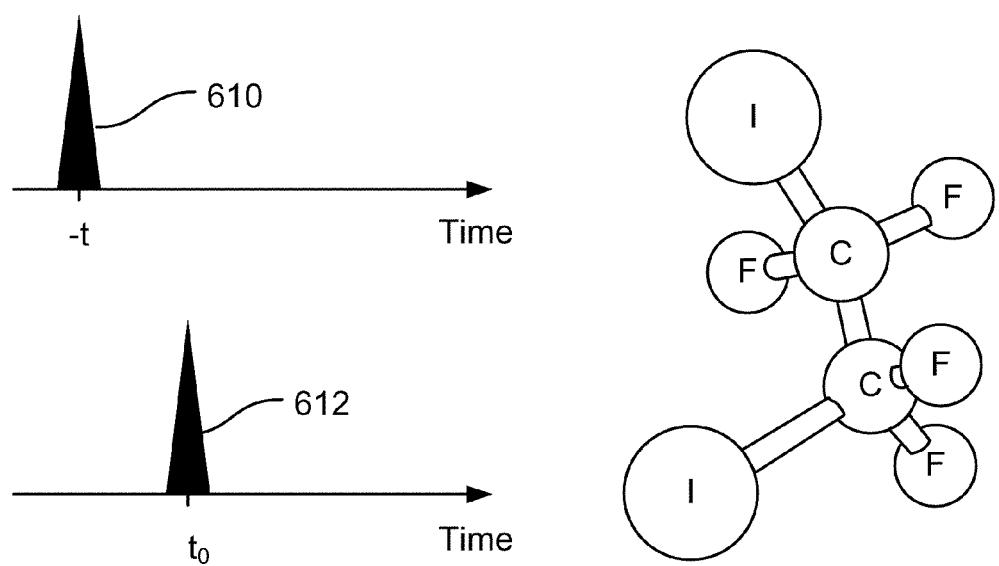
FIG. 6 is a simplified timing diagram illustrating the use of a method according to the present invention.

The reactant, for example, diiodoethane, is illustrated at time $-t$ and time to in FIG. 6A. As illustrated at time $-t$, the electron pulse 610 has been timed to arrive at the sample before the optical initiating pulse 620. Utilizing the delay stage illustrated in FIG. 1A, the delay between the initiation pulse and the electron pulse is varied, enabling images to be collected at various reaction times. At time $t_0$, the optical initiation pulse 620 and the probe pulse 612 impinge on the sample containing the diiodoethane simultaneously. In the embodiment illustrated in FIG. 6, the initiation pulse is an optical pulse and initiates the non-concerted elimination reaction of the diiodoethane. Of course, use of the OPO 160 provides for tuning of the optical initiation pulse as desired, for example, for initiation of chemical reactions, spectroscopic analysis, and the like.

Figure 6B:
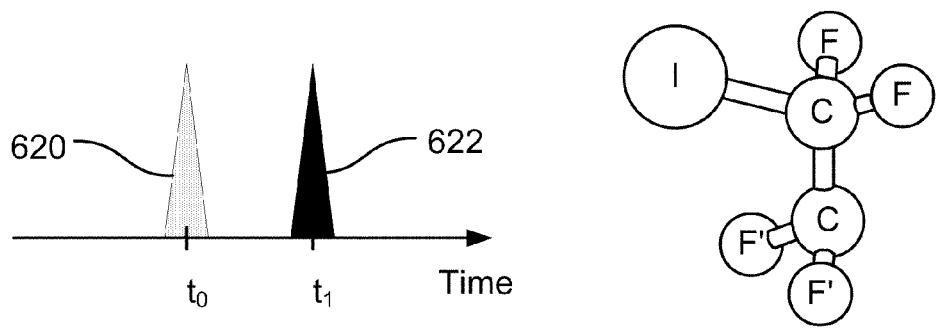
Figure 6C:
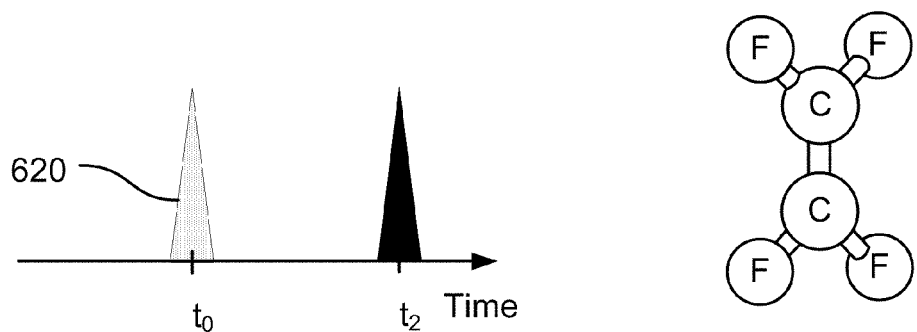

FIG. 6B illustrates a snapshot of the elimination reaction at a time $t_1$ after the optical initiation pulse impinges on the sample. At time $t_1$, the diiodoethane eliminates the first iodine atom as illustrated. As time progresses, the second iodine atom is eliminated at time $t_2$ as illustrated in FIG. 6C. The molecular structure of the $C_2F_4I$ intermediate was determined from the frame referencing, diffraction-difference curves $\Delta sM(t; 5\ ps;\ s)$. Both the bridged and classical $C_2F_4I$ structures were considered in the analysis of the diffraction data. The theoretical curves for the classical structures reproduce the experimental data very well, whereas the fit provided by the theoretical bridged structure is vastly inferior. Thus, we concluded that the structure of the $C_2F_4I$ radical intermediate is, in fact, classical in nature, i.e. the iodine atom does not bridge the two carbons.

Furthermore, we determined that the C—I and C—C distances of the $C_2F_4I$ intermediate are, respectively, longer and shorter than those of the reactant, while the C—F' internuclear distance in the radical site (—$CF'_2$) is shorter than that of the —$CF_2I$ site. These results elucidate the increased C—C and decreased C—I bond order resulting from the formation of the transient $C_2F_4I$ structure. Moreover, the $\angle CCF'$ and $\angle F'CF'$ angles become larger than the corresponding angles of the reactant (by ~9° and ~12° respectively), suggesting that the radical center (—$CF'_2$) of the $C_2F_4I$ intermediate relaxes following the loss of the first I atom. We believe the structures and dynamics reported for this reaction are important in describing the retention of stereochemistry in such class of reactions. Furthermore, we believe this is the first example of resolving such complex structures during the transition.

In FIGS. 6A-C, the time scale is not drawn to scale, but merely provided to illustrate a series of time-resolved measurements. For the non-concerted elimination reaction of dihaloethanes time $t_1$ is approximately 250 fs and time $t_2$ is 26±7 ps. Of course, there can be other variations, modifications, and alternatives. Certain methods according to embodiments of the present invention are described throughout the present specification and more particularly below.

A method for imaging an object according to an embodiment of the present invention may be outlined as follows:

1. Provide a transmission electron microscope comprising a laser source, a cathode, and an electron lens assembly;
2. Form a train of optical pulses, where each of the optical pulses is characterized by a Full Width Half Maximum ("FWHM") pulse length of less than 100 fs in duration;
3. Provide a sample (e.g., chemical, biological, physical) for imaging disposed on a stage assembly;
4. Generate a train of electron pulses by impinging the associated train of optical pulses on the cathode, where each of the electron pulses is characterized by a FWHM pulse length less than 1 ps in duration;
5. Direct the train of electron pulses toward the sample using at least the electron lens assembly;
6. Capture a portion of the train of electron pulses using a sensing device;
7. Derive information associated with an image of the sample;

8. Process the information associated with the image of the sample;

9. Output a visual representation of the image of the sample using at least the processed information; and 10. Perform other steps, as desired.

The above sequence of steps provides methods according to an embodiment of the present invention. As shown, the method uses a combination of steps including a way of imaging one or more feature of a sample using one or more pulses of electrons having a short predetermined duration according to a specific embodiment. Many other methods and system are also included. Of course, other alternatives can also be provided where steps are added, one or more steps are removed, or one or more steps are provided in a different sequence without departing from the scope of the claims herein. Additionally, the various methods can be implemented using a computer code or codes in software, firmware, hardware, or any combination of these. Depending upon the embodiment, there can be other variations, modifications, and alternatives. Further details of the present method can be found throughout the present specification and more particularly below.

Figure 7:
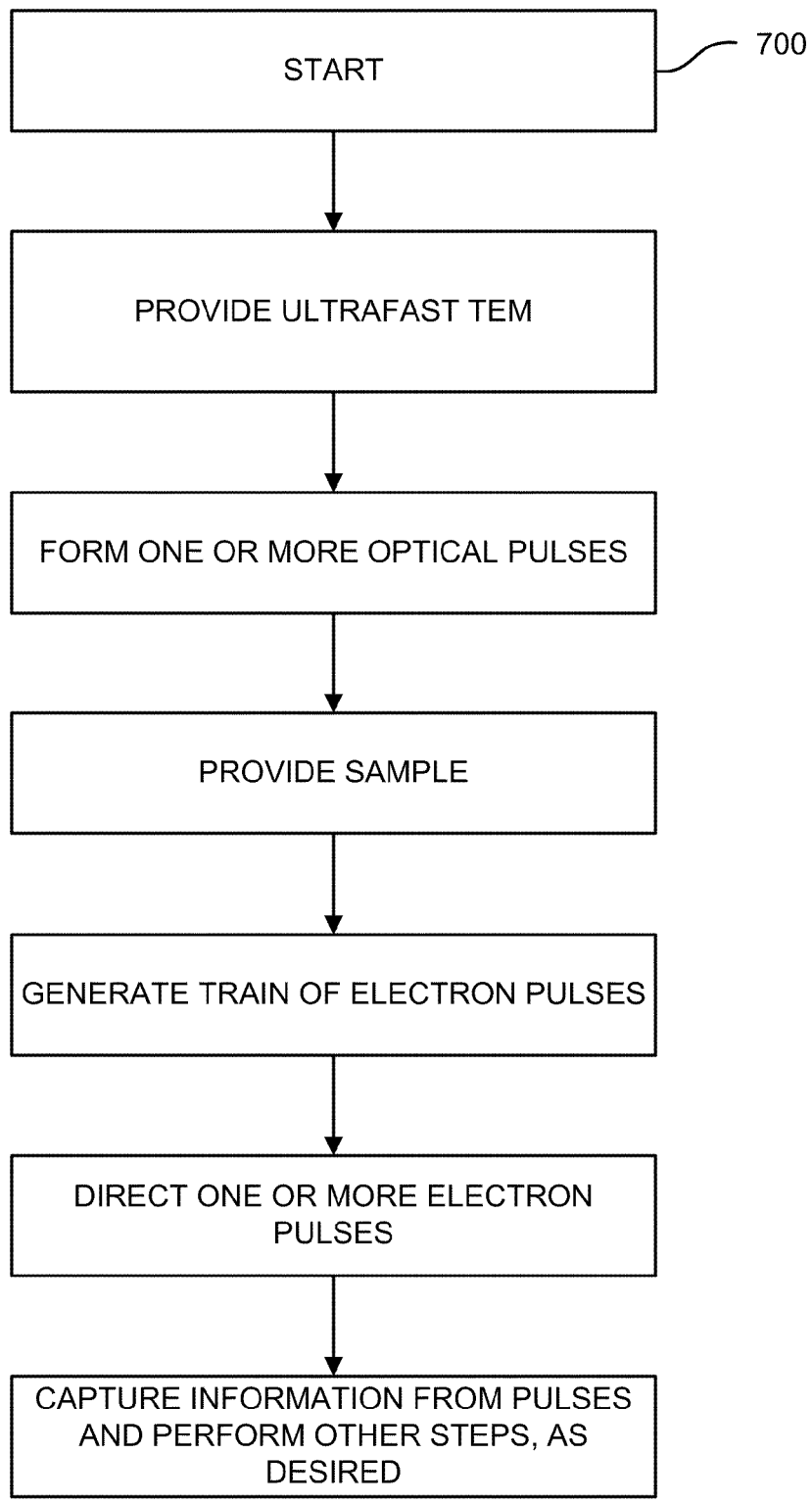
FIG. 7 is a simplified flow diagram of an imaging method according to an embodiment of the present invention.

FIG. 7 is a simplified flow diagram 700 of an imaging method according to an embodiment of the present invention. This diagram is merely an example, which should not unduly limit the scope of the claims herein. One of ordinary skill in the art would recognize many variations, modifications, and alternatives.

Although the above method has been illustrated in terms of specific software and/or hardware features, it would be recognized that many variations, alternatives, and modifications can exist. For example, any of the hardware features can be further combined, or even separated. The features can also be implemented, in part, through software or a combination of hardware and software. The hardware and software can be further integrated or less integrated depending upon the application. Of course, one of ordinary skill in the art would recognize many other modifications, variations, and alternatives.

A method for imaging an object according to an alternative embodiment of the present invention may be outlined as follows:

1. Provide a feature (e.g., 100 nanometers and less) of a sample to be imaged;

2. Place the sample onto a stage assembly;

3. Maintain the sample on the stage assembly in a vacuum environment;

4. Direct one or more pulses of electrons (e.g., one to about 1000 electrons per pulse) toward the feature of the sample;

5. Capture a portion of the one or more pulses of electrons, which are associated with the feature of the sample, using a sensing device;

6. Transfer information associated with the portion of the one or more pulses of electrons associated with the image of the feature of the sample from the sensing device to a processing device;

7. Receive the information associated with the portion of the one or more pulses of the electrons by the processing device;

8. Process the information associated with the portion of the one or more pulses of electrons;

9. Output a visual image associated with the feature of the sample using at least the information associated with the portion of the one or more pulses of electrons associated with the image of the feature of the sample; and 10. Perform other steps, as desired.

The above sequence of steps provides methods according to an embodiment of the present invention. As shown, the method uses a combination of steps including a way of capturing an image of a feature of a sample using one or more pulses of electrons being directed to the feature and a portion of the electrons captured by a detection device according to a specific embodiment. Many other methods and system are also included. Of course, other alternatives can also be provided where steps are added, one or more steps are removed, or one or more steps are provided in a different sequence without departing from the scope of the claims herein. Additionally, the various methods can be implemented using a computer code or codes in software, firmware, hardware, or any combination of these. Depending upon the embodiment, there can be other variations, modifications, and alternatives. Further details of the present method can be found throughout the present specification and more particularly below.

Figure 8:
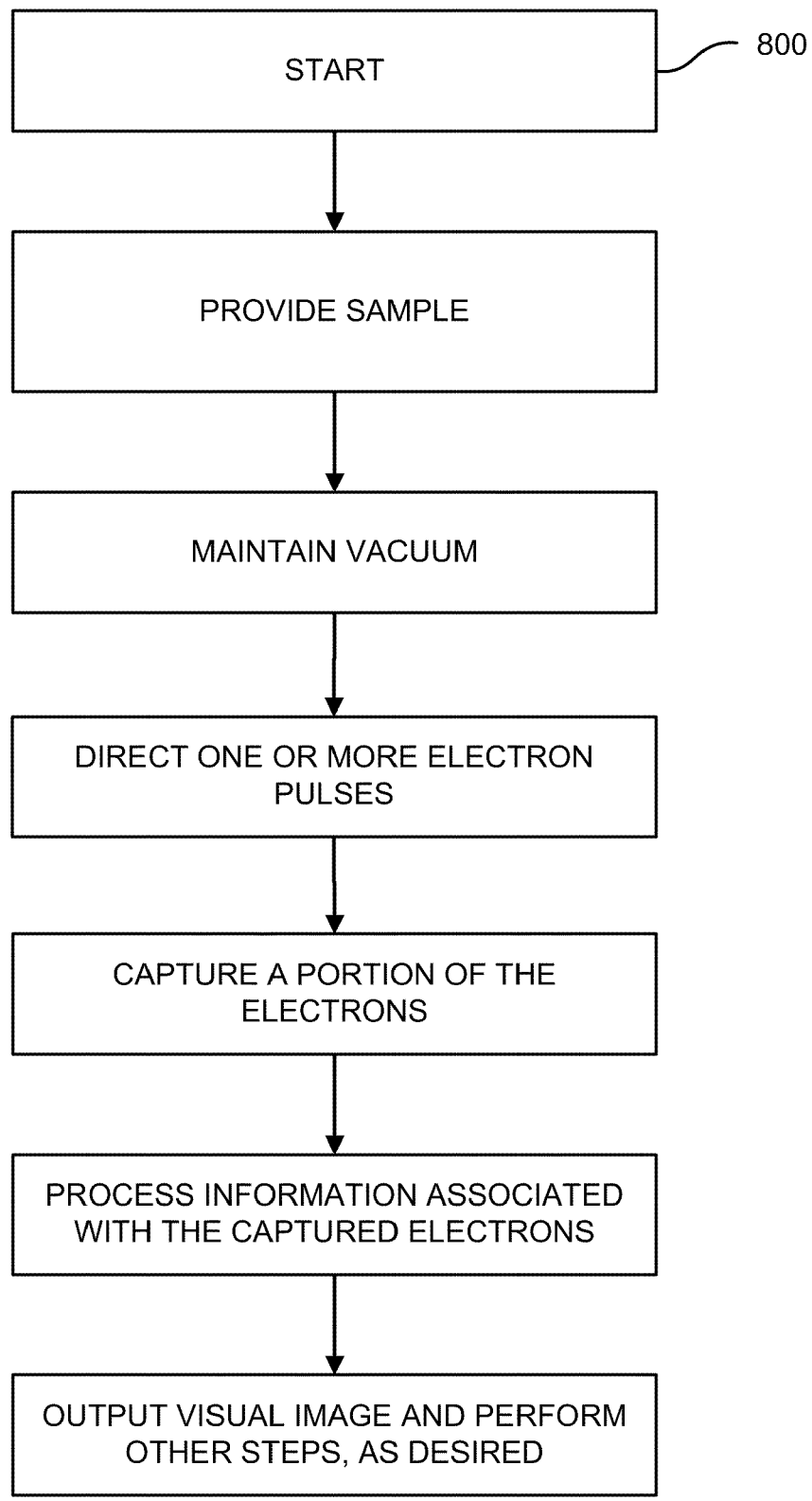
FIG. 8 is a simplified flow diagram of an alternative imaging method according to an embodiment of the present invention.

FIG. 8 is a simplified flow diagram 800 of an alternative imaging method according to an embodiment of the present invention. This diagram is merely an example, which should not unduly limit the scope of the claims herein. One of ordinary skill in the art would recognize many variations, modifications, and alternatives.

Although the above method has been illustrated in terms of specific software and/or hardware features, it would be recognized that many variations, alternatives, and modifications can exist. For example, any of the hardware features can be further combined, or even separated. The features can also be implemented, in part, through software or a combination of hardware and software. The hardware and software can be further integrated or less integrated depending upon the application. Of course, one of ordinary skill in the art would recognize many other modifications, variations, and alternatives.

In still a further embodiment, the present invention provides a method of acquiring time-resolved images using an electron microscope. Such method may be outlined as follows:

1. Provide a feature of a sample to be imaged for a temporal characteristic;

2. Place the sample onto a stage assembly of the electron microscope;

3. Maintain the sample on the state assembly in a vacuum environment;

4. Direct one or more first pulses of electrons, each of which has 10 to 1000 electrons, toward the feature of the sample;

5. Capture a first portion of the one or more first pulses of electrons, which is associated with a first image of the feature of the sample during a first portion of time, using a sensing device during the first portion of time;

6. Transfer first information associated with the first portion of the one or more first pulses of electrons associated with the first image of the feature of the sample during the first portion of time from the sensing device to a processing device;

7. Direct one or more second pulses of electrons, each of which has 10 to 1000 electrons, toward the feature of the sample;

8. Capture a second portion of the one or more second pulses of electrons, which is associated with a second image of the feature of the sample during a second portion of time, using the sensing device during the second portion of time;

9. Transfer second information associated with the second portion of the one or more second pulses of electrons associated with the second image of the feature of the sample during the second portion of time from the sensing device to the processing device;

10. Process the first information using the processing device;

11. Process the second information using the processing device;

12. Output a first visual image associated with the feature for the first portion of time;

13. Output a second visual image associated with the feature for the second portion of time; and 14. Perform other steps, as desired.

The above sequence of steps provides methods according to an embodiment of the present invention. As shown, the method uses a combination of steps including a way of capturing multiple images of a feature at different time domains according to a specific embodiment. A combination of one or more ultrafast electron pulses leads to determination of temporal changes of the feature of the sample according to a specific embodiment. Many other methods and system are also included. Of course, other alternatives can also be provided where steps are added, one or more steps are removed, or one or more steps are provided in a different sequence without departing from the scope of the claims herein. Additionally, the various methods can be implemented using a computer code or codes in software, firmware, hardware, or any combination of these. Depending upon the embodiment, there can be other variations, modifications, and alternatives. Further details of the present method can be found throughout the present specification and more particularly below.

Figure 9A:
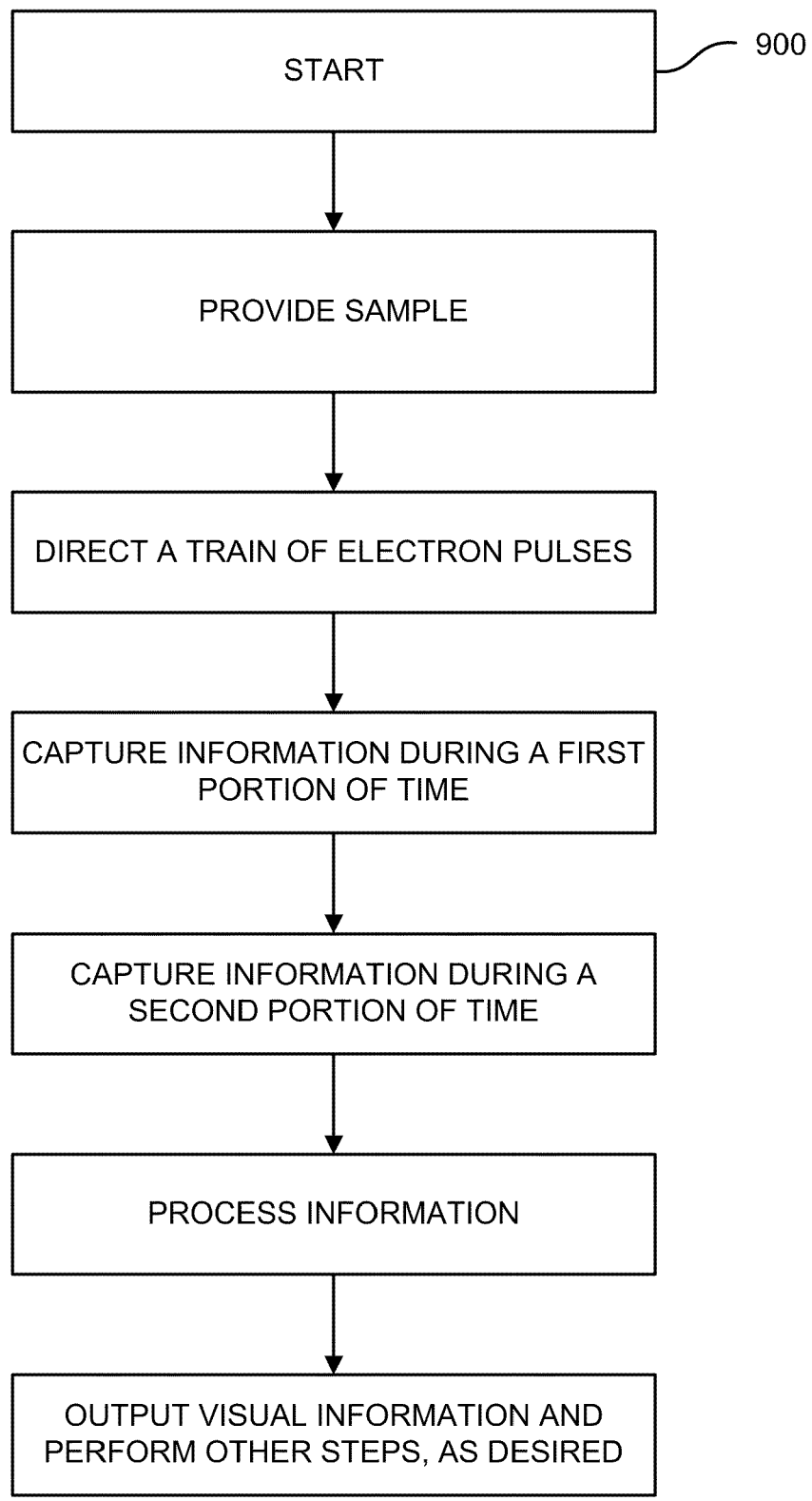
FIG. 9A is a simplified flow diagram of yet an alternative imaging method according to an embodiment of the present invention.

FIG. 9A is a simplified flow diagram 900 of yet an alternative imaging method according to an embodiment of the present invention. This diagram is merely an example, which should not unduly limit the scope of the claims herein. One of ordinary skill in the art would recognize many variations, modifications, and alternatives.

Although the above has been illustrated in terms of specific software and/or hardware features, it would be recognized that many variations, alternatives, and modifications can exist. For example, any of the hardware features can be further combined, or even separated. The features can also be implemented, in part, through software or a combination of hardware and software. The hardware and software can be further integrated or less integrated depending upon the application. Of course, one of ordinary skill in the art would recognize many other modifications, variations, and alternatives.

In yet an alternative specific embodiment, a method for capturing information from one or more samples using electron beam pulses is briefly described below.

1. Provide a feature of a sample to be imaged;
2. Place the sample onto a stage assembly;
3. Maintain the sample on the stage assembly in a vacuum environment;
4. Irradiate a cathode using one or more pulses of electromagnetic radiation;
5. Direct one or more pulses of electrons, each having about 10 to about 1000 electrons, toward the feature of the sample derived from the electromagnetic radiation;
6. Capture a portion of the one or more pulses of electrons, which is associated with a characterization of the feature of the sample, using a sensing device;
7. Transfer information associated with the portion of the one or more pulses of electrons associated with the characterization of the feature of the sample from the sensing device to a processing device;
8. Process the information;

9. Output one or more indications associated with the feature of the sample using at least the information associated with the portion of the one or more pulses of electrons associated with the image of the feature of the sample; and 10. Perform other steps, as desired.

The above sequence of steps provides methods according to an embodiment of the present invention. As shown, the method uses a combination of steps including a way of identifying a character of a feature of a sample using one or more pulses of electrons, which is used with a detection device, e.g., CCD array. Depending upon the embodiment, the present method can be used for imaging, diffraction, and other analysis techniques. Many other methods and system are also included. Of course, other alternatives can also be provided where steps are added, one or more steps are removed, or one or more steps are provided in a different sequence without departing from the scope of the claims herein. Additionally, the various methods can be implemented using a computer code or codes in software, firmware, hardware, or any combination of these. Depending upon the embodiment, there can be other variations, modifications, and alternatives. Further details of the present method can be found throughout the present specification and more particularly below.

Figure 9B:
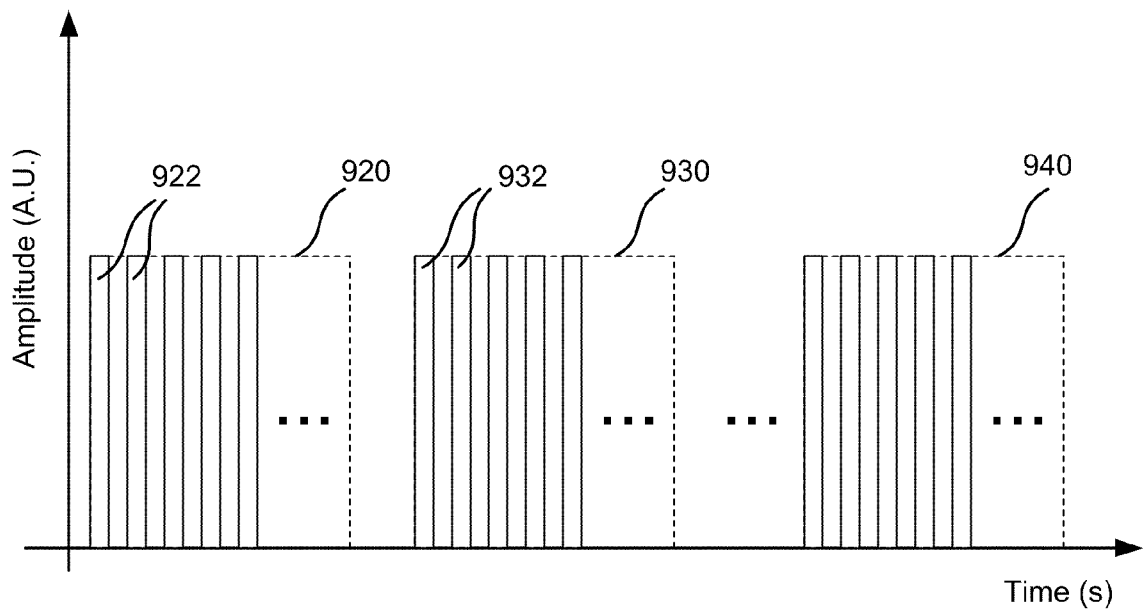
FIG. 9B is a simplified timing diagram illustrating pulse trains according to an embodiment of the present invention.

In some embodiments of the present invention, methods for determining temporal characteristics of one or more feature of objects using an electron microscope assembly are provided. Merely by way of example, a sample may be imaged at various times during a transition between multiple states. FIG. 9B is a simplified timing diagram illustrating pulse trains according to an embodiment of the present invention. During time period 920, a number of electron pulses 922 are provided as a pulse train. In a particular embodiment, the temporal width of each pulse is 100 fs and the delay between adjacent pulses is 12.5 ns. Additionally, each of the pulses are referenced to a baseline time, for example the arrival at the sample of separately provided initiating pulses. In one embodiment, sensing elements, for example, a CCD camera, are activated during time period 920 to acquire an image resulting from interaction of electrons in the pulse train with the sample. As an example, the unfolding of a protein is imaged using systems according to an embodiment of the present invention. The unfolding process is activated by a pump optical pulse. As described above, the timing between the pump and electron pulses is selected to provide for the collection of images at a given time during the unfolding process. As an example, the pulses 922 are delayed from the pump pulse by 100 ps in one embodiment. During the time between adjacent pulses, for example, 12.5 ns, the protein folds back to the steady state condition. Upon initiation by a subsequent pump pulse during time period 920, the unfolding process is repeated and an additional electron pulse interacts with the sample after the same delay time. In embodiments in which time period 920 is on the order of a second, millions of electron pulses with the same delay time interact with the sample, resulting in the collection of a first image. In some embodiments, the time period 920 is on the order of several seconds. One of ordinary skill in the art would recognize many variations, modifications, and alternatives.

A second time period 930 is illustrated in FIG. 9B. In another embodiment, the delay time between the initiating pulse and the pulses 932 is a second delay time, for example, 200 ps. In the embodiment illustrated in FIG. 9B, the process described above is repeated, acquiring an image of the unfolding process at a second time during the unfolding process, for example 200 ps. As illustrated, additional time periods 940 are provided in some embodiments, producing, in the combination, sequential, time-resolved images of the sample. In some embodiments, there are n additional time periods, with n being a predetermined number.

Figure 9C:
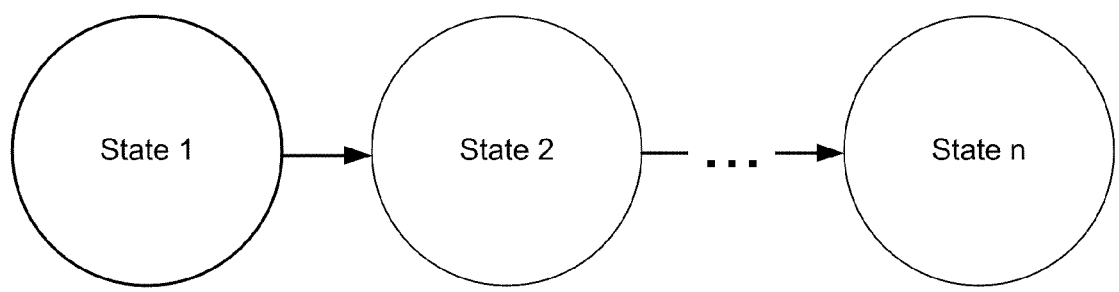
FIG. 9C is a simplified flowchart illustrating image collection according to one embodiment of the present invention.

FIG. 9C is a simplified flowchart illustrating image collection according to an embodiment of the present invention. In step 950, an image of a portion of a sample is acquired with the sample in state 1. In step 955, an additional image of a portion of a sample is acquired with the sample in state 2. In step 960, n additional images are acquired with the sample in n additional states. Using methods and systems according to the present invention, ultrafast electron pulses used in acquiring images are characterized by low-electron content. These electron pulses reduce pulse broadening in both time and space and provide low electron fluences, as is beneficial in minimizing damage during the imaging of biological samples. In embodiments of the present invention, the number of pulses included in each of the time periods is a predetermined number. Generally, the selection of the number of pulses balances the number of electrons desirable for imaging, the damage to the sample, the time required to collect the image, and the like.

Figure 10:
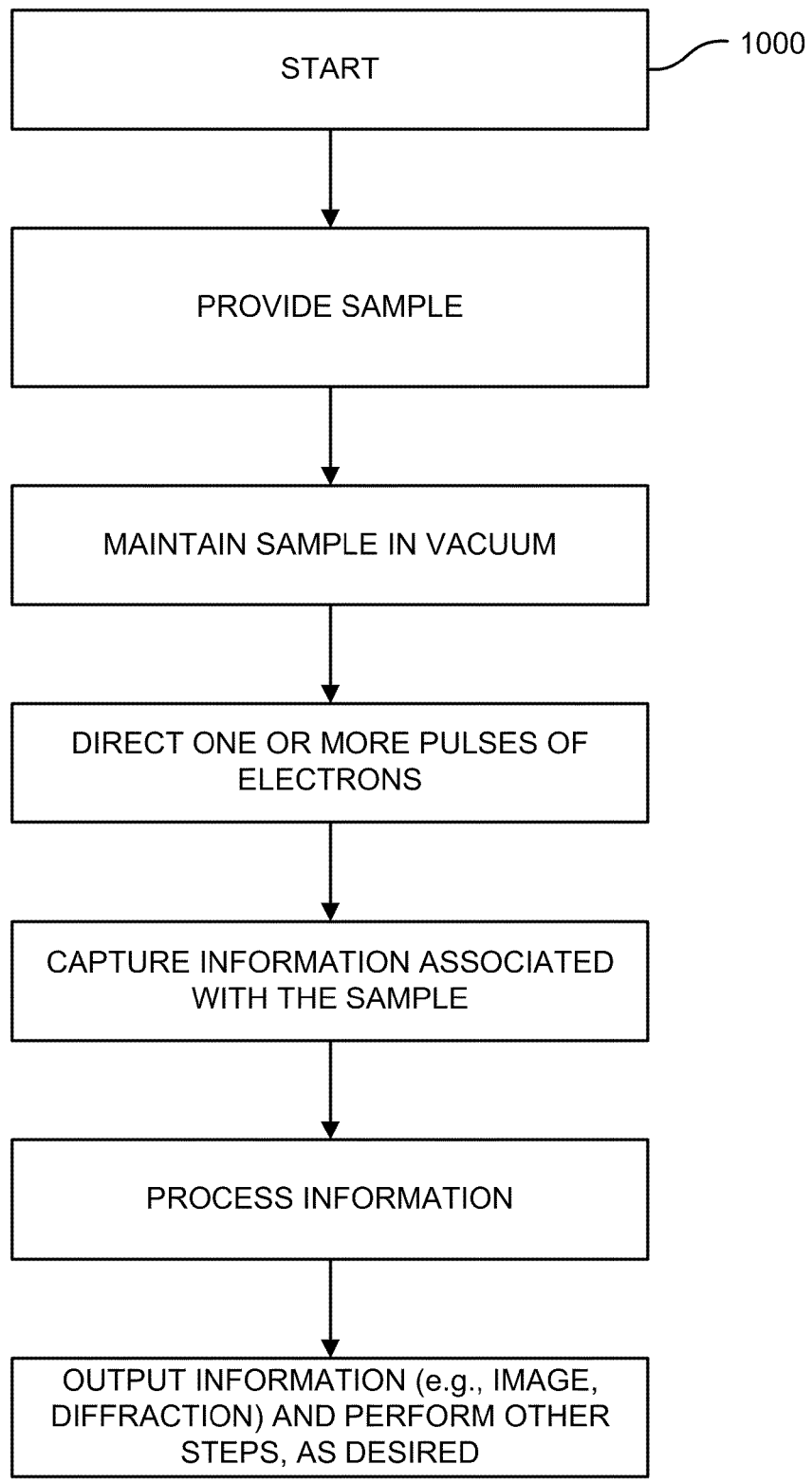
FIG. 10 is a simplified flow diagram of a still an alternative imaging method according to an embodiment of the present invention.

FIG. 10 is a simplified flow diagram 1000 of a still an alternative imaging method according to an embodiment of the present invention. This diagram is merely an example, which should not unduly limit the scope of the claims herein. One of ordinary skill in the art would recognize many variations, modifications, and alternatives.

Although the above method has been illustrated in terms of specific software and/or hardware features, it would be recognized that many variations, alternatives, and modifications can exist. For example, any of the hardware features can be further combined, or even separated. The features can also be implemented, in part, through software or a combination of hardware and software. The hardware and software can be further integrated or less integrated depending upon the application. Of course, one of ordinary skill in the art would recognize many other modifications, variations, and alternatives.

Although certain figures have been described in terms of a specific embodiment, one of ordinary skill in the art would recognize many variations, alternatives, and modifications. Of course, there can a variety of variations without departing from the scope of the claims herein.

To prove the principle and operation of the present invention, we performed experiments for certain applications of embodiments of the present invention. The present invention used the present ultra fast electron microscope system, which has been previously described. That is, the ultrafast system includes various parameters such as one or more ultrafast pulses of light to generate one or more ultrafast pulses of electrons according to a specific embodiment. Although these parameters have been used, there can be many other variations, modifications, and alternatives.

In a specific example, we have studied interfacial molecular assemblies at the nanometer scale, which is of importance to chemical and biological phenomena using the present methods and systems. For water, the directional molecular features of hydrogen bonding and the different structures possible, from amorphous to crystalline, make the interfacial collective assembly on the mesoscopic scale much less understood before our discoveries. Structurally, the nature of water on a substrate is determined by forces of orientation at the interface and by the net charge density, which establishes the hydrophilic or hydrophobic character of the substrate. However, the transformation from ordered to disordered structure and their coexistence critically depends on the time scales for the movements of atoms locally and at long range. Therefore, it is desirable to elucidate the nature of these structures and the time scales for their equilibration.

Figure 11:
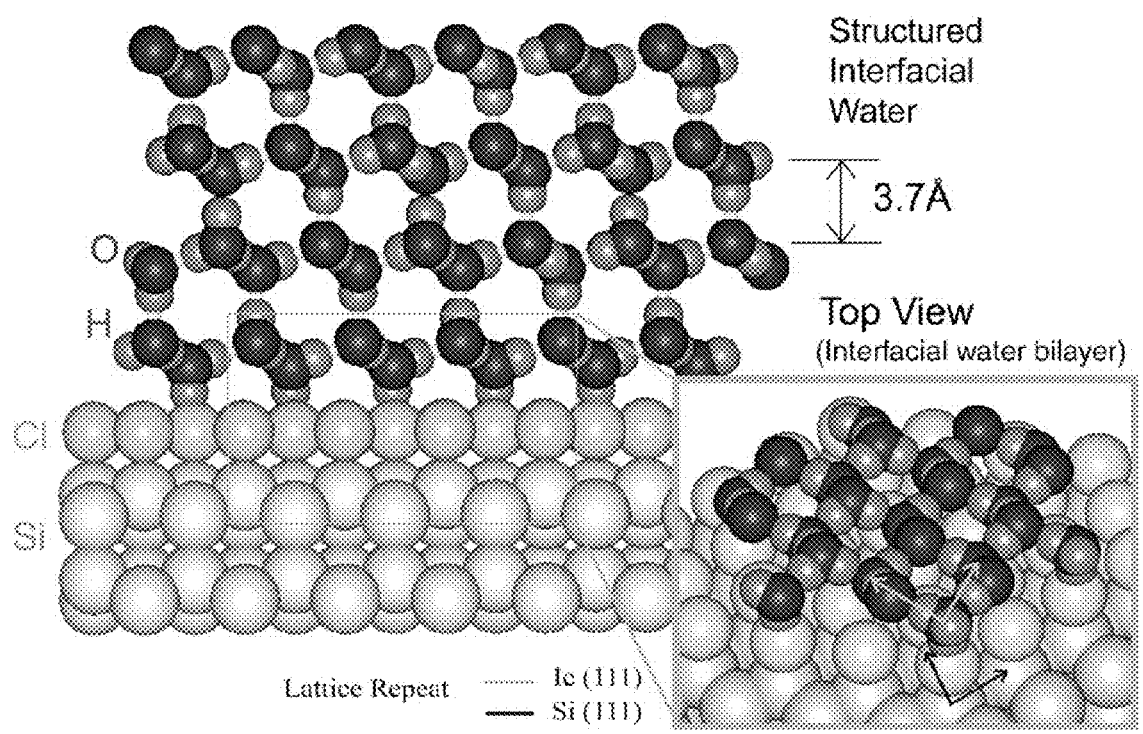
FIGS. 11 through 15 are simplified diagrams of experimental results according to embodiments of the present invention.

In an experiment performed using an embodiment of the present invention, we made a direct determination of the structures of interfacial water with atomic-scale resolution, using diffraction and the dynamics following ultrafast infrared (IR) laser-initiated temperature jump. Interfacial water is formed on a hydrophilic surface (silicon, chlorine-terminated) under controlled ultrahigh vacuum (UHV) conditions as illustrated in FIG. 11. With the atomic-scale spatial, temporal, and energy resolutions provided by embodiments of the present invention, the evolution of non-equilibrium structures was monitored, their ordered or disordered nature was established, and the time scale for the breakage of long-range bonding and formation of new structures was determined. As discussed below, we identified the structured and ordered interfacial water from the Bragg diffraction and the layered crystallite structure from the Debye-Scherrer rings. The temporal evolution of interfacial water and layered ice after the temperature jump was studied with submonolayer sensitivity. We compared these results with those obtained on hydrophobic surfaces, such as hydrogen-terminated silicon or silver substrate.

FIG. 11 illustrates the structure of water at the hydrophilic interface. As illustrated, the chlorine termination on a Si(111) substrate forms a hydrophilic layer that orients the water bilayer. The closest packing distance (4.43 Å) between oxygen atoms in the bottom layer of water is similar to the distance (4.50 Å) between the on-top and interstitial sites of the chlorine layer, resulting in specific bilayer orientations (±30°) with respect to the silicon substrate. This ordered stacking persists for three to four bilayers (~1 nm) before disorientation takes place and results in crystallite islands, forming the layered structure. As illustrated, the size of atoms is not to scale for the van der Waals radii.

Spectroscopic techniques, such as internal reflection and nonlinear (e.g., second-harmonic generation and sum-frequency generation (SFG)) optical methods, are sensitive to surface molecular changes. For example, the presence of polar ordering of ice films on a Pt(111) surface was shown to have a decay length of 30 monolayers, and transient SFG response from $D_2O$ ice crystals on a CO/Pt(111) surface has indicated the presence of melting and recrystallization without desorption. Here, structures were determined using diffraction with ultrafast time resolution, providing a spatial resolution of 0.01 Å. We can monitor the change on selective internuclear distances of the hydrogen bonding network, e.g., those of OH—O and O—O at 2.75 Å and 4.5 Å, respectively. Unlike previous studies on ultrafast surface restructuring and subnanosecond melting, we can probe supramolecular structural dynamics on surfaces and observe clear separation of the diffraction of the interfacial water from that of the substrate.

Using embodiments of the present invention, water was prepared on a single crystal Si(111) surface terminated chemically with chlorine atoms to make a hydrophilic interface. The crystal was mounted on a goniometer with an angular precision of 0.005° in a ultrahigh vacuum (UHV) environment. The crystal can be cooled to a temperature of 100K or other suitable temperature. The layer preparation on the surface generally requires characterization of the substrate by low-energy electron diffraction and Auger spectroscopy, as well as in situ monitoring of layer growth by reflective high energy electron diffraction. In our case, the electron flux (~1 $pA/mm^2$) was relatively small, so damage and charging of the molecular layers was reduced. The photon pulses produced by the femtosecond laser (typically ~1 mJ, 800 nm, and 120 fs at a 1 kHz repetition rate) were directed at a 30° angle into the scattering chamber and focused on the substrate to initiate the temperature jump.

A weaker beam was split from the photon pulse beam, frequency tripled in a specific embodiment, (~10 nJ at 266 nm), and focused onto a back-illuminated silver photocathode after an adjustable time delay to generate the electron pulses via the photoelectric effect. The electron pulses in this embodiment have a de Broglie wavelength λ=0.07 Å at 30 keV. A series of deflectors and apertures were used to guide the electron beam for an incidence to the surface of $\theta_i < 1°$, which is typically appropriate for high sensitivity on nanometer-scale surface assemblies. The arrival of the electron pulses was controlled to define a sequence of images that were recorded with a low-noise, image-intensified, charge-coupled device (CCD) camera assembly capable of single-electron detection.

We first characterized the diffraction of the Si substrate before dosing with water. By rotating the crystal, we obtained the rocking curves and the dependence of diffraction pattern on $\theta_i$. These diffraction patterns represent the intersection between Ewald's sphere and the reciprocal lattice defined by the substrate. Thus, the momentum transfer coordinates (s), defined by $s=4\pi/\lambda \cdot \sin \theta/2$, where the scattering angle, θ, can be mapped out for any given diffraction image at the incidence angle $\theta_i$, in situ zero-of-time was also determined using the substrate surface temperature jump. As interfacial ice was forming on the surface at 110 K, the diffraction images showed the transition from the Bragg spots of the substrate to the new spots and rings characteristic of water. After the substrate temperature jump, we used different sequencing of electron pulses in order to separately image evolving structures of water. This diffraction difference method allows for the isolation of the only transient structure involved because the reference time ($t_{ref}$) can be chosen before or after the arrival of the initiating pulse, or different times during the change.

Figure 12:
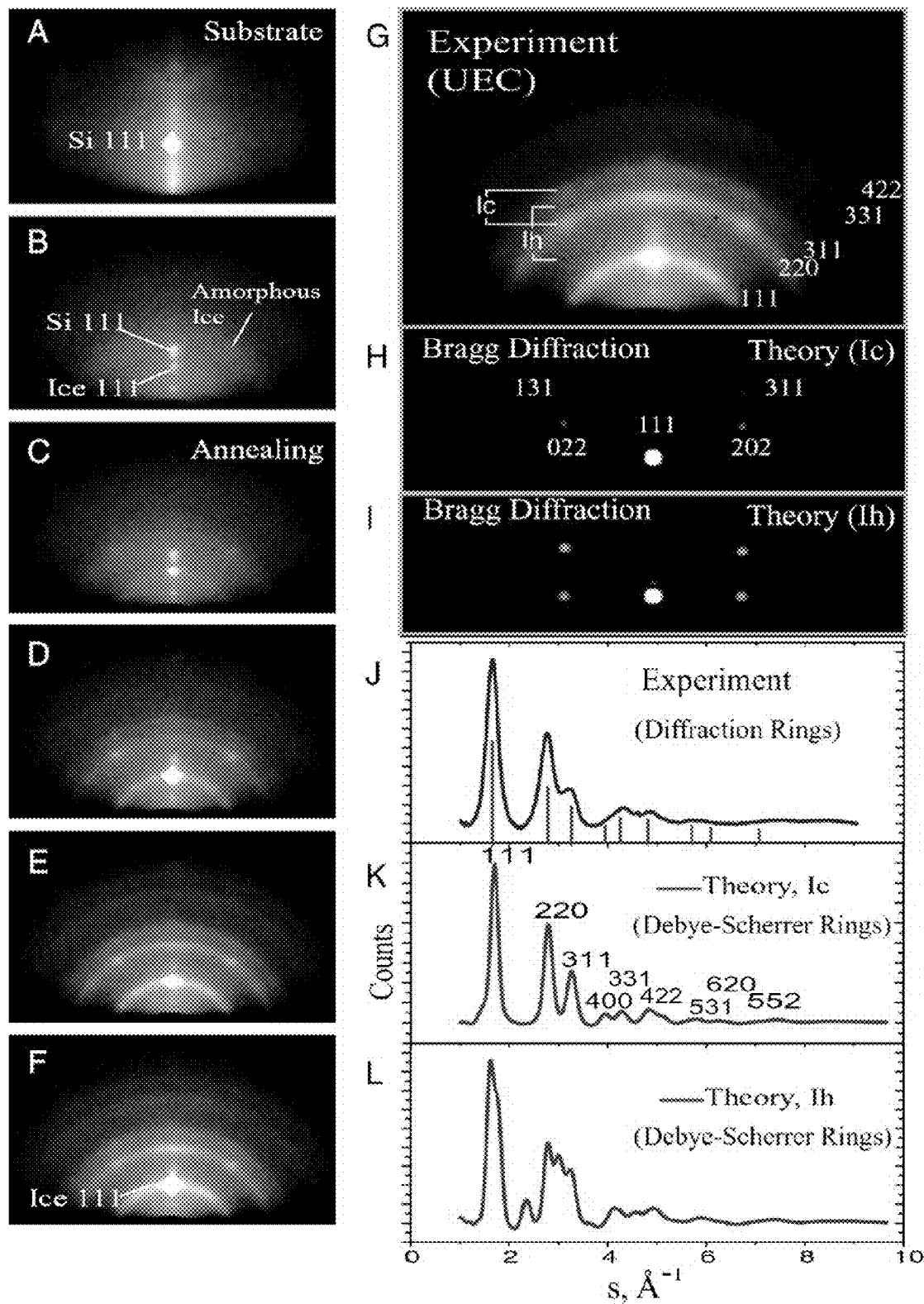

FIG. 12 shows the diffraction images obtained with ultrashort electron pulses, but without the initiating laser pulse (equivalent to $t_{ref}$ at negative time). The processes of in situ growth of ordered ice is illustrated through vapor deposition of water on a cold (110 K) silicon substrate is illustrated. The adsorption of water on the substrate is seen from the disappearance of 111 Bragg spot of silicon (see, for example, FIG. 12A) and the formation of 111 Bragg spot of crystalline ice, together with the diffraction rings of amorphous ice (see, for example, FIG. 12B). Annealing promotes the formation of long-range crystalline structure, as shown in the increase of the brightness of the spots and the sharpening of the rings (see, for example, FIGS. 12C and D). The structures stabilize as the diffraction shows nearly no change in the rings, spots, and streak (see, for example, FIGS. 12E and F). FIGS. 12G and 12I show experimentally observed diffraction and simulations of spots from a nanometer-thick substrate, orientated cubic (Ic) and hexagonal (Ih) structures. FIG. 12J shows experimental diffraction rings when radially averaged in s space produce one-dimensional diffraction intensity curves. FIGS. 12K and L show theoretical diffraction intensity curves, with the peaks identified with Bragg reflections. The clear distinction of different orderings and the early appearance of spots (not rings) in the annealing suggest heterogeneous layers on the surface with the crystallites layered by the ordered interfacial water. Moreover, the diffraction spots are sharp, which indicates that the interfacial water posses well-defined orientation; in contrast, the diffraction rings are circular, which is completely in agreement with randomly orientated crystallites.

As illustrated, the diffraction pattern is composed of rings, spots, and streaks. The disappearance of substrate diffraction and the appearance of surface water diffraction as monolayers of ice formed after annealing are evident. The observed Bragg spots indicate that water molecules are oriented by the substrate with a long-range order. The rings coincide with the spots in the reciprocal space (s space), and these rings indicate the emergence of crystallite structure: islands of ordered water, but disordered in orientation. The rings are sharp enough to define a crystallite that is not amorphous. The structural evolution of the interfacial water layers as a function of temperature was calibrated at near-equilibrium condition (temperature ramp, ~2°/min). We found that at this nanometer scale the crystallization of the initially deposited amorphous ice begins near 140 K and reaches the saturation at ~150 K with the highest degree of long-range order. The sublimation of the water layers occurs at 157±1 K. From both Bragg spots and the rings, we can determine the structure by comparing these diffraction images with those predicted by the symmetry of ice lattices.

The intensity of diffraction rings when plotted against s gives the corresponding peaks of Bragg reflections. The theoretical diffraction patterns for both cubic and hexagonal structures are shown in FIGS. 2K and L. These plots were obtained by summing the phases of a three-dimensional (3D) crystallite (a cell of a dimension of 5 nm in each direction) and averaging over all orientations. The peaks illustrated in FIG. 12J agree well with reflections from the 111, 220, and 311, etc., planes for cubic ice (see, for example, FIG. 12K), which is a dominant structure [for comparison, see hexagonal ice diffraction (see, for example, FIG. 12L)]. From the s values in FIG. 12J, we determined the interplanar distances to be 3.80±0.23 Å, 2.27±0.15 Å, and 1.93±0.07 Å for the (111), (220), and (311) planes, respectively, consistent with reported powder diffractions of cubic structure. The uncertainties are governed by the observed width of the diffraction peaks.

The surface-oriented water is a well-defined crystalline structure (i.e., epitaxially grown from the substrate), and this structure is responsible for the sharp Bragg spots. We reproduced theoretically the position and relative intensities of Bragg spots as illustrated in FIG. 12H by summing phases of long-range ordered interfacial water (10 nm by 10 nm wide; 1.5-nm-thick layer). For this hydrophilic substrate, we found that the closest packing distance between oxygen atoms in the bottom layer of water (4.5 Å) is similar to that between on-top and interstitial sites (4.43 Å) of the chlorine layer. This makes possible the long-range packing of the water bilayer on the surface and leads to the unique 30° rotations with respect to the substrate layer. Thus the two-dimensional (2D) surface unit cell of water can be described as a superlattice as illustrated. This assignment was derived directly from the symmetries and positions of Bragg spots of the substrate and those of water. Inspection of the Bragg spots of ice identifies the two domains (±30° rotations) in the satellites of the main Bragg (i.e., 111) peak; one set is formed by 022, 111, 311; the other is by 202, 111, 131 (see FIG. 12H). Water interacts with the substrate at two sites, likely through its oxygen in the interstitial site with $sp^3$ hybridized orbitals overlapping with three chlorine atoms, or through hydrogen sitting on top of the chlorine atom.

From the diffraction results, we established that water is structured on the hydrophilic surface mainly as cubic (see the comparison between theory for orientated cubic (Ic) and orientated hexagonal (Ih), and the experiment as illustrated] and is different from structures (hexagonal) found on Pt(111) substrate. Our theoretical modeling of the position of the 111 Bragg spot gives an interlayer spacing of 3.66±0.26 Å, entirely consistent with the value obtained from the rings (3.80±0.23 Å). The apparent brightness and width of Bragg spots are an inherent reflection of the size of interferences, and from them we obtained a thickness of nanometer scale, which is also consistent with theory.

Figure 13:
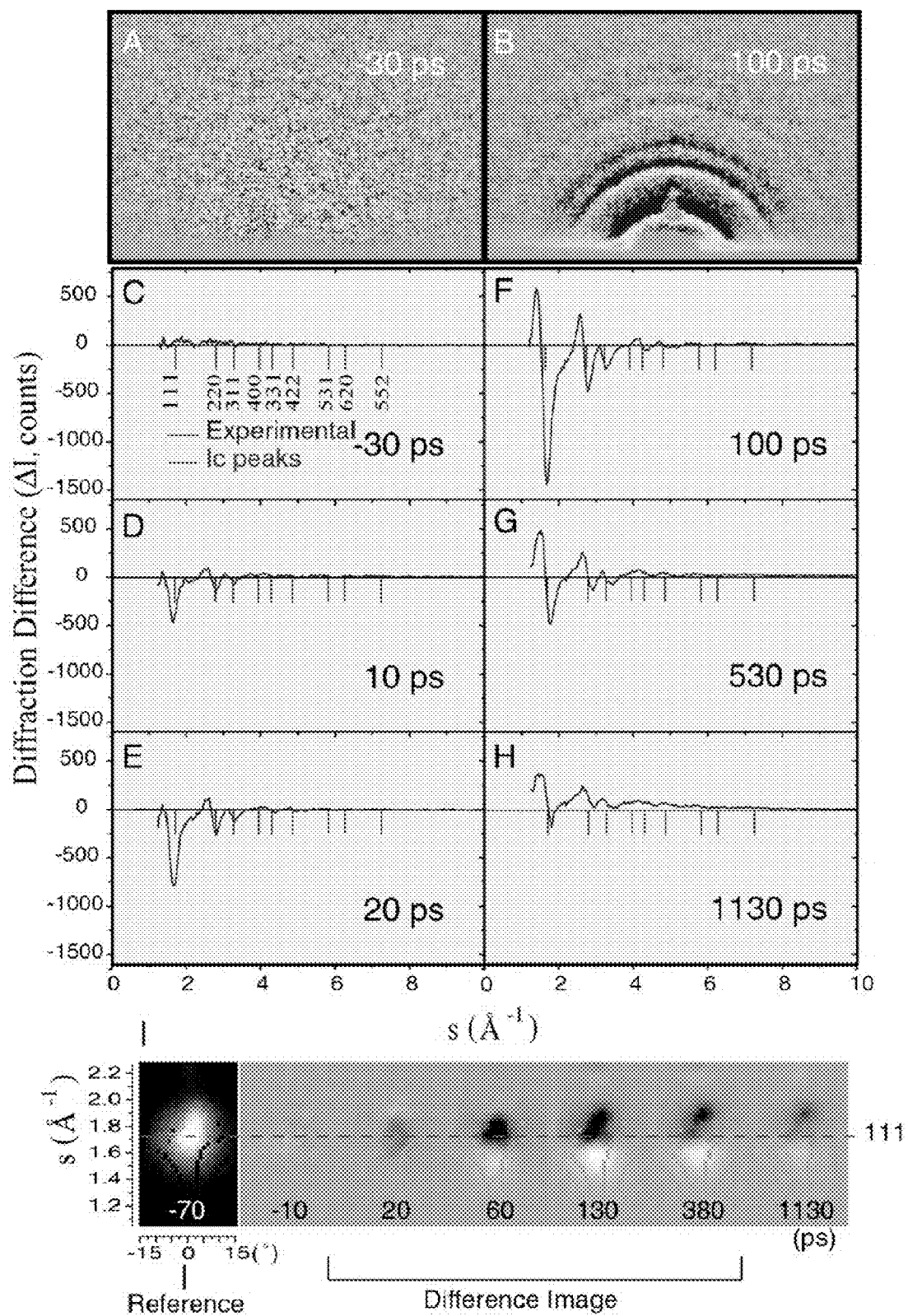

FIG. 13 shows data collected in an experiment performed using an embodiment of the present invention. In FIGS. 13A and B, diffraction difference images at negative (−30 ps) and positive (100 ps) times are illustrated. The $t_{ref}$ is at −70 ps in FIGS. 13C to H. The radially averaged diffraction difference intensity curves at several delay times ((C) −30 ps, (D) 10 ps, (E) 20 ps, (F) 100 ps, (G) 530 ps, (H) 1130 ps) show the structural dynamics for layered crystallites at substrate energy fluence of 22 mJ/cm$^2$. Note the depletion (negative difference) and the increase (positive difference) at well defined s values. FIG. 13I shows the diffraction difference images for the 111 Bragg spot. The vertical axis is s in the reciprocal space, and the horizontal axis is the azimuthal scattering angle.

For the dynamics of the system, we followed the diffraction as a function of time after the temperature jump of the substrate as illustrated in FIG. 13. When $t_{ref}$ is at negative time (−70 ps), the image at −30 ps (referenced to the −70 ps, see FIG. 13A) shows no diffraction difference intensity, as expected. At positive time as illustrated in FIGS. 13B and 13I, both the Bragg spots and rings emerge, but with striking structural changes (note the displacement of rings and spots). The different panels display the evolution with clear indication of the disappearance of the "old" structure and the appearance of a "new" structure. However, the behavior is similar in appearance to that of a "phase transition": at short times (10 ps (FIG. 13D) and 20 ps (FIG. 13E)], we observed depletion of old structure, whereas at intermediate times (FIGS. 13F and 13G), there appeared a region of coexistence of disordered and crystal-like water. At very long time (FIG. 13H), the system reverted to the original structure, but with some difference in bond distances. It should be noted that in a separate cryocooling experiment, we changed the substrate temperature by ramping at near-thermodynamic equilibrium condition, just below sublimation temperature (157 K), and found the ice structure to be in agreement with those obtained after restructuring at long times. This behavior for the crystallites away from the surface (rings) contrasts that of the structured, crystal-like water on the surface (spots). FIG. 13I shows the evolution of one spot with time that exhibits the same trend—depletion and restructuring—but the dynamics are very different.

Figure 14:
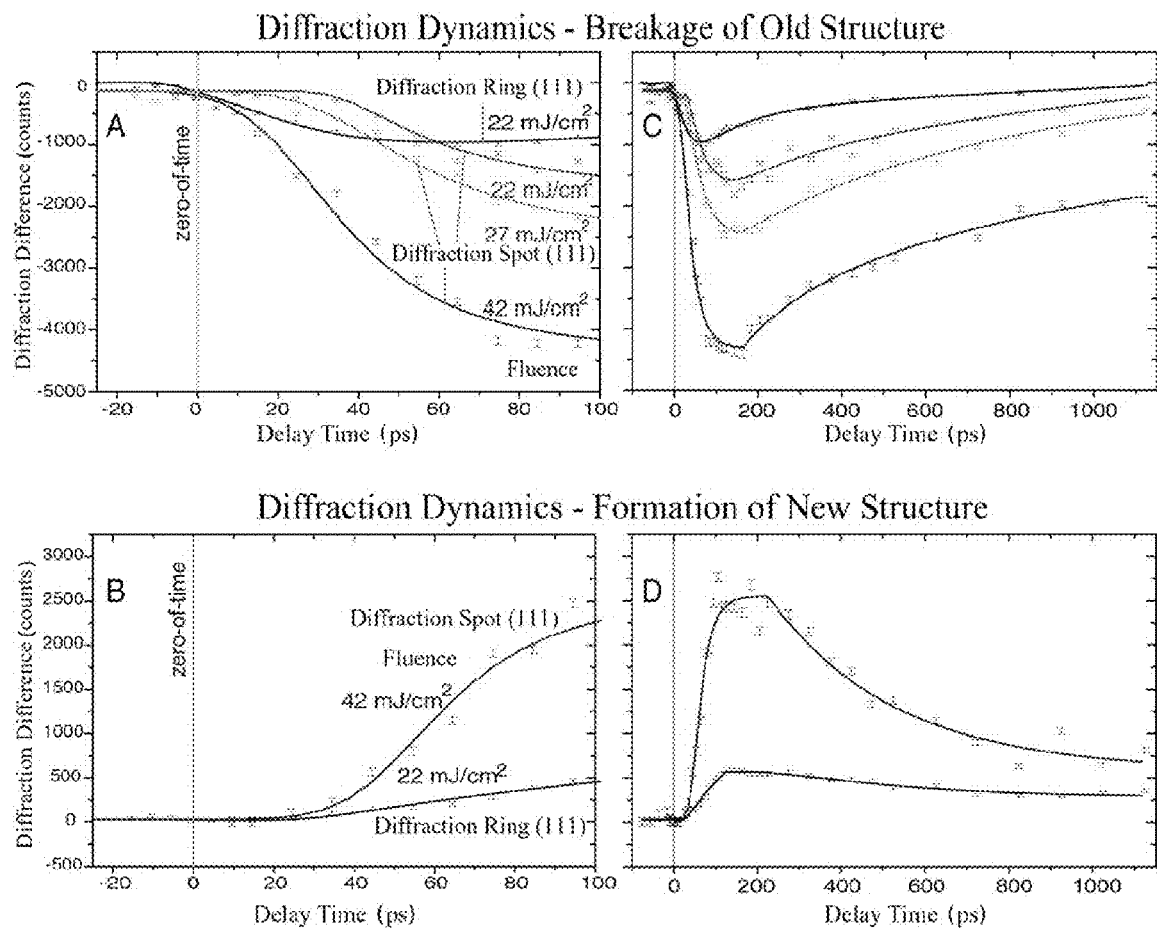

FIG. 14 illustrates the temporal evolution of diffraction gated in the 111 reflection region. As shown in FIG. 14A, the early-time (≦100 ps) depletion of old 111 diffraction spot and ring at several energy fluences. In FIG. 14B, the formation of new 111 diffraction spot and ring, also at early times. Note the apparent delays with respect to the zero-of-time, which is independently determined with uncertainty of 3 ps. The corresponding changes at longer times are shown in FIGS. 14C and 14D.

By examining the rate of change at different temperatures, which is controlled by changing the fluence of the heating pulse of the substrate, we found, as illustrated in FIG. 14, that gating in the 111 reflection region shows a depletion of the old peak (see FIGS. 14A and 14C) and a corresponding buildup (see FIGS. 14B and 14D) of a new peak. This behavior mirrors the breakage of old bonds (by melting) and the formation of a new structure. The melting of the layered crystallites follows the laser excitation at the substrate surface within 5 ps. In contrast, from the same data, images gated on the 111 Bragg spot had a delay time of 36±3 ps for interfacial water at the same energy fluence (22 mJ/cm$^2$). Because water does not absorb light directly at 800 nm, the relatively prompt response of layered crystallites signifies the high efficiency of heating by nondiffusive vibrational couplings on this ultrashort time scale; if diffusional, the layered ice should melt after the interfacial one. As the fluence increases, the delay decreased for interfacial water, but the time constants for depletion remained similar at 37±5 ps. The results suggest the presence of a higher energy (friction) barrier for the structured water caused by the long-range order and dipolar orientation force of the hydrophilic substrate.

These observations indicate that at the highest temperature of the substrate (fluence, 42 mJ/cm$^2$), the interfacial water continues to lose long-range order and that only when the maximum change is reached will restructuring begin as illustrated in FIGS. 14A and 14B. However, near the maximum change, the new structure begins to form in the region of coexistence, followed by restructuring (see FIGS. 14C and 14D). In the restructuring at long times, the dissipation of energy (cooling) occurs through redistribution and heat diffusion. In this regime, from the solution of the heat diffusion equation, we estimate a surface temperature of ~150 K at 1 ns; the temperature at maximum change is ~370 K. Over the entire time scale of structural change, thermal desorption was found to be insignificant because we observed the recovery of diffraction rings and spots back to nearly their original intensities, as shown in FIG. 14A from the constancy of the baselines at negative times for all fluences. The lack of effective desorption, as also found for ice on CO/Pt surface, reflects the difference between desorption at near-equilibrium or far-from-equilibrium temperatures. The appearance of the plateau region at the higher fluence (42 mJ/cm$^2$) for the depletion of old structure and the making of new structure, as well as the coexistence of old and new structures, suggests the involvement of collective modes in restructuring, analogous to phase transitions.

Figure 15:
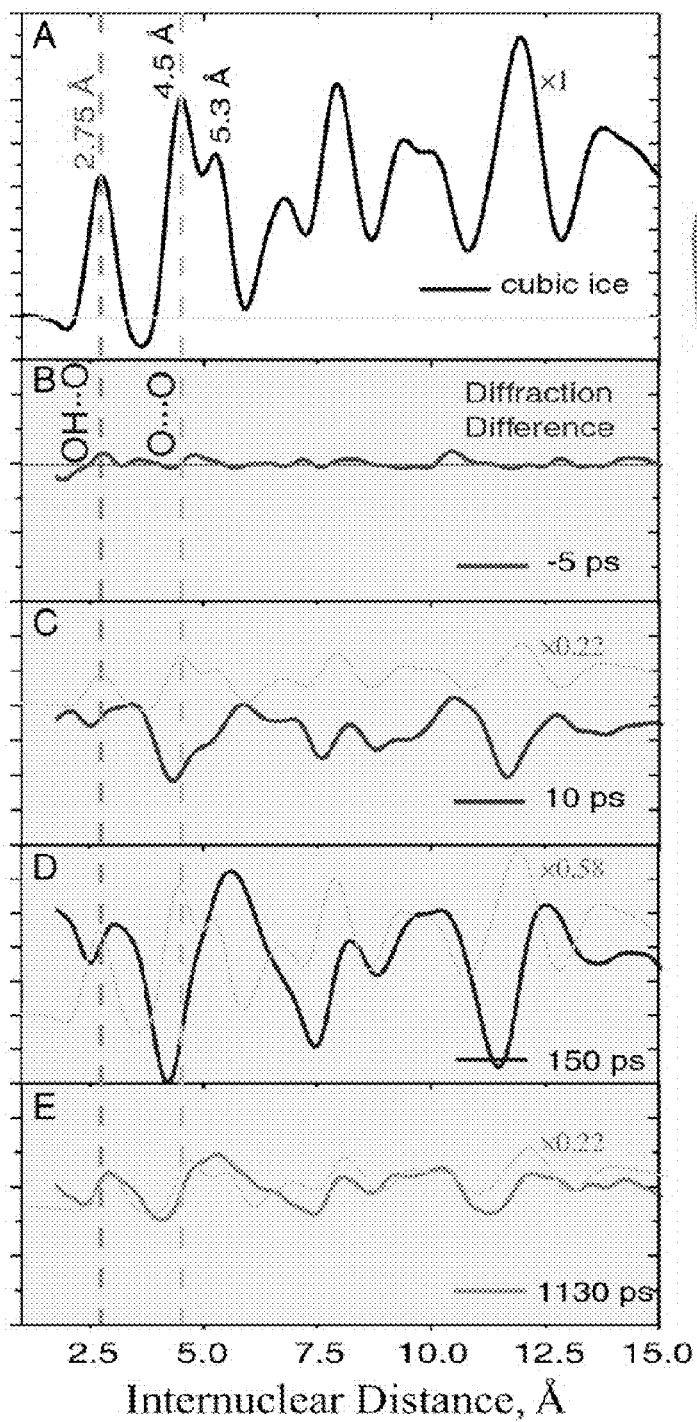
Figure 15:
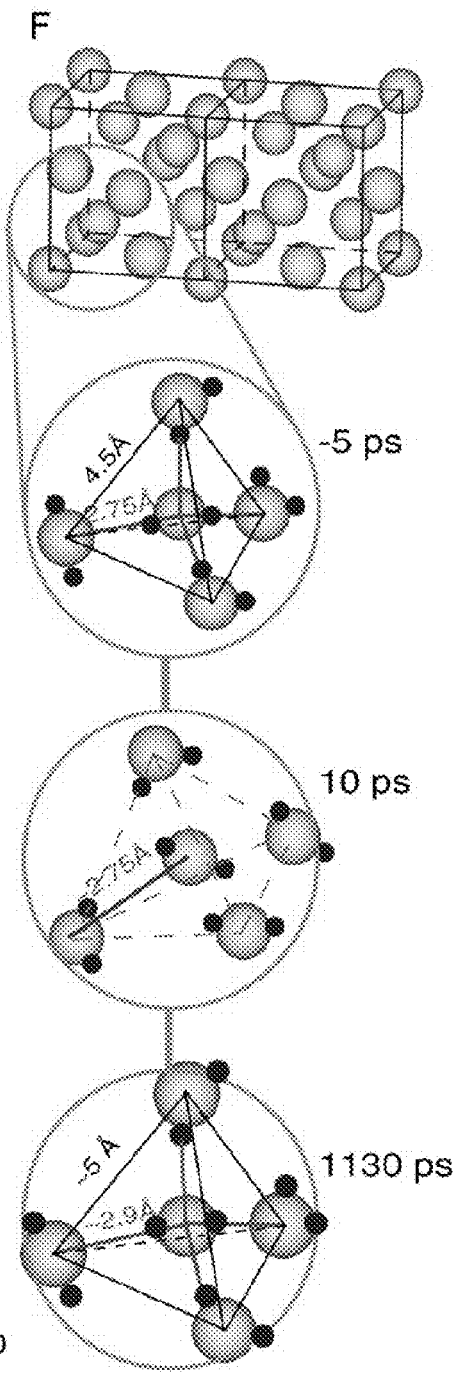

FIG. 15 illustrates the radial distribution function (RDF) for Ic is shown with the internuclear distance density. The local distances at 2.75 Å (OH—O) and 4.5 Å (O—O) in a diamond tetrahedron unit are marked for the comparison with data (FIG. 15B to E). The experimental difference RDF curves were obtained by sine transform from the corresponding difference intensity curves (see FIG. 13). Changes of distance densities are evident at the three positive times, whereas no change is observed at negative time. The light gray curve in the panels is the Ic curve, scaled and superimposed for comparison. The change in the RDF clearly shows the depletion of the old structure and formation of the new structure (as in FIG. 13) but here identifies the bonds involved. In FIG. 15F, the corresponding structural changes at −5, +10, and +1130 ps as illustrated.

In supramolecular systems, such as the one discussed here, the local structures within a unit cell, in addition to the long-range order, can be examined by inverting (Fourier transform) the diffraction curves to the real space. FIG. 15A to E illustrates such obtained radial distribution functions [f(r)] reveal the densities of internuclear distances. For cubic ice, the second nearest O—O distance (4.50 Å) correlates with the hydrogen bond OH—O distance (2.75 Å) in a diamond tetrahedron. The temporal changes of the density of these two distances thus provide the dynamics at the local molecular level of the restructuring of the hydrogen bond network. At negative time (−5 ps, see FIG. 15B), no change of density is observed, as expected. At 10 ps (FIG. 15C), depletion of O—O peak is observed, although the change for the OH—O peak is insignificant. This depletion indicates the rupture of the network (to amorphous) in 10 ps. At 150 ps delay (FIG.

15D), significant but shifted depletions coexist with emerging new distances. At the longest delay, 1130 ps (FIG. 15E), the original cubic-like structure is recovered, as evidenced in the reduction in the diffraction difference, but the new structure is still slightly "hot" due to slow rate of diffusion (ns to μs). For such structures, we determined the interplanar distances of 4.22±0.37 Å (111 plane), 2.42±0.20 Å (220 plane), and 1.97±0.05 Å (311 plane). A structural picture of local molecular changes is depicted in FIG. 15F.

Interfacial water on the hydrophilic surface substrate has distinctive structures and dynamics compared with those of water layers on hydrophobic surfaces. The time scale for the breakage of long-range order of the interfacial layer (37 ps) is an order of magnitude longer than that for breaking hydrogen bonds in bulk liquid water, and the local OH—O and O—O bond distances from diffraction are directly involved in the change. These results suggest that the time scale for energy flow in the assembled water structure is much shorter than that of energy localization for desorption of individual molecules. It should be noted that the maximum transient temperature is 370 K; the equilibrium desorption temperature is 157 K. Moreover, the restructuring time involving long-range order is longer than the time for amorphization, a process in which the O—O correlation is lost before the OH—O correlation. Perhaps it is not accidental that the time scale for losing the hydrogen bond network (37 ps) is similar to that reported for interfacial water near hydrophilic protein surfaces (20 to 50 ps) and is very different from that of bulk water (700 fs-1.5 ps). In separate experiments, we also studied hydrophobic surfaces, such as hydrogen-terminated and silver-coated silicon substrates, and found that interfacial ordering has changed into a distribution around the (110) orientation for the former and is absent for the latter substrate.

Therefore utilizing embodiments of the present invention, it is possible, with unprecedented resolutions and sensitivity, to study nanometer-scale supramolecular structures, along with those of amorphous and crystalline solids. This demonstrates the diverse applications available using embodiments of the present invention, in particular for the probing of interfaces and surfaces with atomic-scale resolution. Of course, these results are merely examples, which should not unduly limit the scope of the claims herein. One of ordinary skill in the art would recognize many variations, modifications, and alternatives.

In another experiment, we demonstrated the potential of methods and systems according to the present invention for the direct determination of surface structural dynamics of crystalline solids (GaAs), following impulsive femtosecond laser excitation. From the change of Bragg diffraction (shift, width, and intensity), we show in the discussion that follows, by direct inversion of the diffraction data, that compression and expansion of the atoms occur on the −0.01 Å to +0.02 Å scale, respectively, and that the transient temperature reaches its maximum value (1565 K) in 7 ps. The onset of structural change lags behind the rise in the temperature, demonstrating the evolution of non-equilibrium structures. These structural dynamics results are compared with those of nonthermal femtosecond optical probing, and the agreement for the temperature response from the fluence dependence of the dielectric function is impressive. The success in the direct observation of surface (monolayers) structural dynamics with combined ultrafast temporal and atomic-scale spatial resolutions promises many new applications for embodiments of the present invention.

GaAs is an ideal system to demonstrate this potential of embodiments of the present invention for surface studies, especially as its crystalline and semiconducting properties are well-quantified. This has allowed a wide range of ultrafast optical experiments that vary from the probing of carrier properties to electronic disordering or change in symmetry. In addition to these optical studies, recent ultrafast X-ray experiments on GaAs revealed bulk lattice dynamics following femtosecond laser excitation. However, these ultrafast X-ray experiments could not probe the surface owing to the large penetration depth into the crystal by X-rays, typically up to several μm. On the other hand, optical techniques that probed the surface on the scale of a few nanometers could not directly determine the structure with atomic-scale resolution, but gave valuable information on the response of the dielectric function and lattice disordering. The large scattering cross-section of electrons combined with ultrafast time resolution allows the bridging of this gap in addressing the dynamics of surface structures in real time.

The experiments described below were performed using the systems illustrated, for example, in FIG. 1. Under ultrahigh vacuum (typically $10^{-10}$ Torr), and following surface characterization by low-energy electron diffraction and Auger spectroscopy, the sample was brought to the scattering position where beams of the laser-pulse excitation and electron-pulse probe intersected in space, with an adjustable time delay $\Delta t$ (the zero of time was determined in situ utilized methods described above). In some embodiments of the present invention, the chamber includes sputtering and cleaning tools. We terminated semiinsulating GaAs (111) crystals by a monolayer of chlorine with a Cl atom atop each Ga atom, saturating the otherwise dangling bond of Ga. The surface retained its integrity throughout the experiments, as evidenced by the unchanged quality of the diffraction patterns (symmetry, spot profiles, and intensities), as described more fully below. The crystal, placed on a goniometer with three degrees of freedom in translation and two axes of rotation, was positioned in space with a precision of 0.01° in rotation, and of 10 μm in translation. The experiments were carried out at room temperature.

Figure 16:
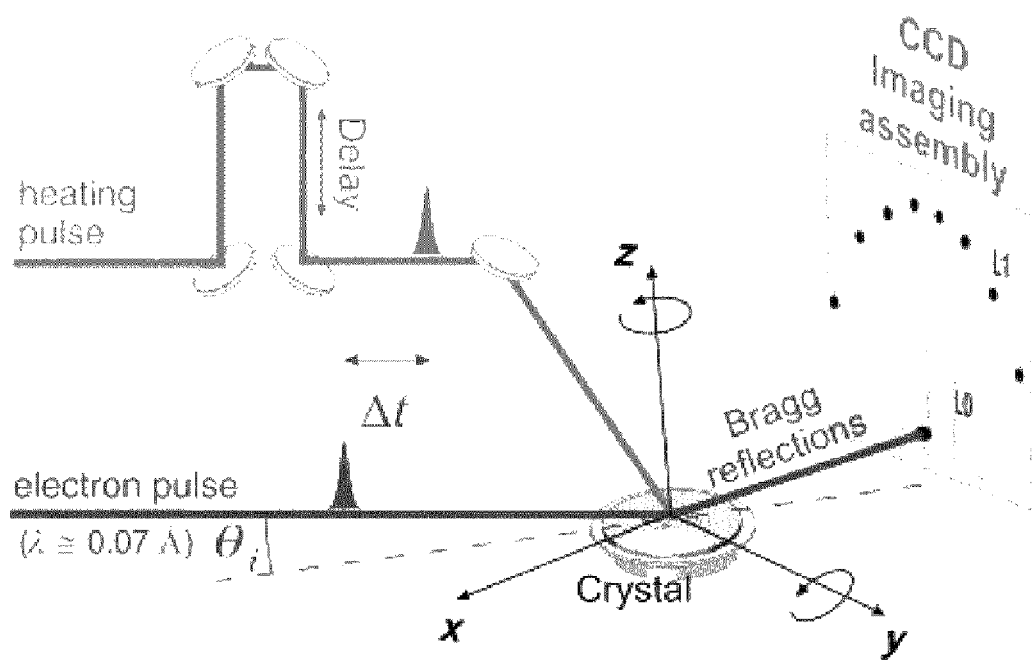
FIG. 16 is a simplified diagram of an experimental method according to an alternative embodiment of the present invention.
Figure 16:
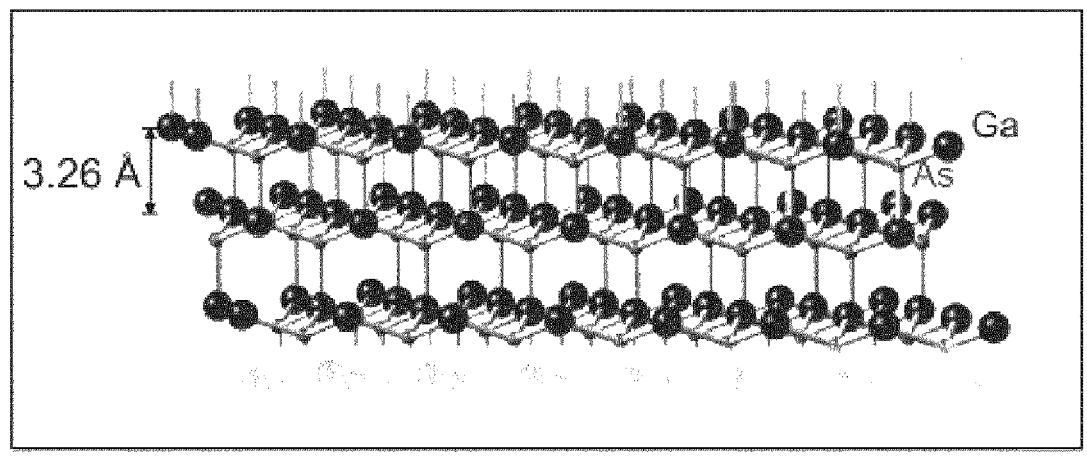

FIG. 16 is a conceptual diagram illustrating an embodiment of the present invention and the structure of the chlorine-terminated GaAs (111) crystal. The output of a Ti:Sapphire femtosecond amplifier (120 fs, 800 nm, 2 mJ, 1 kHz) was frequency tripled to yield a beam at 266 nm (400 pJ, <300 fs, 1 kHz). This UV beam was brought to the scattering chamber to provide the initial heating pulse at t=0. A very small fraction of this beam was directed synchronously onto a back-illuminated Ag photocathode to generate the electron pulses. These electron pulses, after acceleration and focusing, were guided to the crystal, where they overlapped in space and time (delay $\Delta t$) with the heating pulse. Although electron pulses were made as short as 500 fs, in this grazing incidence, the spatial extent decreases this resolution to tens of ps. However, because of the sensitivity achieved (20 s per frame), we were able to reduce the experimental temporal cross-correlation to 7 ps; with convolution and at the level of signal reported herein, we readily obtained a 1-2 ps response. This was made possible by reducing the spatial extent of the substrate to 400 μm by masking techniques, resulting in a transit time of 4 ps. The sample, placed on a high-precision five-axis goniometer, was positioned to allow the electron beam to impinge at the chosen incidence angle ($\theta_i$<5°), azimuthally along the <112> direction. In the Figure, L0 and L1 refer to the zero-order and first-order Laue zones. The resulting diffraction patterns were recorded in the far field by an imaging CCD camera system. In the inset to FIG. 16, the structure of the crystal is shown, with the bilayer spacing of 3.26 Å.

Femtosecond laser heating at t=0 initiated the dynamics, which were subsequently probed by an ultrashort packet of electrons of 30 keV ($\lambda_{deBroglie} \approx 0.07$ Å). The electrons impinged the surface at a small incidence angle ($\theta_i \approx 1°$) and at this grazing incidence, reflection high-energy electron-diffraction methods are uniquely suited and have been used for studies of superheating with a temporal resolution of $\approx 100$ ps. The electron pulses were generated by a modified Williamson-Mourou streak camera arrangement. In the system utilized for this experiment, we obtained pulses of duration as short as $\approx 500$ fs, but for the grazing geometry of the experiment, the temporal cross-correlation was 7 ps. By controlling the arrival of the electron pulse ($\Delta t$ in FIG. 16), we can probe the structure prior to or following the heating pulse excitation. Structural changes were followed in real time by monitoring the Bragg reflections and rocking curves, as recorded by a CCD (charge-coupled device) imaging assembly capable of single electron detection. Three features of the diffraction were followed as a function of time: the Bragg peak shift, width, and intensity.

Figure 17:
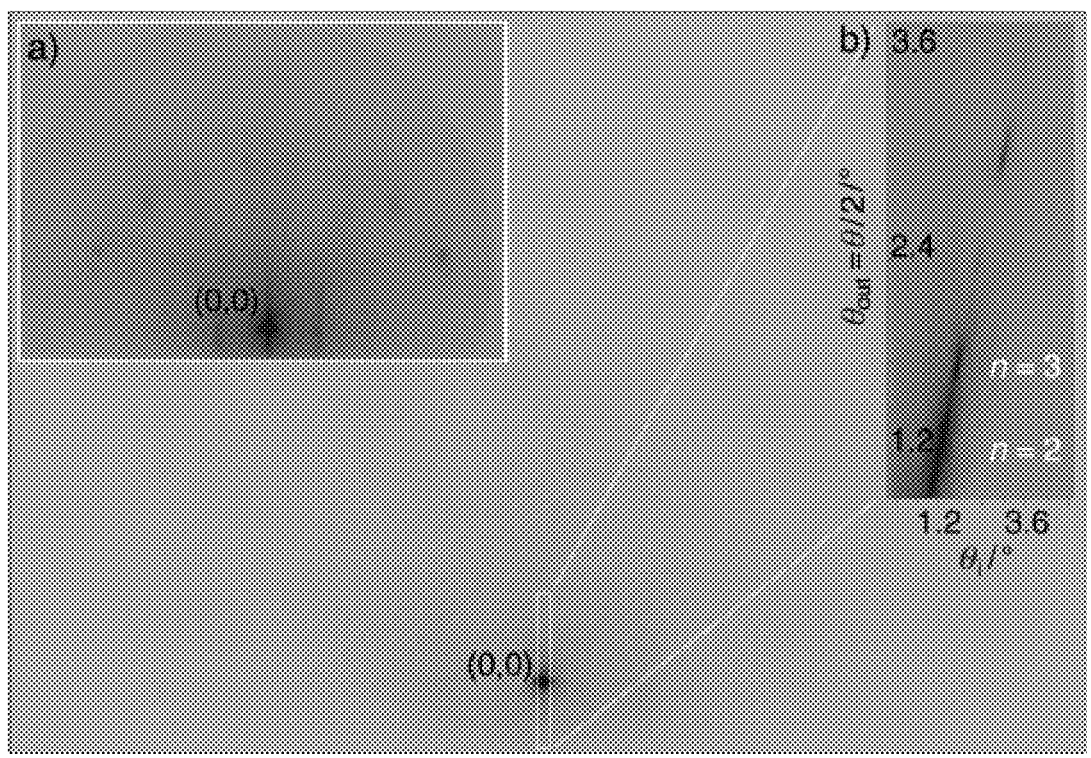
FIGS. 17 through 19 are simplified diagrams of experimental results according to alternative embodiments of the present invention.

FIGS. 17 (A and B) illustrates static diffraction images of the crystal (111) surface obtained by the ultrashort electron pulses without time resolution. In FIG. 17A (reference letter a), a diffraction image showing the intense (0,0) in-phase reflection, together with the streaks and spots in the Laue zones is illustrated. FIG. 17B (reference letter b) illustrates an experimental rocking curve for the (0,0) reflection-(111) lattice planes. As one of skill in the art will appreciate, the periodicity allows the unequivocal identification of the Bragg reflections and gives the interlayer spacing.

FIGS. 17 (A and B) presents a typical static diffraction image, which displays the very strong (0,0) and other Bragg reflections. FIG. 17A shows a diffraction pattern, for which the incidence angle was tuned to reveal higher-order diffraction peaks, as well as diffraction streaks in the zero-order Laue zone. These and similar data allow the precise determination of the camera distance from the scattering position (170±1 mm), by direct inversion of the angular separation between the streaks at low angles, or from the Bragg spots in the higher Laue zones. This inversion is direct because the lattice rods are separated in reciprocal space by an in-plane inverse distance of 3.14 Å$^{-1}$ along the intersection with the Ewald sphere of radius $2\pi\lambda^{-1}=90$ Å$^{-1}$. By gating the detection on the (0,0) Bragg spot and following the diffraction position as a function of the incidence angle, we also obtained the experimental rocking curve, which gives the GaAs lattice periodicity along the (111) direction (n=1, 2, . . . ). This is shown in FIG. 17B, where the incidence angle was varied over several degrees. The experimental periodicity in $\theta_i$ of 0.60°±0.02° is in quantitative agreement with the expected value of 0.61° obtained for the lattice bilayer spacing of 3.26 Å.

Figure 18:
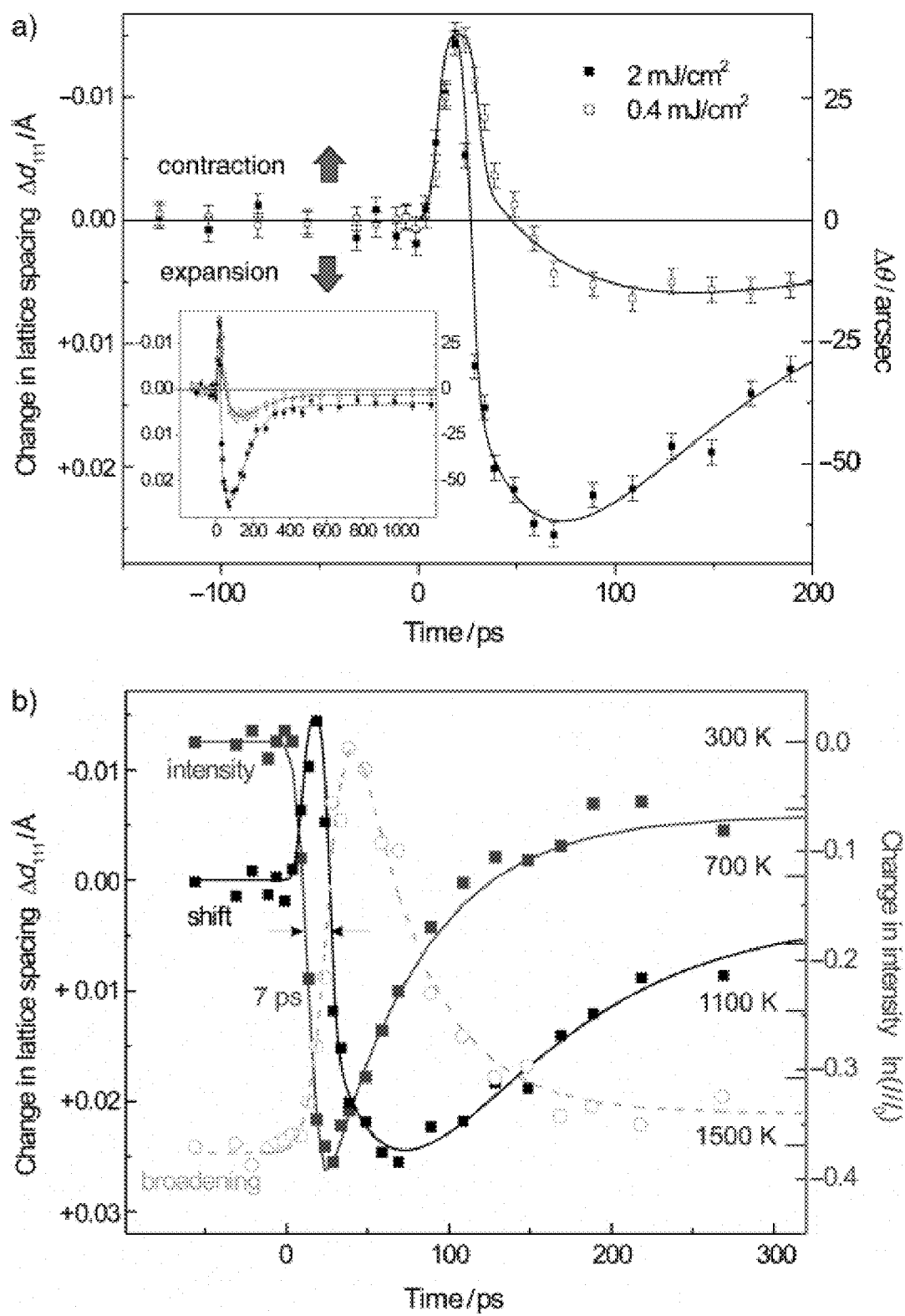

FIG. 18 shows the time dependence of the Bragg reflection center position, intensity, and width, following the laser heating excitation at t=0. In FIG. 18A, the center position of the Bragg spot as a function of time and fluence is plotted. The vertical axis on the right gives the angular deviation and the left axis shows the corresponding change in lattice spacing, perpendicular to the (111) surface plane. A contraction takes place at early times ($\Delta d<0$), followed by lattice expansion ($\Delta d>0$). The inset in FIG. 18 shows the evolution at a long time. In FIG. 18B, a comparison of the integrated intensity of the Bragg spot (temperature) with the change in lattice spacing for the data set obtained at 2 mJ cm$^{-2}$ is illustrated. The right axis gives the ratio of the time-dependent integrated intensity of the Bragg spot (I) to its counterpart at negative delay ($I_o$) on a logarithmic scale, from which the temperature scale is obtained. The lattice expansion is also shown with its scale on the left axis, together with the broadening of the Bragg spot, depicted by the dashed line. The apparent delay between the temperature rise and the lattice expansion is noted by the two arrows as described below.

In the time-resolved experiment, depicted schematically in FIG. 16, the excitation pulse at t=0 defines the initial temperature and structural change. In FIG. 18, we follow the center position and intensity of the n=2 (0,0) Bragg spot as a function of time. We also monitor the width, as shown in FIG. 18B. FIG. 18A presents the change in the peak center position, which maps out the change in lattice spacing in the (111) direction. Results are shown for fluences of 9% and 45% of the experimentally determined 4.5 mJ cm$^{-2}$ damage threshold at 266 nm. The angular deviation ($\Delta\theta$) of the Bragg spot directly gives the change in lattice spacing ($\Delta d_{111}$), from the relation $\Delta d_{111}=-\Delta\theta d_{111}\cdot\{2\sin(\theta/2)\}^{-1}$ ($\theta$ is the total scattering angle). A deviation to larger or smaller angles ($\Delta\theta>0$ or $\Delta\theta<0$) is therefore the signature of lattice contraction or expansion.

From the results shown in FIG. 18A, it is evident that the top surface layers of the crystal immediately contract following excitation at t=0. The amplitude of this initial contraction is given for two fluences, but the complete fluence dependence is presented in FIG. 19. After the initial contraction (−0.015 Å), the system expands to a maximum amplitude (+0.025 Å), which strongly depends on the fluence: the larger the fluence the more ample the expansion. The data also show that both the onset time and the velocity of the expansion ($\approx$ ms$^{-1}$) strongly depend on the fluence: expansion occurs earlier and faster at higher fluences. After reaching its maximum expansion, the system contracts again toward the original lattice spacing on a much longer time scale, beyond 50 ps, but a finite smaller expansion persists for at least several nanoseconds. Observations were also made for 800-nm femtosecond excitation at various laser fluences and the behavior is similar, that is, an initial contraction, followed by an expansion and subsequent return toward the initial lattice spacing. This similarity in form, compared to that in the 266-nm experiment, indicates that the observed structural dynamics is not dominated by a charging of the surface by photoemission, as excitation at 800 nm and/or at low fluences results in a similar behavior.

Figure 19:
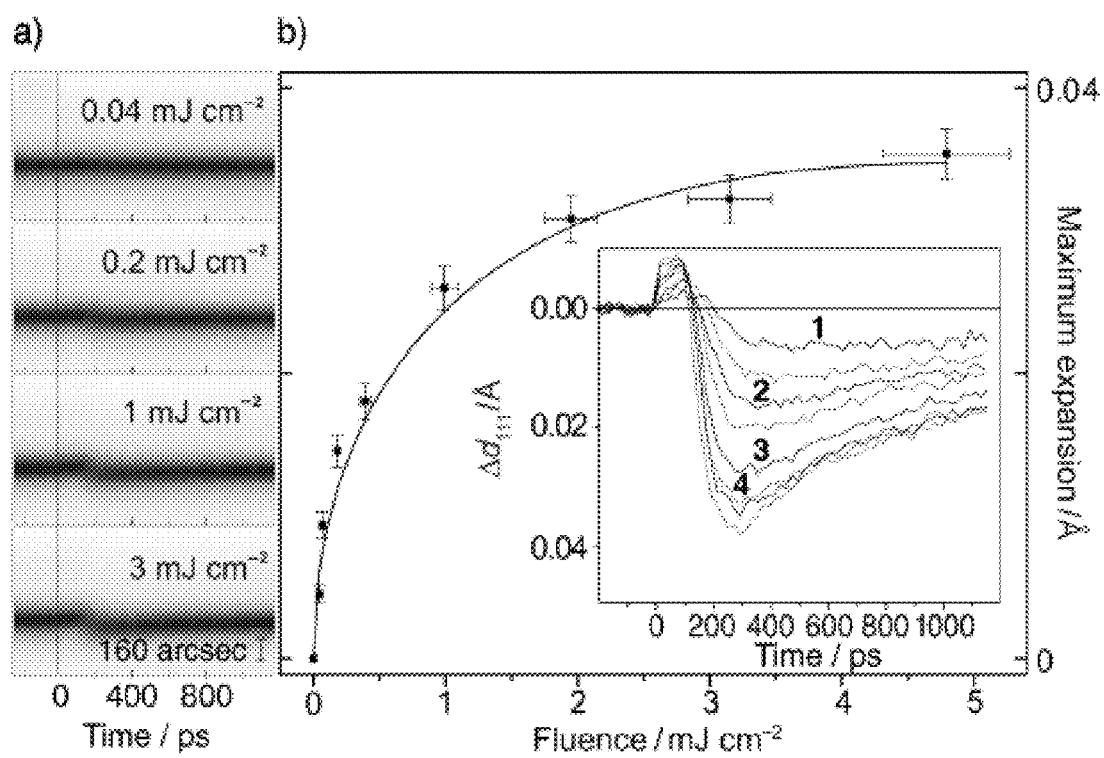

FIG. 19 illustrates the fluence dependence of the structural dynamics demonstrated by the experiment. In FIG. 19A, experimental traces for a set of data at the indicated fluences are illustrated. In FIG. 19B, the amplitude at maximum change is shown as a function of excitation fluence. The time-dependence is displayed in the inset (1: 0.04, 2: 0.2, 3: 1, 4: 3 mJ cm$^{-2}$). Notably, the temporal resolution is lower than that in FIG. 18, because these fluence-dependent measurements were made without masking in order to explore the lowest possible range of fluences.

The transient temperature is evident in the change in the diffraction-integrated intensity with time. This is presented in FIG. 18B, for excitation at 45% of damage threshold (2 mJ cm$^{-2}$), by plotting the evolution of the integrated intensity of the Bragg spot as a function of time. Using the tabulated Debye-Waller factors for bulk GaAs, and taking into account the two-dimensionality of the surface, we obtained an initial temperature jump to 1565±83 K. The system cools down on the timescale of a few hundred picoseconds to reach $\approx$510 K after 1 ns. The initial temperature jump has a rise time of 7 ps (10 ps before deconvolution), in perfect agreement with results from femtosecond optical studies of the dielectric function. Moreover, the maximum temperature reported above is close to the value (1300-1500 K) extrapolated from these optical studies at corresponding fluence. For the lower fluence regime (0.4 mJ cm$^{-2}$) presented in FIG. 18A, we find a temperature jump to 420±18 K, with a decay leveling off at 320±5 K after 1 ns. In this case too, the rise time and the maximum temperature are consistent with the optical study.

The evolution of the lattice expansion and that of the temperature are juxtaposed in FIG. 18B, together with the width. Strikingly, the temperature evolution precedes the lattice expansion, and we measured a delay of 15 ps between the rise in temperature and the structural expansion. This lag in structural expansion provides direct evidence for the proposed delayed lattice changes following an impulsive initial temperature. We note that the temperature jump to 1565±83 K is similar to (or even exceeds) the 1513 K melting point, whereas the excitation fluence is only half of the damage threshold. However, as evident from FIG. 18B, the peak temperature does not persist for a long time and the system does not lose its crystalline structure.

The lagged structural change reaches its maximum expansion of +0.025 Å at a temperature of ≈1000 K (see FIG. 18B). This lattice expansion in the nanometer-scale structure may now be compared with the expansion in bulk GaAs. From the linear expansion coefficient of bulk crystals, a temperature of 1000 K would correspond to a linear lattice expansion of 0.013 Å, and this value differs by a factor of 2 from our experimental value of 0.025±0.001 Å. At much longer times (≈1 ns), when the change in expansion levels off, a temperature of 510 K would correspond to a linear expansion of 0.0038 Å, and our experimental value is 0.0032±0.0005 Å (see FIG. 18B). This temporal decrease in the disparity in spacing is indicative of the change in surface to bulk-type behavior. From modeling of strain propagation in X-ray studies, a 0.0082-Å surface strain amplitude was inferred for GaAs. Our measurements indicate a larger deformation (by a factor of 3).

Because of their small incidence angle, the probing electrons have a very small penetration depth (a few Å for 30-keV electrons at $\theta_i \approx 1°$) and thus probe only the very top surface layers of the crystal; in the geometry of our experiment, the excitation pulse (30° incidence angle) has a vertical penetration depth also of nm scale (3.5 nm at 266 nm). These small and comparable penetration depths for the photons and electrons provide a unique condition for monitoring the local structural dynamics of these surface layers. In X-ray experiments, a heating pulse typically has an absorption length of 0.3 μm, and the probing X-ray pulse has a micron-scale penetration depth. Such scales generally require consideration of strain propagation in the bulk and over lengths on the order of microns. Clearly, direct probing of the surface motions of atoms provides insight into the understanding of the surface initial dynamics and to the connection to bulk propagation at different temperatures (fluences). The effect of fluence on structural changes is mapped out in FIG. 19A, and representative examples of experimental traces that follow the time-dependent Bragg reflection are shown in FIG. 19B.

Additional experiments were carried out on silicon to isolate the effect of chlorination and to test the generality of the approach and the scope of application. Both chlorinated and non-chlorinated silicon (111) surfaces were subjected to the same experimental conditions (excitation wavelength and fluence). Similar behavior to that of GaAs was found—whereas hydrogen-terminated silicon did not present noticeable surface contraction preceding the expansion, the chlorinated surface showed a prompt contraction, which precedes the expansion. The overall phase of the signal in FIG. 18 depends on the overlap at the mask and it is possible that optical phonon generation at t=0 contributes to the observed scattering. It should be noted that the phase corresponding to the expansion is unequivocally established and confirmed by the temporal evolutions of the temperature and structural dynamics at different influences. However, the observations with chlorine are consistent with a potential-driven change at the earliest times, prior to coherent acoustic phonon generation.

Based on these experiments, a possible mechanism is suggested. Embodiments of the present invention are not limited to this suggested mechanism. One can argue that a general structural-dynamics picture now emerges from the observations of the structure changes and the timescales of the motion (see FIG. 18B), and from the observations on silicon surfaces. In the nonthermal regime, the initial femtosecond transient excitation, which creates the electron-hole pairs, distorts the potential, and structural changes occur on the ultrashort timescale by this deformation prior to significant motion in the lattice (phonons), as experimentally verified above. This highly non-equilibrium state of the solid is followed by energy dissipation and redistribution, which ultimately lead to expansion of the lattice and restructuring at longer times. With this in mind, only an expansion of the surface atoms would be expected, contrary to the contraction and expansion observed in the studies reported herein. However, for the chlorine-terminated surface, the large electronegativity shifts the electronic charge distribution towards the chlorine (ionic potential). The ensuing Coulombic interaction with the underlying layers contracts the interatomic layers, as observed in the early-time ultrafast rise of the contraction (see FIG. 18A), and on this timescale, the dynamics is driven by the potential change. Along with the observations made in the case of silicon and supporting this proposed mechanism for contraction, we note that atomic chlorine chemisorbed on GaAs was found to be an electron acceptor.

Following the contraction, expansion proceeds on a similar timescale. Through Auger processes (at a density of ≈$10^{21}$ cm$^{-3}$), which take place in a few ps, the carrier density decreases, but the total electronic energy remains unchanged. The drop in the Coulombic potential along with electron-phonon coupling now drives the system in a reversed motion toward expansion (see FIG. 18A). The expansion of the lattice typically requires 7 ps to define surface-layer temperature and this is evident in the rise of the intensity profile (see FIG. 18B); only after this rise can we define the temperature acquired through electron-phonon coupling. The structural change (expansion) follows the temperature rise, but after the apparent delay of 15 ps, reaching its maximum of +0.025 Å expansion at yet longer time. This thermal expansion in the (111) direction is likely due to anharmonicity of lattice vibrations. Remarkably, the width of the Bragg spot reaches its maximum before the peak of structural lattice expansion. Lattice dynamics is first driven by coherent collective phonons followed by the isotropic expansion that ensues when anharmonicity becomes effective. This nascent lattice expansion generally should first overcome the persisting contraction (see FIG. 18A). From our data, we obtained an onset for the expansion of ≈5 ps after the temperature has risen to half of its maximum and an additional delay of ≈10 ps to overcome the initial contraction. It should be noted that this picture of structural dynamics is robust at lower fluences as demonstrated by FIG. 19. However, in the lower fluence regime, the initial temperature is decreased, electron-phonon coupling dominates, and diffusive processes become pronounced at longer times.

The return to the original structure is observed in the decrease in $\Delta d_{111}$, from +0.025 to +0.003 Å, but this restructuring takes place on a much longer timescale (see FIG. 18). We note that diffusive processes typically begins beyond 50 ps, as up to this time $\Delta d_{111}$ continues to increase—cooling down the surface by diffusion leads to a decrease in $\Delta d_{111}$. Thus, the structure at the expanded value of $\Delta d_{111}=0.025$ Å is vibrationally in a non-equilibrium state of collective modes, which cools down by energy redistribution and diffusion at longer times. Theoretical calculations of the heat diffusion using the known thermal properties of GaAs (heat capacity and thermal conductivity) provide a good match to the temperature behavior from the point of leveling off shown in FIG. 18B.

Thus, this experiment demonstrates that new dimensions of ultrafast electron crystallography at time, length, and sensitivity scales are ideally suited for atomic-scale structural dynamics of surfaces and interfaces. One reason this is achieved is because of the ability to directly determine—from the diffraction periodicity and changes with time—the evolution of atomic spacings (Bragg peak positions), transient temperatures (Bragg integrated intensity), and the involvement of coherent lattice vibrations (Bragg peak width). The timescales for the non-equilibrium surface structures, and restructuring at longer times, are desirable for understanding the surface phenomena and for propagation in bulk materials. We believe that embodiments of the present invention now provide for the advancement of many applications in this general area of surface science and nanometer-scale materials, and macromolecular structures.

Figure 20:
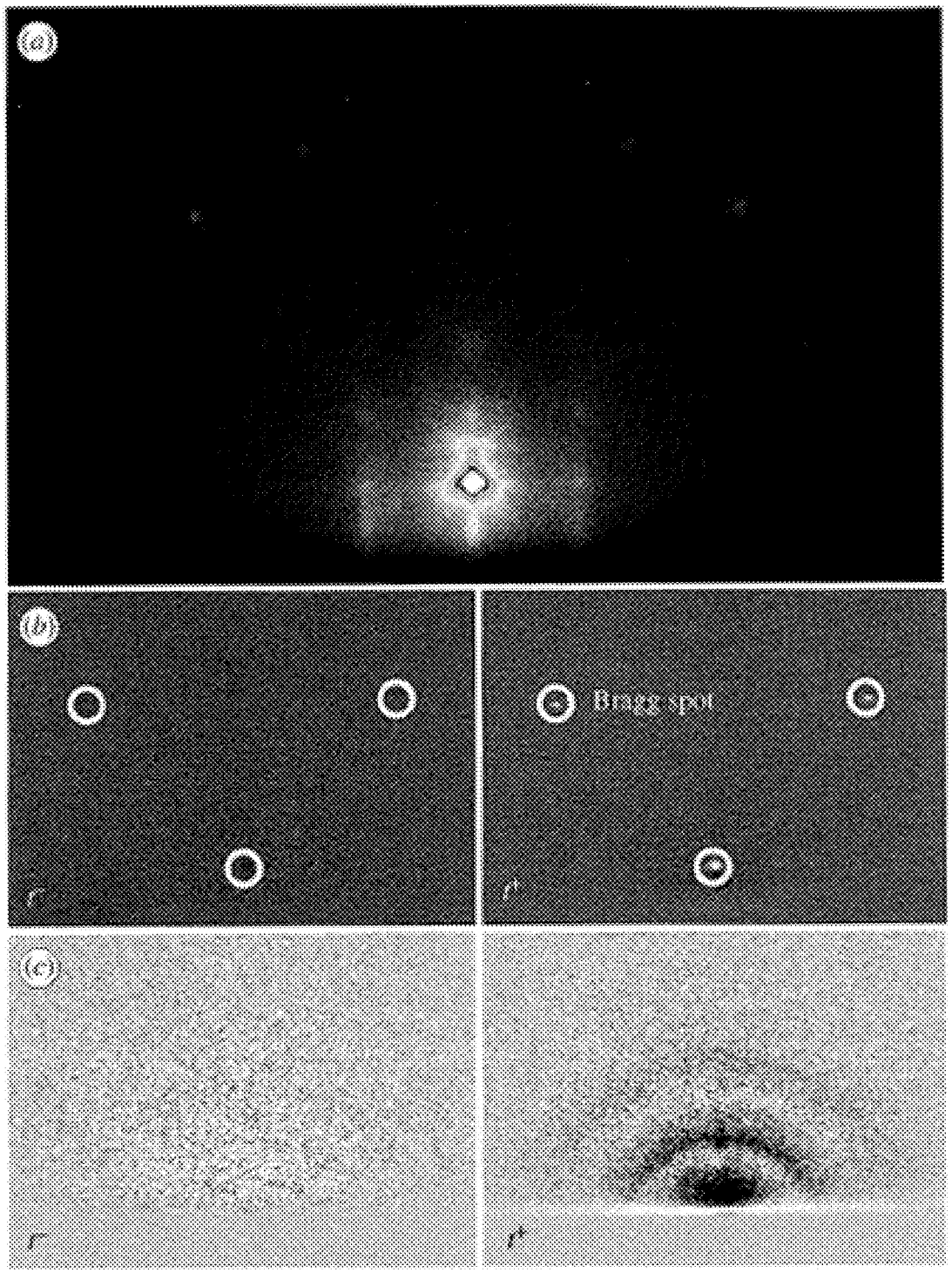
FIG. 20 is a simplified diagram of experimental results according to a specific embodiment of the present invention.

In other experiments using a system according to one embodiment of the present invention, the temporal evolution of bulk and surface structures with atomic-scale spatial resolution was studied. Merely by way of example, one experiment, crystals of silicon, with and without adsorbates, were studied. FIG. 20 illustrates results obtained during studies of condensed phases, e.g. crystals and solid-liquid phase transitions. In FIG. 20A, diffraction from the Si crystal is illustrated. In FIG. 20B, diffraction frame referencing of Bragg spots is shown. FIG. 20C illustrates diffraction frame referencing of amorphous-to-liquid transition.

Referencing the diffraction difference as illustrated in FIG. 20 to the ground-state shows the changes in the structure caused by the initiating pulse, from ground-state pattern at negative time to the observed change at positive time. The structural change is evident in the shift with time of the in-phase Bragg peak of the rocking curve, while the increase in vibrational amplitude is reflected in the broadening. The change takes place as a rise to a maximum shift and then a decay to the coordinates of the original structure. By gating on a Bragg spot, we can follow the changes with time. These results show the "instantaneous" structural change (2 ps steps of change; total of 10 ps); a homogeneous expansion of the lattice 2.35 Å Si—Si bond by up to 0.04 A at 50% level of damaging fluence. This is followed by lattice relaxation from a highly non-equilibrium structure to the final ground-state structure with Si—Si distances of 2.35 Å. The multiple time constants of restructuring describe the expansion in real space and vibrational temperature.

Additional studies for the surface structure (and with hydrogen or chlorine), produced striking results. Gating the streak at the out-of-phase condition, embodiments of the present invention enable the surface structural interferences and their evolution with time to be directly resolved. Remarkably, the two spots change in time, and differently, but maintain the phase coherence. We are therefore able to display the spatial, temporal and phase coherence change of the surface structure, and the spatial patterns are describable within the framework of diffraction (kinematic) theory of condensed matter. The change in the structure is evident in the amplitude change of surface Si atoms. Unlike the result for bulk displacement (0.04 Å), the expansion of surface atoms is larger by an order of magnitude (0.4 Å). The cooling of the surface structure occurs on a time-scale different from that of the bulk. We also studied the structural changes involved in phase transitions when the temperature of the lattice is sufficiently high to cause large amplitude disorder. Initiating an ultrashort temperature jump of the amorphous structure with the infrared femtosecond pulse gives new diffraction ring patterns, which we followed as a function of time by referencing to the image of the ground state (see FIG. 20). The structural change is a phase transition to the liquid state.

The examples and embodiments described herein are for illustrative purposes only. Various modifications or changes in light thereof will be suggested to persons skilled in the art and are to be included within the spirit and purview of this application and scope of the appended claims. It is not intended that the invention be limited, except as indicated by the appended claims.

What is claimed is:

1. A system for imaging one or more samples, the system comprising:
    a stage assembly adapted to receive a sample to be imaged;
    a laser source, the laser source being capable of emitting an optical pulse;
    a cathode coupled to the laser source, the cathode being capable of emitting an electron pulse having about one to 1000 electrons upon exposure to the optical pulse;
    an electron lens assembly adapted to focus the electron pulse having about one to 1000 electrons onto the sample disposed on the stage;
    a detector adapted to capture one or more electrons from the sample, the one or more electrons being representative of an image of the sample, the detector providing a data signal associated with the one or more electrons that represents the image of the sample;
    a processor coupled to the detector, the processor being adapted to process the data signal associated with the one or more electrons from the sample to output information associated with the image represented by the sample; and
    an output device coupled to the processor, the output device being adapted to output the information associated with the image represented by the sample.

2. The system of claim 1 wherein the laser source comprises a mode-locked laser oscillator providing a train of optical pulses with a Full Width Half Maximum ("FWHM") of less than 500 fs.

3. The system of claim 2 wherein the FWHM is less than 100 fs.

4. The system of claim 1 wherein the cathode comprises at least one of a $LaB_6$ bearing crystal, a ZrC bearing crystal, or a $CeB_6$ bearing crystal.

5. The system of claim 1 wherein the detector comprises a digital charge coupled device ("CCD") camera.

6. The system of claim 1 wherein the processor comprises an image processor associated with a transmission electron microscope ("TEM").

7. The system of claim 1 wherein the sample is selected from a biological sample, a chemical sample, a physical sample, or an electronic sample.

8. The system of claim 1 wherein the optical pulse is one of a plurality of optical pulses.

9. The system of claim 1 wherein the sample is maintained in a vacuum.

10. The system of claim 1 wherein the sample is maintained at a temperature ranging from about 77 K to about 300 K.

11. The system of claim 1 wherein the system further comprises one or more memories including computer code, the computer code being adapted to control at least one of the electron lens assembly, the detector, the processor, or the output device.

12. An electron microscope for acquiring time-resolved images of a sample, the electron microscope comprising:
   a stage assembly adapted to receive a sample having a feature to be imaged, the feature having a size;
   a vacuum chamber enclosing the stage assembly;
   a laser source adapted to provide a photon pulse;
   a cathode coupled to the laser source, the cathode being capable of:
      emitting one or more first pulses of electrons toward the feature of the sample, the one or more first pulses of electrons each having about one to about 1000 electrons; and
      emitting one or more second pulses of electrons toward the feature of the sample, the one or more second pulses of electrons each having about one to about 1000 electrons;
   a detector adapted to:
      capture first electrons during a first portion of time corresponding to the one or more first pulses of electrons having about one to about 1000 electrons, the first electrons being associated with a first image of the feature of the sample during the first portion of time; and
      capture second electrons corresponding to the one or more second pulses of electrons having about one to about 1000 electrons during a second portion of time, the second electrons being associated with a second image of the feature of the sample during the second portion of time; and
   a processor adapted to:
      receive first information associated with the first portion of the one or more first pulses of electrons during the first portion of time from the detector; and
      receive second information associated with the second portion of the one or more second pulses of electrons associated during the second portion of time from the detector.

13. The electron microscope system of claim 12 wherein the one or more first pulses of electrons each has an average temporal pulse width of less than 1 ps.

14. The electron microscope system of claim 13 wherein the one or more second pulses of electrons each has an average temporal pulse width of less than 1 ps.

15. The electron microscope system of claim 12 wherein the size is less than 100 nanometers.

16. The electron microscope system of claim 12 wherein the first image has one or more different characteristics from the second image.

17. The electron microscope system of claim 12 further comprising a beam splitter adapted to direct a portion of the photon pulse to the feature of the sample during the first portion of time and not during the second portion of time.

18. The electron microscope system of claim 12 further comprising a beam splitter adapted to direct a portion of the photon pulse to the feature of the sample during the second portion of time and not during the first portion of time.

19. The electron microscope system of claim 12 wherein the first portion of time is on an order of seconds and the second portion of time is on an order of seconds.

20. A system for imaging one or more samples, the system comprising: a stage assembly, the stage assembly comprising a sample to be imaged;
   a laser source, the laser source being capable of emitting an optical pulse of less than 1 ps in duration;
   a cathode coupled to the laser source, the cathode being capable of emitting an electron pulse less than 1 ps in duration and having about one to about 1000 electrons;
   an electron lens assembly adapted to focus the electron pulse having about one to about 1000 electrons onto the sample disposed on the stage;
   a detector adapted to capture one or more electrons from the sample, the one or more electrons from the sample being representative of an image of the sample, the detector providing a data signal associated with the one or more electrons from the sample that represents the image of the sample;
   a processor coupled to the detector, the processor being adapted to process the data signal associated with the one or more electrons from the sample to output information associated with the image represented by the sample; and
   an output device coupled to the processor, the output device being adapted to output the information associated with the image represented by the sample.

21. The system of claim 20 wherein the laser source comprises a mode-locked laser oscillator providing a train of optical pulses with a Full Width Half Maximum ("FWHM") of less than 500 fs.

22. The system of claim 21 wherein the FWHM is less than 100 fs.

23. The system of claim 20 wherein the cathode comprises a $LaB_6$ bearing crystal.

24. The system of claim 20 wherein the detector comprises a digital charged coupled device ("CCD") camera.

25. The system of claim 20 wherein the processor comprises an image processor associated with a transmission electron microscope ("TEM").

26. The system of claim 20 wherein the sample is selected from a biological sample, a chemical sample, a physical sample, and an electronic sample.

27. The system of claim 20 wherein the optical pulse is one of a plurality of optical pulses.

28. The system of claim 20 wherein the sample is maintained in a vacuum.

29. The system of claim 20 wherein the sample is maintained at a temperature ranging from about 77 K to about 300 K.

30. The system of claim 20 wherein the system further comprises one or more memories including computer code, the computer code being adapted to control at least one of the electron lens assembly, the detector, the processor, or the output device.

31. A method of operating an electron microscope comprising a laser source, a cathode, and an electron lens assembly, the method comprising:
   forming a train of optical pulses, each of the optical pulses being characterized by a Full Width Half Maximum ("FWHM") pulse length of less than 1 ps in duration;
   providing a sample for imaging disposed on a stage assembly;
   generating a train of electron pulses by impinging the train of optical pulses on the cathode, the train of electron pulses being associated with the train of optical pulses, each of the electron pulses being characterized by a FWHM pulse length less than 1 ps in duration and having about one to about 1000 electrons;
   directing the train of electron pulses toward the sample using at least the electron lens assembly;
   capturing electrons from the sample using a sensing device to derive information associated with an image of the sample; and processing the information associated with the image of the sample.

32. The method of claim 31 wherein the train of optical pulses is derived from a laser source, the laser source comprising a mode-locked laser oscillator to provide the train of optical pulses with a Full Width Half Maximum ("FWHM") of less than 500 fs.

33. The method of claim 31 wherein the cathode comprises a $LaB_6$ bearing crystal.

34. The method of claim 31 wherein the sensing device comprises a charge coupled device.

35. The method of claim 31 further comprising maintaining the sample in a vacuum environment.

36. The method of claim 31 further comprising maintaining the sample at a temperature ranging from about 77 K to about 300 K.

37. The method of claim 31 wherein each of the electron pulses has about 10 to about 100 electrons.

38. The method of claim 31 wherein the sample is selected from a biological material, a chemical material, a physical material, a semiconductor material, an insulating material, and a conductive material.

39. The method of claim 31 wherein the portion of the train of electron pulses traverses through a portion of the sample.

40. A system for imaging one or more samples, the system comprising:
a stage assembly adapted to receive a sample to be imaged;
a laser source, the laser source being capable of emitting an optical pulse;
a cathode coupled to the laser source, the cathode being capable of emitting an electron pulse having about one to 1000 electrons;
an electron lens assembly adapted to focus the electron pulse having about one to about 1000 electrons onto the sample disposed on the stage;
a detector adapted to capture one or more particles from the sample, the one or more particles providing information about the sample, the detector providing a data signal associated with the one or more particles that provide information about the sample;
a processor coupled to the detector, the processor being adapted to process the data signal associated with the one or more particles from the sample to output information associated with the sample; and
an output device coupled to the processor, the output device being adapted to output the information associated with the sample.

41. The system of claim 40 wherein the FWHM is less than 100 fs.

42. The system of claim 40 wherein the cathode comprises at least one of a $LaB_6$ bearing crystal, a ZrC bearing crystal, or a $CeB_6$ bearing crystal.

43. The system of claim 40 wherein the detector comprises a digital charge coupled device ("CCD") camera.

44. The system of claim 40 wherein the processor comprises an image processor associated with a transmission electron microscope ("TEM").

45. The system of claim 40 wherein the sample is selected from a biological sample, a chemical sample, a physical sample, or an electronic sample.

46. The system of claim 40 wherein the optical pulse is one of a plurality of optical pulses.

47. An electron microscope for acquiring time-resolved images of a sample, the electron microscope comprising:
a stage assembly adapted to receive a sample having a feature to be imaged, the feature having a size;
a vacuum chamber enclosing the stage assembly;
a laser source adapted to provide a photon pulse;
a cathode coupled to the laser source, the cathode being capable of:
emitting one or more first pulses of electrons toward the feature of the sample, the one or more first pulses of electrons each having about one to about 1000 electrons; and
emitting one or more second pulses of electrons toward the feature of the sample, the one or more second pulses of electrons each having about one to about 1000 electrons;
a detector adapted to:
capture first particles during a first portion of time corresponding to the one or more first pulses of electrons each having about one to about 1000 electrons, the first particles being associated with a property of the sample during the first portion of time; and
capture second particle corresponding to the one or more second pulses of electrons each having about one to about 1000 electrons during a second portion of time, the second particles being associated with a second property of the sample during the second portion of time; and
a processor adapted to:
receive first information associated with the first portion of the one or more first pulses of electrons during the first portion of time from the detector; and
receive second information associated with the second portion of the one or more second pulses of electrons associated during the second portion of time from the detector.

48. The electron microscope system of claim 47 wherein the one or more first pulses of electrons each has an average temporal pulse width of less than 1 ps.

49. The electron microscope system of claim 48 wherein the one or more second pulses of electrons each has an average temporal pulse width of less than 1 ps.

50. The electron microscope system of claim 47 wherein the size is less than 100 nanometers.

51. The electron microscope system of claim 47 wherein the first property of the sample during the first portion of time is different from the second property of the sample during the second portion of time.

52. The electron microscope system of claim 47 further comprising a beam splitter adapted to direct a portion of the photon pulse to the feature of the sample during the first portion of time and not during the second portion of time.

53. The electron microscope system of claim 47 further comprising a beam splitter adapted to direct a portion of the photon pulse to the feature of the sample during the second portion of time and not during the first portion of time.

54. The electron microscope system of claim 47 wherein the first portion of time is on an order of seconds and the second portion of time is on an order of seconds.

* * * * *